(12) United States Patent
Ohsawa et al.

(10) Patent No.: US 7,811,677 B2
(45) Date of Patent: *Oct. 12, 2010

(54) LIGHT EMITTING ELEMENT AND LIGHT EMITTING DEVICE

(75) Inventors: Nobuharu Ohsawa, Zama (JP); Hiroko Abe, Setagaya (JP); Hideko Inoue, Atsugi (JP); Satoko Shitagaki, Atsugi (JP); Satoshi Seo, Kawasaki (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 205 days.

This patent is subject to a terminal disclaimer.

(21) Appl. No.: 10/590,703

(22) PCT Filed: May 17, 2005

(86) PCT No.: PCT/JP2005/009310

§ 371 (c)(1),
(2), (4) Date: Aug. 25, 2006

(87) PCT Pub. No.: WO2005/115061

PCT Pub. Date: Dec. 1, 2005

(65) Prior Publication Data

US 2007/0241667 A1    Oct. 18, 2007

(30) Foreign Application Priority Data

May 20, 2004   (JP)   ............................. 2004-151035
Aug. 3, 2004   (JP)   ............................. 2004-226382
Aug. 6, 2004   (JP)   ............................. 2004-231742

(51) Int. Cl.
H01L 51/54    (2006.01)
C09K 11/06    (2006.01)

(52) U.S. Cl. ...................... 428/690; 428/917; 313/504; 257/E51.044; 544/225

(58) Field of Classification Search ........................ None
See application file for complete search history.

(56) References Cited

U.S. PATENT DOCUMENTS

| | | | |
|---|---|---|---|
| 6,303,238 B1 | 10/2001 | Thompson et al. |
| 6,821,645 B2 | 11/2004 | Igarashi et al. |
| 6,821,646 B2 | 11/2004 | Tsuboyama et al. |
| 6,835,469 B2 | 12/2004 | Kwong et al. |
| 6,911,271 B1 | 6/2005 | Lamansky et al. |
| 6,939,624 B2 | 9/2005 | Lamansky et al. |
| 6,953,628 B2 | 10/2005 | Kamatani et al. |
| 7,094,477 B2 | 8/2006 | Kamatani et al. |
| 7,147,935 B2 | 12/2006 | Kamatani et al. |
| 7,220,495 B2 | 5/2007 | Tsuboyama et al. |
| 7,238,437 B2 | 7/2007 | Igarashi et al. |
| 7,238,806 B2 | 7/2007 | Inoue et al. |
| 7,339,317 B2 | 3/2008 | Yamazaki |
| 7,381,479 B2 | 6/2008 | Lamansky et al. |
| 7,400,087 B2 | 7/2008 | Yamazaki |
| 7,413,816 B2 | 8/2008 | Inoue et al. |
| 2001/0019782 A1 | 9/2001 | Igarashi et al. |
| 2003/0059646 A1 | 3/2003 | Kamatani et al. |
| 2003/0068526 A1 | 4/2003 | Kamatani et al. |
| 2003/0072964 A1 | 4/2003 | Kwong et al. |
| 2005/0003233 A1 | 1/2005 | Igarashi et al. |
| 2005/0191527 A1 | 9/2005 | Fujii et al. |
| 2005/0208335 A1 | 9/2005 | Kamatani et al. |
| 2006/0159955 A1 | 7/2006 | Inoue et al. |
| 2007/0213527 A1 | 9/2007 | Inoue et al. |
| 2007/0241667 A1 | 10/2007 | Ohsawa et al. |
| 2008/0076922 A1 | 3/2008 | Inoue et al. |
| 2008/0113216 A1 | 5/2008 | Inoue et al. |

(Continued)

FOREIGN PATENT DOCUMENTS

EP    1 191 612    3/2002

(Continued)

OTHER PUBLICATIONS

Tsutsui et al., "Electroluminescence in Organic Thin Films," Photochemical Processes in Organized Molecular Systems, 1991, pp. 437-450.

(Continued)

Primary Examiner—Marie R. Yamnitzky
(74) Attorney, Agent, or Firm—Eric J. Robinson; Robinson Intellectual Property Law Office, P.C.

(57) ABSTRACT

It is an object of the present invention to obtain an organometallic complex that is capable of converting an excited triplet state into luminescence, a light-emitting element that can be driven for a long time, is high in luminous efficiency, and has a favorable long lifetime, and a light-emitting device using the light-emitting element. The present invention provides a light-emitting element that has a pair of electrodes (an anode and a cathode) and a light-emitting layer between a pair of electrodes, where the light-emitting layer includes an organometallic complex represented by the following general formula (5) and one of a compound that has a larger energy gap than the organometallic complex and a compound that has a larger ionization potential and a smaller electron affinity than the organometallic complex, and provides a light-emitting device using the light-emitting device.

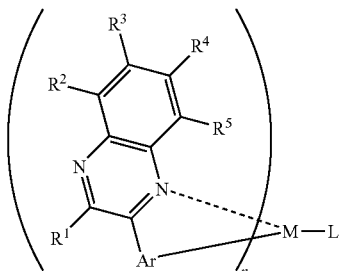

(5)

25 Claims, 45 Drawing Sheets

U.S. PATENT DOCUMENTS

2008/0281098 A1    11/2008    Lamansky et al.

FOREIGN PATENT DOCUMENTS

| | | |
|---|---|---|
| EP | 1 348 711 | 10/2003 |
| EP | 1 349 435 | 10/2003 |
| EP | 1574514 A | 9/2005 |
| EP | 1 690 866 | 8/2006 |
| JP | 63-159856 | 7/1988 |
| JP | 06-207169 | 7/1994 |
| JP | 2001-247859 | 9/2001 |
| JP | 2003-040873 | 2/2003 |
| JP | 2003-058473 | 2/2003 |
| JP | 2004-155728 A | 6/2004 |
| JP | 2005-239648 | 9/2005 |
| JP | 2006-073992 | 3/2006 |
| JP | 2006-182775 | 7/2006 |
| JP | 3810789 | 8/2006 |
| WO | WO 00/70655 | 11/2000 |
| WO | WO 01/41512 | 6/2001 |
| WO | WO-02/15645 | 2/2002 |
| WO | WO 02/45466 | 6/2002 |
| WO | WO 03/033617 | 4/2003 |
| WO | WO-2004/056839 A | 7/2004 |
| WO | WO 2005/054261 | 6/2005 |
| WO | WO 2005/115061 | 12/2005 |

OTHER PUBLICATIONS

Baldo et al., "Highly Efficient Phosphorescent Emission from Organic Electroluminescent Devices," Nature, Sep. 10, 1998, vol. 395, pp. 151-154.

Baldo et al., "Very High-Efficiency Green Organic Light-Emitting Devices Based on Electrophosphorescence," Appl. Phys. Lett. (Applied Physics Letters) Jul. 5, 1999, vol. 75, No. 1, pp. 4-6.

Nishi et al., "High Efficiency TFT-OLED Display with Iridium-Complex as Triplet Emissive Center," Proceedings of the 10th International Workshop on Inorganic and Organic Electroluminescence (EL'00), Dec. 4, 2000, pp. 353-356.

Fujii et al., "Highly Efficient and Vivid-Red Phosphors Bearing 2,3-Diphenylquinoxaline Units and their Application to Organic Light-Emitting Devices," IEICE Trans. Electron., (IEICE Transactions on Electronics), Dec. 2004, vol. E87-C, No. 12, pp. 2119-2121.

Yamamoto et al., "Preparation of New Electron-Accepting π-Conjugated Polyquinoxalines. Chemical and Electrochemical Reduction, Electrically Conducting Properties, and Use in Light-Emitting Diodes," Am. Chem. Soc. (Journal of the American Chemical Society), vol. 118, No. 16, 1996, pp. 3930-3937.

International Search Report (Application No. PCT/JP2005/022593) dated Mar. 14, 2006.

Written Opinion (Application No. PCT/JP2005/022593) dated Mar. 14, 2006.

International Search Report (Application No. PCT/JP2005/022507) dated Feb. 21, 2006.

Written Opinion (Application No. PCT/JP2005/022507) dated Feb. 21, 2006.

Patani et al., "Bioisosterism: A Rational Approach in Drug Design," Chemical Review, vol. 96, No. 8, 1996, pp. 3147-3176.

Tsutsui et al., *High Quantum Efficiency in Organic Light-Emitting Devices with Iridium-Complex as a Triplet Emissive Center*, Japan Journal of Applied Physics, vol. 38, Part 2, No. 12B, Dec. 15, 1999, pp. L1502-L1504.

T. Tsutsui, *The Operation Mechanism and the Light Emission Efficiency of the Organic EL Element*, Textbook of the 3$^{rd}$ Seminar at Division of Organic Molecular Electronics and Bioelectronics, The Japan Society of Applied Physics, (1993), pp. 31-37.

S. Seo et al., *P-132: Long-Lived Deeply Red Phosphorescent OLEDs Based on Electrochemically Stable Ir Complexes*, SID Digest '05, SID International Symposium Digest of Technical Papers, 2005, vol. 36, pp. 806-809.

M. Kulikova et al., *Effects of the Nature of the Ligand Environment and Metal Center on the Optical and Electrochemical Properties of Platinum(II) and Palladium(II) Ethylenediamine Complexes with Heterocyclic Cyclometalated Ligands*, Russian Journal of General Chemistry, vol. 70, No. 2, Feb. 2000, pp. 163-170.

K. Balashev et al., *Synthesis and Properties of Palladium(II) and Platinum(II) (2,3-diphenylquinoxalinato-C,N) ethylenediamine Complexes*, Russian Journal of General Chemistry, vol. 69, No. 8, Aug. 1999, pp. 1348-1349.

P. Steel et al., *Cyclometallated compounds, V*. Double cyclopalladation of diphenyl pyrazines and related ligands*, Journal of Organometallic Chemistry, vol. 395, No. 3, 1990, pp. 359-373.

S. Rasmussen et al., *Synthesis and Characterization of a Series of Novel Rhodium and Iridium Complexes Containing Polypyridyl Bridging Ligands: Potential Uses in the Development of Multimetal Catalysts for Carbon Dioxide Reduction*, Inorganic Chemistry, vol. 29, No. 20, 1990, pp. 3926-3932.

International Search Report (Application No. PCT/JP2005/009310) dated Aug. 30, 2005.

Written Opinion (Application No. PCT/JP2005/009310) dated Aug. 30, 2005.

Fujii, Hiroyuki et al., *04-O Efficient Red Organometallic Phosphors Bearing 2,3-Diphenylquinoxalines and their Application to Electrophosphorescent Diodes*, Korea-Japan Joint Forum, Organic Materials for Electronics and Photonics, Nov. 3-6, 2004.

D. O'Brien et al., *Improved Energy Transfer in Electrophosphorescent Devices*, Applied Physics Letters, vol. 74, No. 3, Jan. 18, 1999, pp. 442-444.

M. Baldo et al., *High-Efficiency Fluorescent Organic Light-Emitting Devices Using a Phosphorescent Sensitizer*, Nature, vol. 403, Feb. 17, 2000, pp. 750-753.

M. Thompson et al., *Phosphorescent Materials and Devices*, Proceedings of the 10$^{th}$ International Workshop on Inorganic and Organic Electroluminescence (EL'00), Dec. 4-7, 2000, pp. 35-38.

J. Duan et al., *New Iridium Complexes as Highly Efficient Orange-Red Emitters in Organic Light-Emitting Diodes*, Advanced Materials, vol. 15, No. 3, Feb. 5, 2003, pp. 224-228.

International Search Report (Application No. PCT/JP2004/018079) dated Apr. 5, 2005.

Written Opinion (Application No. PCT/JP2004/018079) dated Apr. 5, 2005.

G. Zhang, et al., *Synthesis and Photoluminescence of a New Red Phosphorescent Iridium(III) Quinoxaline Complex*, Chinese Chemical Letters, vol. 15, No. 11, pp. 1349-1352, 2004.

R. Lewis, Hawley's Condensed Chemical Dictionary, 12$^{th}$ ed., pp. 594, (1993).

H. Jakubke et al., Concise Encyclopedia Chemistry, pp. 490, (1993).

S. Parker, McGraw-Hill Dictionary of Chemical Terms, 3$^{rd}$ ed., pp. 200, (1984).

Ito et al., Asymmetric Synthesis of Helical Poly (Quinoxaline-2, 3-Diyl)s by Palladium-Mediated Polymerization of 1, 2-Diisocyanobenzenes: Effective Control of the Screw-Sense by a Binaphthyl Group at the Chain-End, Journal of the American Chemical Society, vol. 120, pp. 11880-11893, 1998.

Ito et al., Living Polymerization of 1, 2-Diisocyanoarenes Promoted by (Quinoxalinyl) Nickel Complexes, Polymer Journal, vol. 24, No. 3, pp. 297-299, 1992.

C.W. Tang et al., *Organic Electroluminescent Diodes*, Applied Physics Letter, vol. 51, No. 12, Sep. 21, 1987, pp. 913-915.

Search Report (Application No. 05740951.8) dated Mar. 25, 2009.

Search Report (Application No. 04799935.4) dated Jan. 23, 2009.

Brooks.J et al., "Synthesis and Characterization of Phosphorescent Cyclometalated Platinum Complexes,", Inorg. Chem. (Inorganic Chemistry), 2002, vol. 41, No. 12, pp. 3055-3066.

English translation of JP 6-207169 (Jul. 1994).

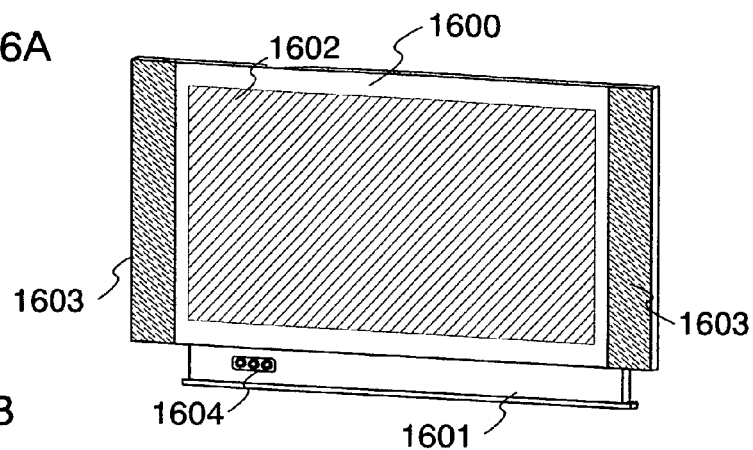
FIG. 36A
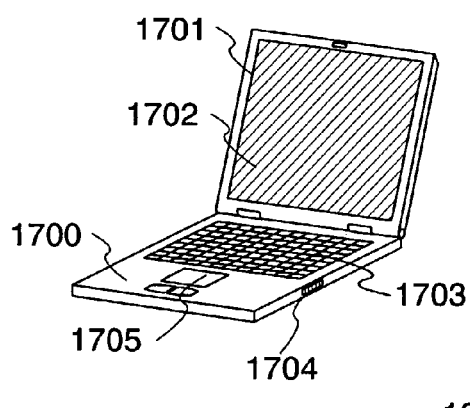
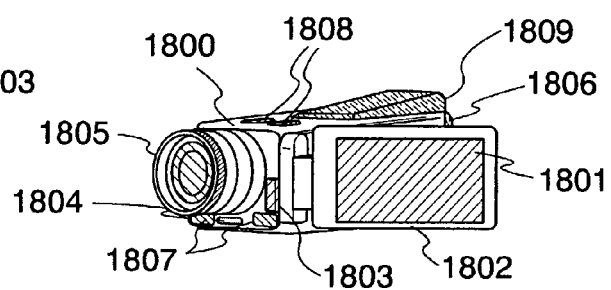
FIG. 36B
FIG. 36C
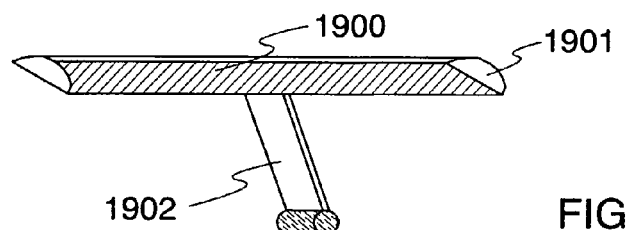
FIG. 36D
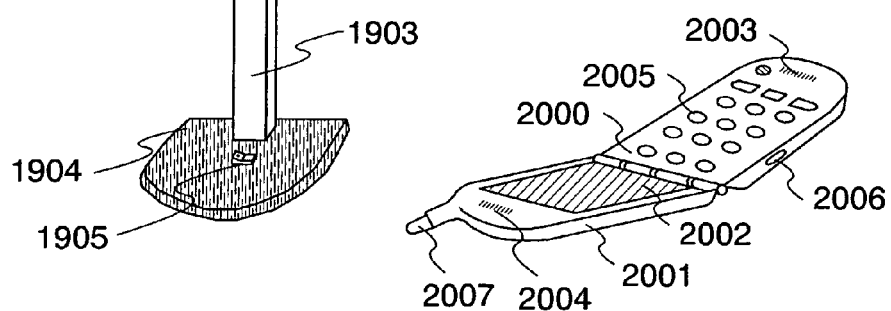
FIG. 36E

LIGHT EMITTING ELEMENT AND LIGHT EMITTING DEVICE

TECHNICAL FIELD

The present invention relates to an organometallic complex that is capable of converting an excited triplet state into luminescence, a light-emitting element using the organometallic complex, and a light-emitting device using the light-emitting element.

BACKGROUND ART

A light-emitting element using an organic compound is an element in which a layer including an organic compound or an organic compound film emits light by applying an electric field. The emission mechanism is said to be as follows: when a voltage is applied to electrodes with an organic compound film interposed therebetween, an electron injected from a cathode and a hole injected from an anode are recombined in the organic compound film to form a molecular exciton, and energy is released to emit light when the molecular exciton returns to the ground state.

In such a light-emitting element, usually, an organic compound layer is formed to be a thin film approximately 1 μm or less. In addition, since such a light-emitting element is an element in which an organic compound itself emits light, a backlight as used for a conventional liquid crystal display is not necessary. Therefore, such a light-emitting element has the big advantage of being able to be manufactured to be thin and lightweight. In addition, for example, in an organic compound film on the order of 100 to 200 nm, the time from injection of carriers to recombination is approximately several tens nanoseconds in consideration of the carrier mobility of the organic compound film, and light gets to be emitted approximately within microseconds even when the process from the recombination of the carriers to light emission is included. Therefore, it is also one of features that the response speed is quite fast. Further, since such a light-emitting element is a carrier-injection light-emitting element, driving by a direct voltage is possible, and noise is not easily generated. As for the driving voltage, a sufficient luminance of 100 cd/m² is achieved at 5.5 V when an organic compound film is a uniform thin film approximately 100 nm in thickness, an electrode material is selected so as to reduce the carrier injection barrier for the organic compound film, and further, a heterostructure (a two-layer structure here) is introduced (for example, refer to Non-Patent Reference 1).

(Non-Patent Reference 1)
C. W. Tang, et al., Applied Physics Letters, vol. 51, No. 12, pp. 913-915 (1987)

In addition to such element characteristics such as slimness, lightweight, high-speed response, and direct-current low-voltage driving, it can be also said to be one of big advantages that the luminescent color of a light-emitting element using an organic compound is rich in variation, and the factor is the variety of organic compound themselves. Namely, the flexibility of being able to develop materials for various luminescent colors by molecular design (for example, introduction of a substituent) or the like produces richness of colors. It can be said that the biggest application field of a light-emitting element utilizing this richness of colors is a full-color flat-panel display because there are a lot of organic compounds capable of emitting light's primary colors of red, green, and blue, and thus, full-color images can be achieved easily by patterning of the organic compounds.

It can be said that the above-described element characteristics such as slimness, lightweight, high-speed response, and direct-current low-voltage driving are also appropriate characteristics for a flat-panel display. However, in recent years, the use of not fluorescent materials but phosphorescent materials has been tried as an attempt to further improve a luminous efficiency. In the case of a light-emitting element using an organic compound, luminescence is produced when a molecular exciton returns to the ground state, where the luminescence can be luminescence (fluorescence) from an excited singlet state (S*) or luminescence (phosphorescence) from an excited triplet state (T*). When a fluorescent material is used, only luminescence (fluorescence) from S* contributes.

However, it is commonly believed that the statistical generation ratio between S* and T* is S*:T*=1:3 (for example, refer to Non-Patent Reference 2). Accordingly, in the case of a light-emitting element using a fluorescent material, the theoretical limit of the internal quantum efficiency (the ratio of generated photons to injected carriers) is considered to be 25% on the ground of being S*:T*=1:3. In other words, in the case of a light-emitting element using a fluorescent material, at least 75% of injected carriers are wasted uselessly.

(Non-Patent Reference 2)
Tetsuo TSUTSUI, Textbook for the 3$^{rd}$ Workshop, Division of Molecular Electronics and Bioelectronics, Japan Society of Applied Physics, p. 31 (1993)

Conversely, it is believed that the luminous efficiency is improved (simply 3 to 4 times) when luminescence from T*, that is, phosphorescence can be used. However, in the case of a commonly used organic material, luminescence (phosphorescence) from T* is not observed at room temperature, and normally, only luminescence (fluorescence) from S* is observed. This is because the ground state of an organic compound is normally a singlet ground state ($S_0$), and thus, T*→$S_0$ transition is a forbidden transition and S*→$S_0$ transition is an allowed transition. In reality, in recent years, light-emitting elements in which energy (hereinafter, referred to as "triplet excitation energy") that is emitted on returning from T* to a ground state can be converted into luminescence have been released one after another (for example, refer to Non-Patent Reference 3).

(Non-Patent Reference 3)
Tetsuo TSUTSUI, et al., Japanese Journal of Applied Physics, vol. 38, pp. L1502-L1504 (1999)

In Non-Patent Reference 3, a metal complex including iridium as a central metal (hereinafter, referred to as "iridium complex") is used as a luminescent material, and it can be said to be a feature that an element of the third transition series is introduced as a central metal. This metal complex is a material (hereinafter, referred to as "triplet luminescent material") capable of converting an excited triplet state into luminescence at room temperature. As described in Non-Patent Document 3, a light-emitting element using an organic compound capable of converting triplet excitation energy into luminescence can achieve a higher internal quantum efficiency than ever before. Further, when the higher internal quantum efficiency can be achieved, the luminous efficiency (lm/W) is also improved.

However, according to the report of Non-Patent Reference 3, the half-life of luminance is approximately 170 hours when the initial luminance is controlled to be 500 cd/m² in constant current driving, and so, a light-emitting element using a triplet luminescent material has a problem with the lifetime. On the other hand, in the case of a light-emitting element using a singlet luminescent material, the half-life of luminance reaches several to ten thousands hours when the initial luminance is controlled to be 500 cd/m² in constant current driving, and so, it can be said that the light-emitting element has a practical use in terms of the lifetime.

Accordingly, in a light-emitting element using a triplet luminescent material, an element that can be driven for a long time is desired. This is because a light-emitting element that is high in luminous efficiency and has a long lifetime can be obtained.

DISCLOSURE OF INVENTION

In view of the technical background related to light-emitting elements, it is an object of the present invention to solve the problem in related art. It is an object of the present invention to provide a material capable of emitting phosphorescence. In a light-emitting element using an organometallic complex capable of converting an excited triplet state into luminescence, it is an object of the present invention to provide a light-emitting element that can be driven for a long time, that is, that is high in luminous efficiency and has a long lifetime. Further, it is an object of the present invention to provide a light-emitting device that can be driven for a long time with low power consumption by using the light-emitting element.

A lot of earnest experiments and studies by the inventors to achieve the object have finally found out that an organometallic complex including a structure represented by any one of the following general formulas (1) to (4) is capable of emitting phosphorescence and that an organometallic complex represented by any one of the following general formulas (5) to (8) is capable of emitting phosphorescence to come to complete the invention.

A lot of earnest experiments and studies by the inventors to achieve the object have finally found out that, in a light-emitting element formed by providing a pair of electrodes (an anode and a cathode) and at least one layer including an organic compound between the pair of electrodes, a light-emitting element that can be driven for a long time, that is, that is high in luminous efficiency and has a long lifetime can be obtained when a specific compound is included in at least one layer of the layer including the organic compound to come to complete the invention.

A lot of earnest experiments and studies by the inventors to achieve the object have finally completed a light-emitting device that can be driven for a long time with low power consumption by using the light-emitting element.

Organometallic complexes, light-emitting elements, and light-emitting devices according to the present invention will be described below in sequence.

One of organometallic complexes according to the present invention is an organometallic complex including a structure represented by the following general formula (1).

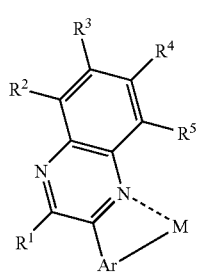

(1)

In the formula (1), $R^1$ to $R^5$ are individually any one selected from the group consisting of hydrogen, a halogen element, an acyl group, an alkyl group, an alkoxyl group, an aryl group, a cyano group, and a heterocyclic group, Ar is one of an aryl group and a heterocyclic group, and M is one of an element of Group 9 and an element of Group 10. It is preferable that Ar be one of an aryl group having an electron-withdrawing group and a heterocyclic group having electron-withdrawing group. When Ar is one of an aryl group having an electron-withdrawing group and a heterocyclic group having electron-withdrawing group, phosphorescence with larger emission intensity can be emitted.

Further, a first light-emitting element according to the present invention is a light-emitting element that has a light-emitting layer between a pair of electrodes, where the light-emitting layer includes an organometallic complex including a structure represented by the general formula (1) and one of a compound that has a larger energy gap than the organometallic complex and a compound that has a larger ionization potential and a smaller electron affinity than the organometallic complex.

One of organometallic complexes according to the present invention is an organometallic complex including a structure represented by the following general formula (2).

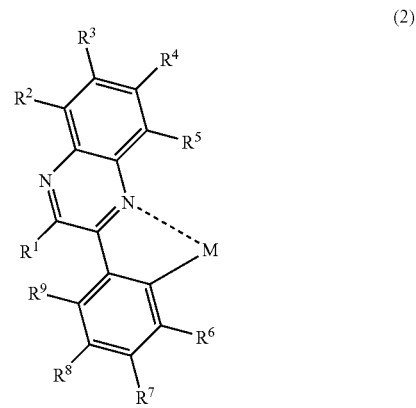

(2)

In the formula (2), $R^1$ to $R^9$ are individually any one selected from the group consisting of hydrogen, a halogen element, an acyl group, an alkyl group, an alkoxyl group, an aryl group, a cyano group, and a heterocyclic group, at least one of $R^6$ to $R^9$ is an electron-withdrawing group, and M is one of an element of Group 9 and an element of Group 10. When at least one of $R^6$ to $R^9$ is an electron-withdrawing group, phosphorescence with larger emission intensity can be emitted.

Further, a second light-emitting element according to the present invention is a light-emitting element that has a light-emitting layer between a pair of electrodes, where the light-emitting layer includes an organometallic complex including a structure represented by the general formula (2) and one of a compound that has a larger energy gap than the organometallic complex and a compound that has a larger ionization potential and a smaller electron affinity than the organometallic complex.

One of organometallic complexes according to the present invention is an organometallic complex including a structure represented by the following general formula (3).

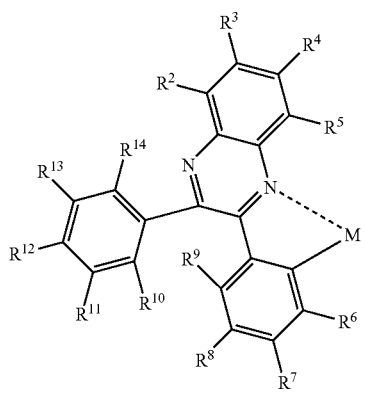

(3)

In the formula (3), $R^2$ to $R^{14}$ are individually any one selected from the group consisting of hydrogen, a halogen element, an acyl group, an alkyl group, an alkoxyl group, an aryl group, a cyano group, a heterocyclic group, and an electron-withdrawing group, and M is one of an element of Group 9 and an element of Group 10. It is preferable that at least one of $R^6$ to $R^9$ be an electron-withdrawing group. This makes it possible to emit phosphorescence with larger emission intensity.

Further, a third light-emitting element according to the present invention is a light-emitting element that has a light-emitting layer between a pair of electrodes, where the light-emitting layer includes an organometallic complex including a structure represented by the general formula (3) and one of a compound that has a larger energy gap than the organometallic complex and a compound that has a larger ionization potential and a smaller electron affinity than the organometallic complex.

One of organometallic complexes according to the present invention is an organometallic complex including a structure represented by the following general formula (4).

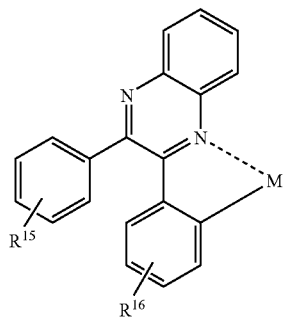

(4)

In the formula (4), $R^{15}$ and $R^{16}$ are individually any one selected from the group consisting of hydrogen, a halogen element, an acyl group, an alkyl group, an alkoxyl group, an aryl group, a cyano group, a heterocyclic group, and an electron-withdrawing group, and M is one of an element of Group 9 and an element of Group 10. It is preferable that $R^{16}$ be an electron-withdrawing group. This makes it possible to emit phosphorescence with larger emission intensity.

Further, a fourth light-emitting element according to the present invention is a light-emitting element that has a light-emitting layer between a pair of electrodes, where the light-emitting layer includes an organometallic complex including a structure represented by the general formula (4) and one of a compound that has a larger energy gap than the organometallic complex and a compound that has a larger ionization potential and a smaller electron affinity than the organometallic complex.

One of organometallic complexes according to the present invention is an organometallic complex represented by the following general formula (5).

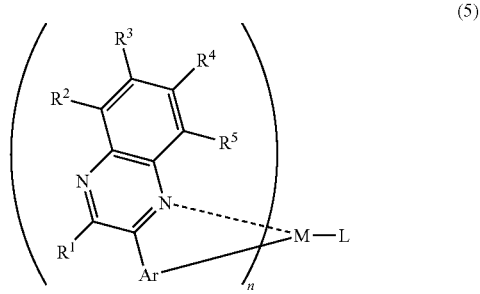

(5)

In the formula (5), $R^1$ to $R^5$ are individually any one selected from the group consisting of hydrogen, a halogen element, an acyl group, an alkyl group, an alkoxyl group, an aryl group, a cyano group, and a heterocyclic group, Ar is one of an aryl group having an electron-withdrawing group and a heterocyclic group having electron-withdrawing group, M is one of an element of Group 9 and an element of Group 10, n=2 when the M is the element of Group 9 while n=1 when the M is the element of Group 10, and L is a monoanionic ligand. When Ar is an electron-withdrawing group, phosphorescence with larger emission intensity can be emitted.

Further, a fifth light-emitting element according to the present invention is a light-emitting element that has a light-emitting layer between a pair of electrodes, where the light-emitting layer includes an organometallic complex represented by the general formula (5) and one of a compound that has a larger energy gap than the organometallic complex and a compound that has a larger ionization potential and a smaller electron affinity than the organometallic complex.

One of organometallic complexes according to the present invention is an organometallic complex represented by the following general formula (6).

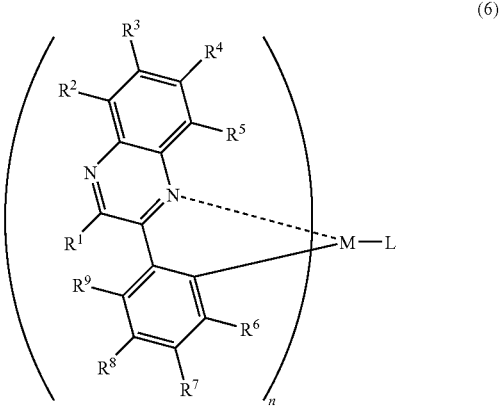

(6)

In the formula (6), $R^1$ to $R^5$ are individually any one selected from the group consisting of hydrogen, a halogen element, an acyl group, an alkyl group, an alkoxyl group, an aryl group, a cyano group, and a heterocyclic group, $R^6$ to $R^9$ are individually any one selected from the group consisting of hydrogen, an acyl group, an alkyl group, an alkoxyl group, an aryl group, a heterocyclic group, and an electron-withdrawing group, it is preferable that at least one of $R^6$ to $R^9$ be an electron-withdrawing group, M is one of an element of Group 9 and an element of Group 10, n=2 when the M is the element of Group 9 while n=1 when the M is the element of Group 10, and L is any one of a monoanionic ligand having a β-diketone structure, a monoanionic bidentate ligand having a carboxyl group, and a monoanionic bidentate ligand having a phenolic hydroxyl group. When at least one of $R^6$ to $R^9$ is an electron-withdrawing group, phosphorescence with larger emission intensity can be emitted.

The present invention provides organometallic complexes represented by the general formula (6) unless $R^1$ to $R^9$ are individually hydrogen and the anionic ligand L is an acetylacetone anion, or at least one of $R^6$ to $R^9$ is not an electron-withdrawing group.

Further, a sixth light-emitting element according to the present invention is a light-emitting element that has a light-emitting layer between a pair of electrodes, where the light-emitting layer includes an organometallic complex represented by the general formula (6) and one of a compound that has a larger energy gap than the organometallic complex and a compound that has a larger ionization potential and a smaller electron affinity than the organometallic complex.

It is to be noted that a compound is shown as "(1-70)" in the [0086] paragraph of Japanese Patent Application Laid-Open No. 2001-247859, and the compound corresponds to an organometallic complex represented by the general formula (6), where $R^1$ to $R^9$ are all individually hydrogen, M is iridium, n is 2, and anionic ligand L corresponds to acetylacetone anion. However, in the compound, any of $R^6$ to $R^9$ is not an electron-withdrawing group, but hydrogen. In addition, a synthesis method, a property, or the like of the compound is not disclosed anywhere in Japanese Patent Application Laid-Open No. 2001-247859. On the other hand, the compound is not included in organometallic complexes represented by the general formula (6) according to the present invention, and a compound in which $R^1$ to $R^9$ are individually hydrogen and the anionic ligand L is an acetylacetone anion or a compound in which $R^6$ to $R^9$ are all individually hydrogen without having an electron-withdrawing group is not included in organometallic complexes represented by the general formula (6) according to the present invention.

(Patent Reference 1)
Japanese Patent Application Laid-Open No. 2001-247859

One of organometallic complexes according to the present invention is an organometallic complex represented by the following general formula (7).

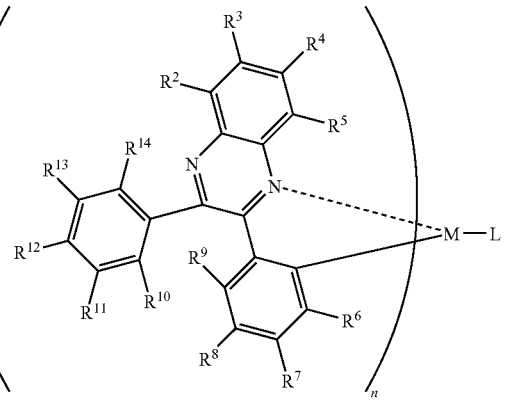

(7)

In the formula (7), $R^2$ to $R^{14}$ are individually any one selected from the group consisting of hydrogen, a halogen element, an acyl group, an alkyl group, an alkoxyl group, an aryl group, a cyano group, a heterocyclic group, and an electron-withdrawing group, M is one of an element of Group 9 and an element of Group 10, n=2 when the M is the element of Group 9 while n=1 when the M is the element of Group 10, and L is an anionic ligand. Here, it is preferable that at least one of $R^6$ to $R^9$ be an electron-withdrawing group. This makes it possible to emit phosphorescence with larger emission intensity.

Further, a seventh light-emitting element according to the present invention is a light-emitting element that has a light-emitting layer between a pair of electrodes, where the light-emitting layer includes an organometallic complex represented by the general formula (7) and one of a compound that has a larger energy gap than the organometallic complex and a compound that has a larger ionization potential and a smaller electron affinity than the organometallic complex.

One of organometallic complexes according to the present invention is an organometallic complex represented by the following general formula (8).

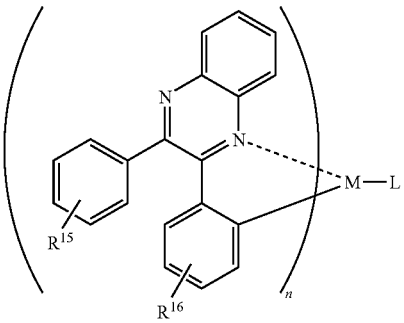

(8)

In the formula (8), $R^{15}$ and $R^{16}$ are individually any one selected from the group consisting of hydrogen, a halogen element, an acyl group, an alkyl group, an alkoxyl group, an aryl group, a cyano group, a heterocyclic group, and an electron-withdrawing group, M is one of an element of Group 9 and an element of Group 10, n=2 when the M is the element of Group 9 while n=1 when the M is the element of Group 10, and L is an anionic ligand. Here, it is preferable that at least one of $R^{16}$ be an electron-withdrawing group. This makes it possible to emit phosphorescence with larger emission intensity.

Further, a eighth light-emitting element according to the present invention is a light-emitting element that has a light-emitting layer between a pair of electrodes, where the light-emitting layer includes an organometallic complex represented by the general formula (8) and one of a compound that has a larger energy gap than the organometallic complex and a compound that has a larger ionization potential and a smaller electron affinity than the organometallic complex.

Here, in the organometallic complex including the structure represented by the general formula (3) or (4), or the organometallic complex represented by the general formula (7) or (8), it is preferable that the electron-withdrawing group be any one of a halogen group, a holoalkyl group, and a cyano group. This improves the chromaticity and quantum efficiency of the organometallic complex. In addition, a fluoro group is particularly preferable as the halogen group, and a trifluoromethyl group is particularly preferable as the holoalkyl group. This improves also the electron trap efficiency.

In the organometallic complex represented by the general formula (7) or (8), it is preferable that the central metal M be a heavy metal, particularly, iridium or platinum. This makes it possible to obtain a heavy atom effect.

A ninth light-emitting element according to the present invention is any one of the first to eighth light-emitting elements, where the compound that has the larger energy gap than the organometallic complex is one of 4,4'-bis[N-(1-naphthyl)-N-phenylamino]-biphenyl and tris(8-quinolinolato) aluminum.

A tenth light-emitting element according to the present invention is any one of the fifth to eighth light-emitting elements, where the anionic ligand L is one of a monoanionic ligand having a β-diketone structure, a monoanionic bidentate ligand having a carboxyl group, and a monoanionic bidentate ligand having a phenolic hydroxyl group.

An eleventh light-emitting element according to the present invention is any one of the first to eighth light-emitting elements, where the light-emitting layer includes the organometallic complex, a first compound that has a larger energy gap than the organometallic complex and has an electron mobility of $10^{-6}$ cm$^2$/Vs or more, and/or a second compound that has a larger energy gap than the organometallic complex and has a hole mobility of $10^{-6}$ cm$^2$/Vs or more.

A twelfth light-emitting element according to the present invention is any one of the first to eighth light-emitting elements, where the light-emitting layer includes the organometallic complex, a first compound that has a larger ionization potential and a smaller electron affinity than the organometallic complex and has an electron mobility of $10^{-6}$ cm$^2$/Vs or more, and/or a second compound that has a larger ionization potential and a smaller electron affinity than the organometallic complex and has a hole mobility of $10^{-6}$ cm$^2$/Vs or more.

A thirteenth light-emitting element according to the present invention is the eleventh or twelfth light-emitting element, where a hole transporting compound is an aromatic amine compound, and an electron transporting compound is a metal complex.

A fourteenth light-emitting element according to the present invention is any one of the first to thirteenth light-emitting element, which further has at least one of a hole injecting layer, a hole transporting layer, a hole blocking layer, an electron transporting layer, and an electron injecting layer.

In addition, a light-emitting device according to the present invention is a light-emitting device manufactured by using any one of the first to fourteenth light-emitting elements.

According to the present invention, an organometallic complex that is capable of emitting phosphorescence can be obtained. In addition, a light-emitting element that has a light-emitting layer including the organometallic complex and a compound that has a larger energy gap than the organometallic complex can be driven for a long time, is high in luminous efficiency, and has a long lifetime. By using the organometallic complex according to the present invention as a luminescent material, a light-emitting element that is capable of providing red or reddish luminescence that is excellent in chromaticity can be obtained.

In addition, a light-emitting element that is capable of emitting light efficiently can be obtained by using the organometallic complex according to the present invention as a sensitizer. Further, by using an organometallic complex into which an electron-withdrawing group is introduced in particular among organometallic complexes according to the present invention, a light-emitting element that is excellent in recombination efficiency can be obtained.

Moreover, a light-emitting device according to the present invention has excellent performance due to the use of the light-emitting element.

BRIEF DESCRIPTION OF DRAWINGS

In the accompanying drawings:

FIGS. 36A to 36E are diagrams illustrating specific examples of electronic devices to which the present invention is applied (Embodiment 10);

BEST MODE FOR CARRYING OUT THE INVENTION

Figure 1:
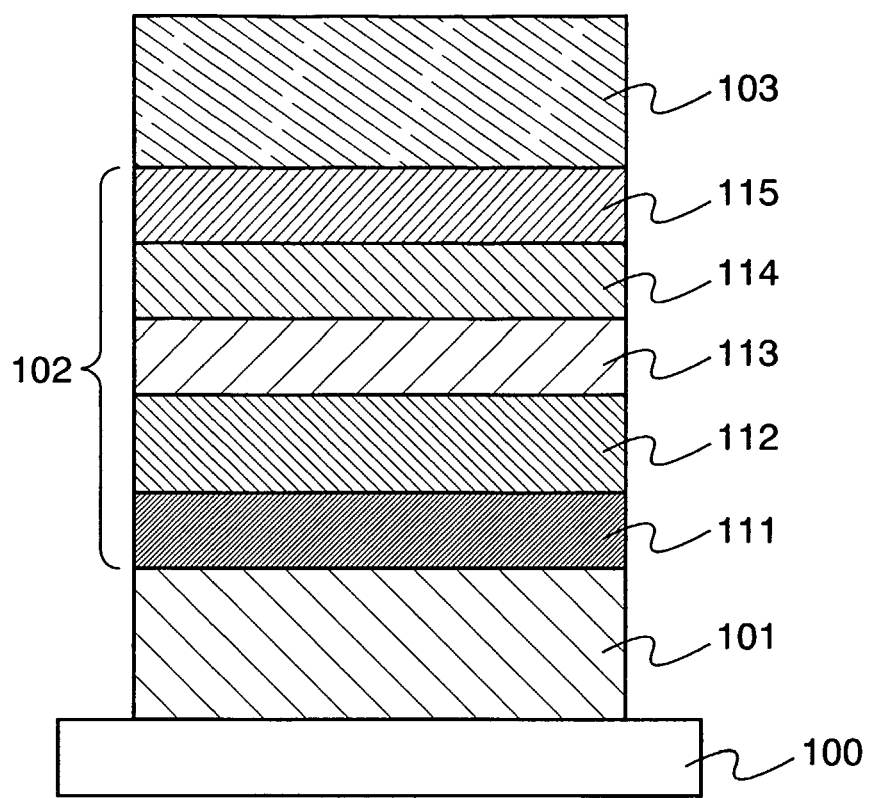
FIG. 1 is a diagram illustrating the structure of a light-emitting element according to the present invention.

The present invention will be described in more detail below. First, organometallic complexes according to the present invention will be described. The present invention provides a novel organometallic complex, a light-emitting element using the organometallic complex, and a light-emitting device using the light-emitting element.

Specific examples of the substituents $R^1$ to $R^{16}$ described above are as follows. The acyl group includes an acetyl group, a propionyl group, an isobutyryl group, and a methacryloyl group. The alkyl group includes a methyl group, an ethyl group, an n-propyl group, an iso-propyl group, a tert-butyl group, and an octyl group. The alkoxyl group includes a methoxy group, an ethoxy group, and a propoxy group. The aryl group includes a phenyl group, a 4-methylphenyl group and a 4-ethylphenyl group. The heterocyclic group includes a pyridyl group, bipyridyl group, and a methylpyridyl group. The electron-withdrawing group includes a fluoro group, a trifluoro group, and a cyano group.

In addition, specific examples of the element of Group 9 or the element of Group 10 include iridium and platinum. However, the element of Group 9 or the element of Group 10 is not to be considered limited to these elements given as examples.

Then, the ligand L is any one of a monoanionic ligand having a β-diketone structure, a monoanionic bidentate ligand having a carboxyl group, and a monoanionic bidentate ligand having a phenolic hydroxyl group. Specific examples thereof include anions represented by the following formulas (9) to (15). These ligands are effective in that they have high coordination ability and are inexpensively available.

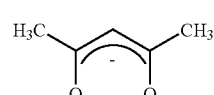

(9)

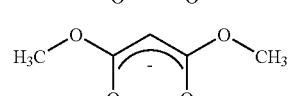

(10)

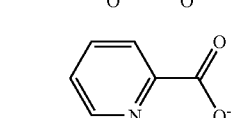

(11)

-continued
(12)
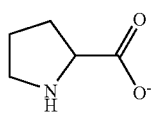
(13)
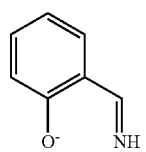
(14)
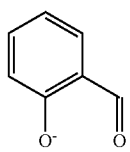
(15)
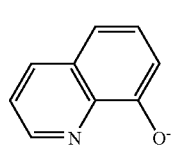
Typical examples of organometallic complexes including a structure represented by one of the general formulas (1) to (4), that is, organometallic complexes represented by the general formulas (5) to (8) are given below. However, the organometallic complexes are not to be considered limited to these compounds.
(16)
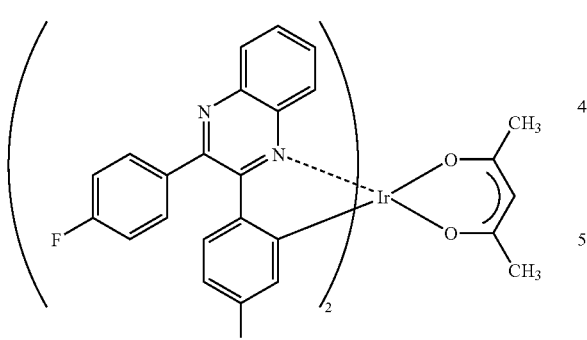
(17)
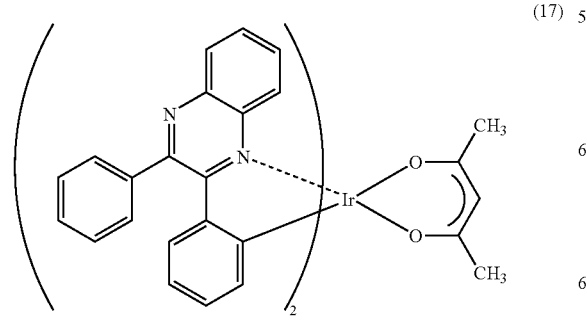
(18)
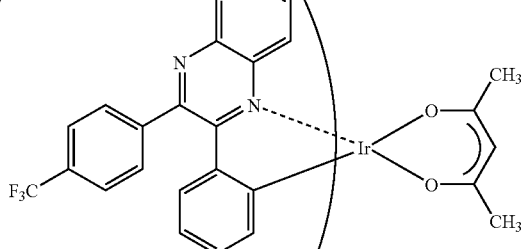
(19)
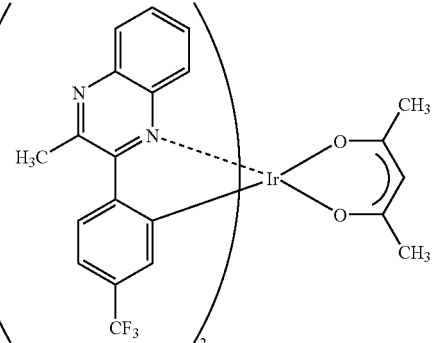
(20)
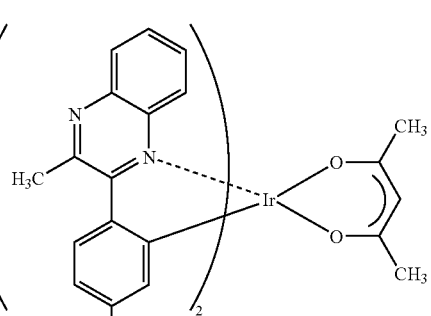
(21)
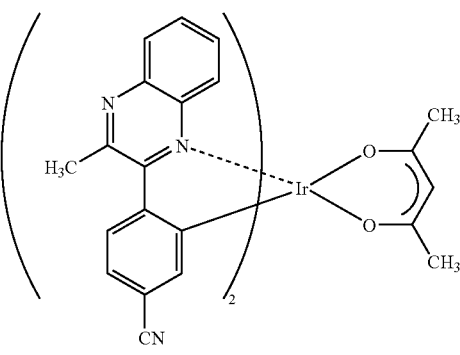

-continued
(22)
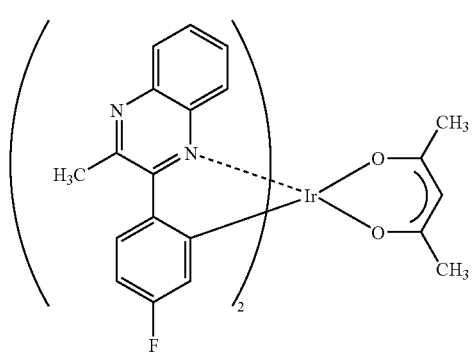
(23)
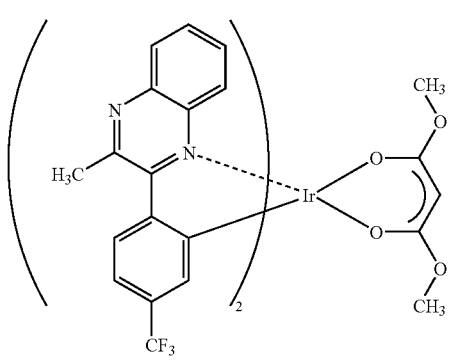
(24)
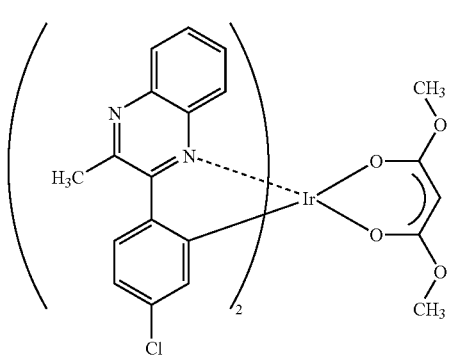
(25)
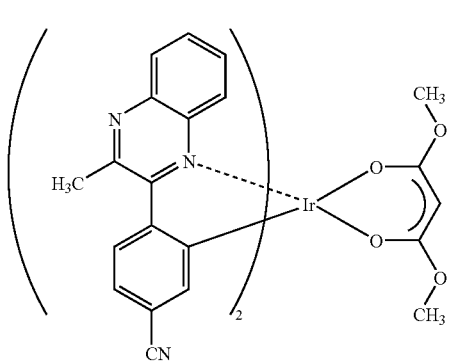
-continued
(26)
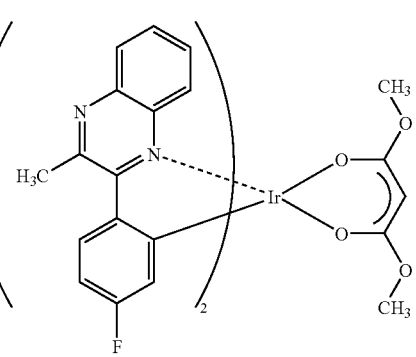
(27)
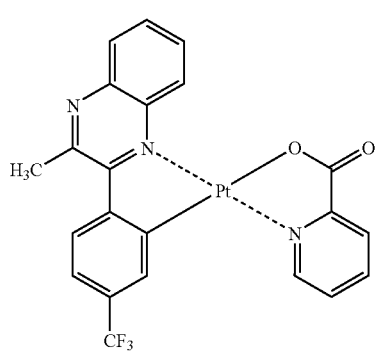
(28)
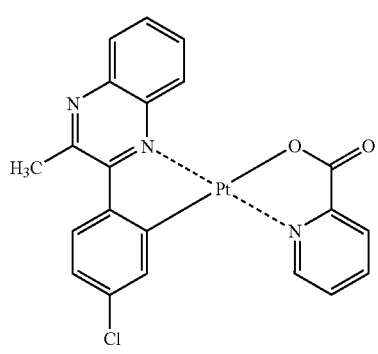
(29)
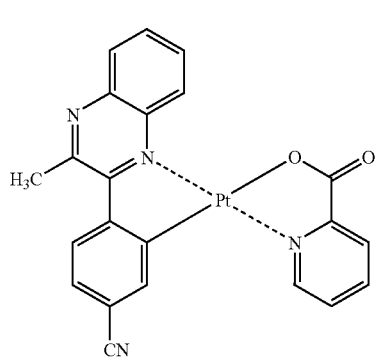

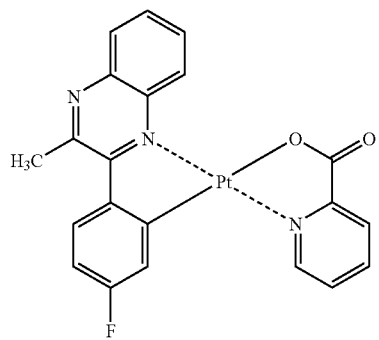 (30)
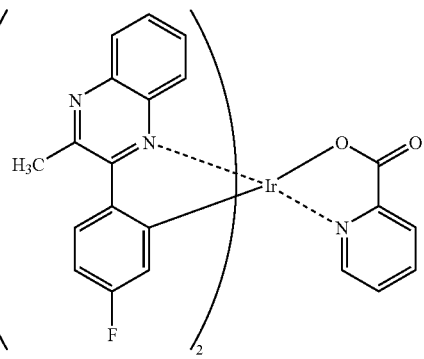 (34)
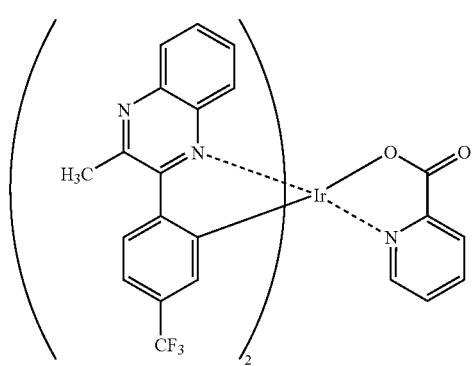 (31)
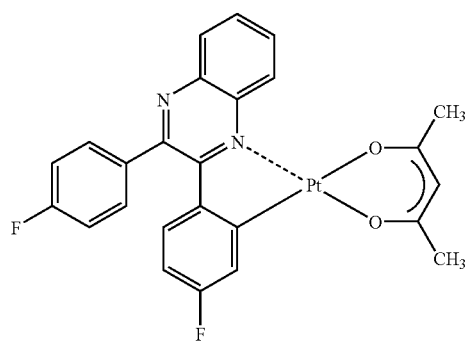 (35)
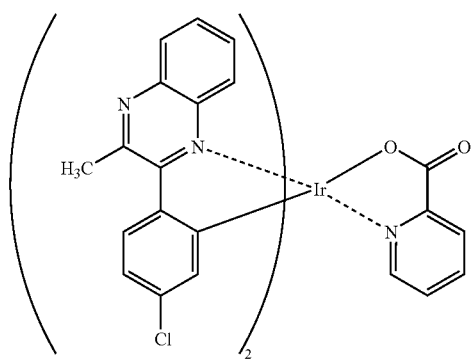 (32)
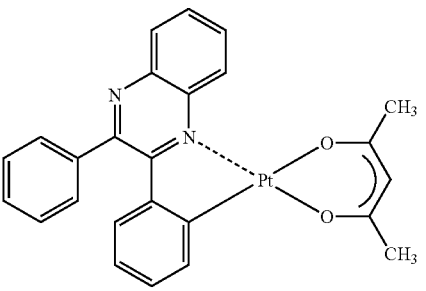 (36)
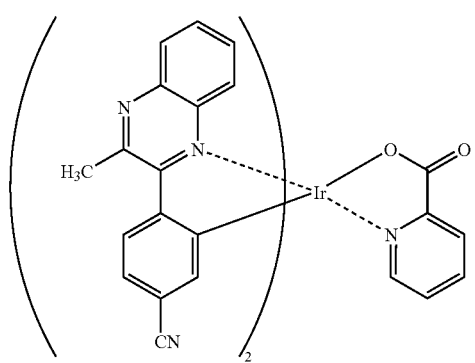 (33)
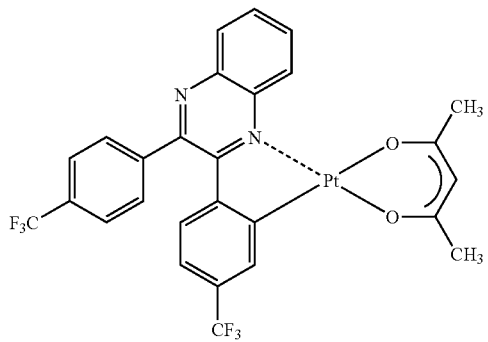 (37)

-continued
(38)
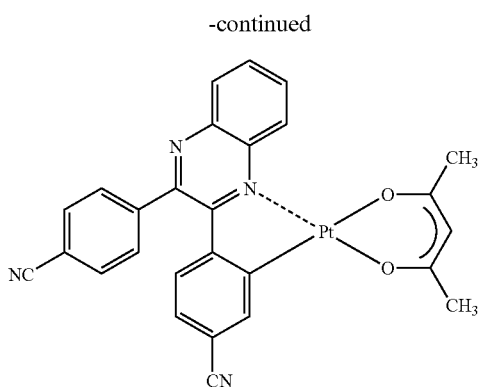
(39)
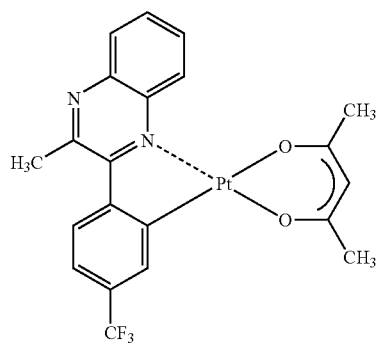
(40)
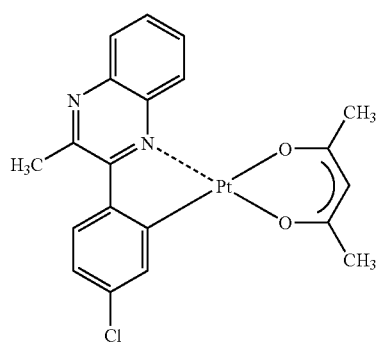
(41)
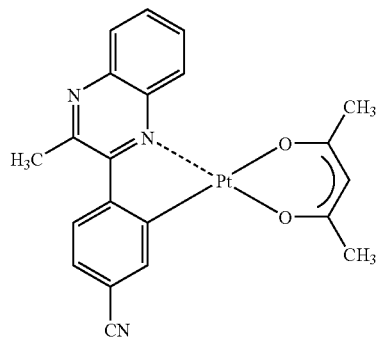
-continued
(42)
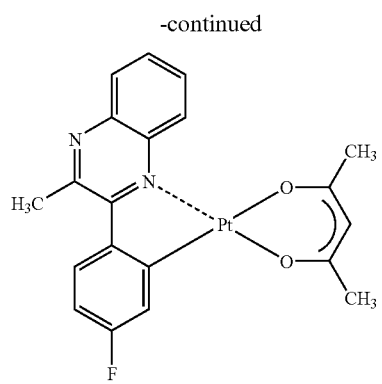
(43)
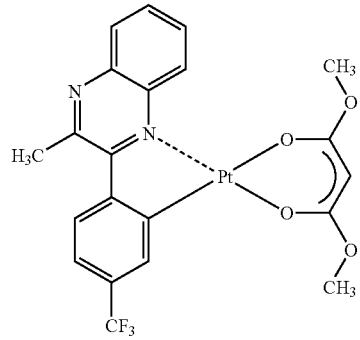
(44)
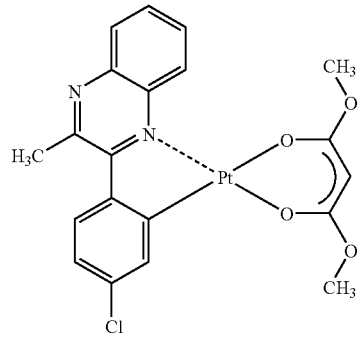
(45)
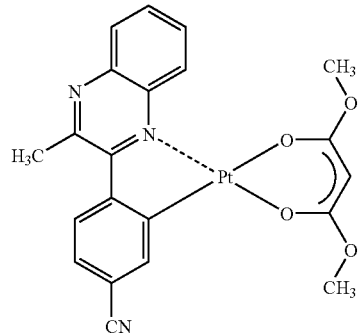

-continued
(46) 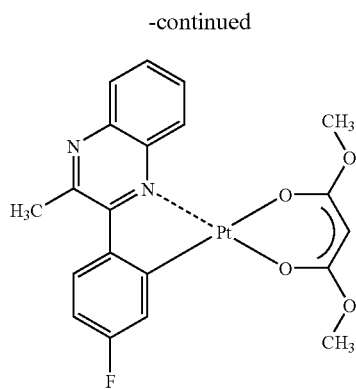
(47) 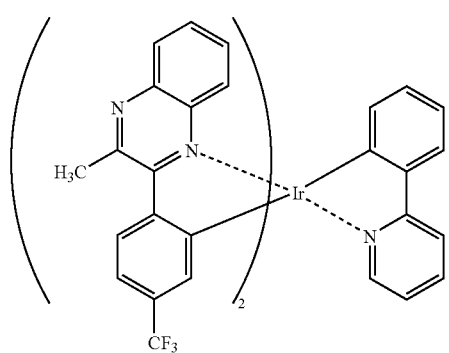
(48) 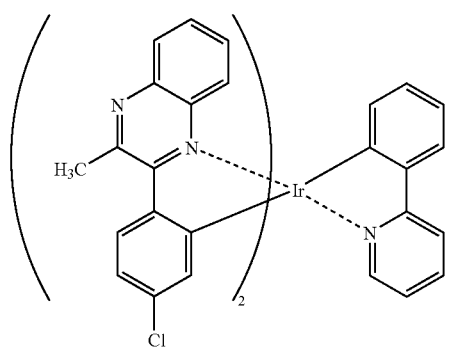
(49) 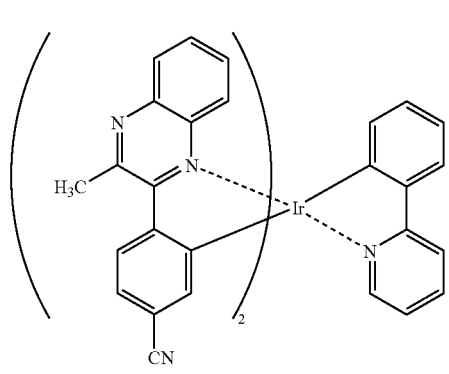
-continued
(50) 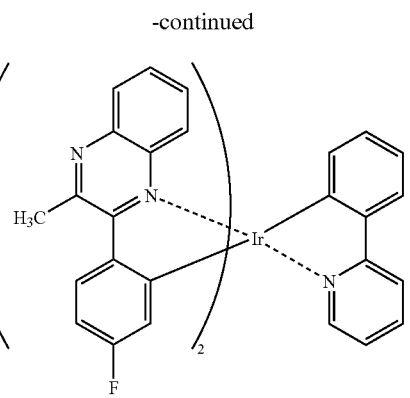
(51) 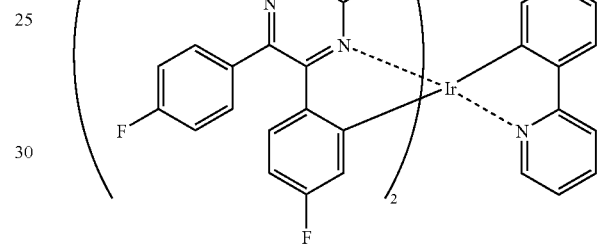
(52) 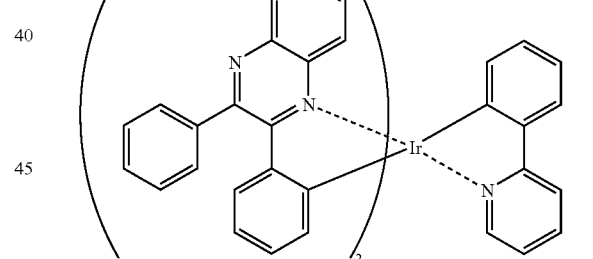
(53) 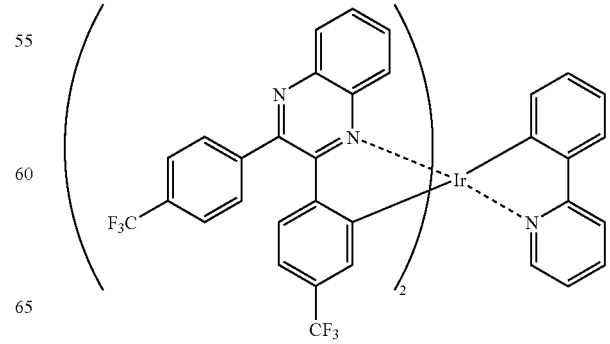

-continued (54)

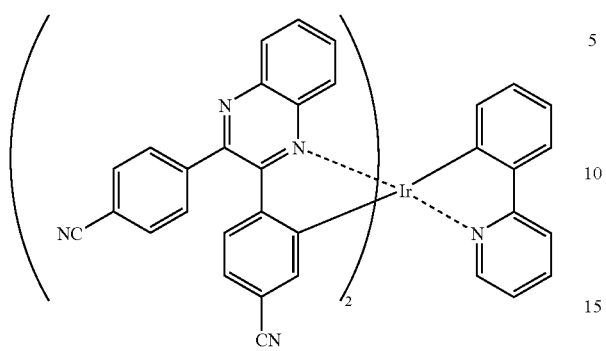

(55)

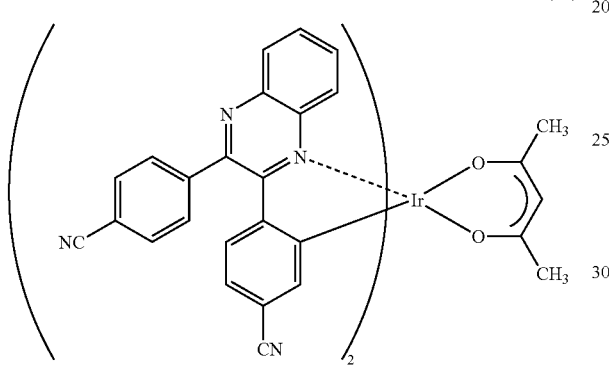

The above-mentioned organometallic complexes according to the present invention are capable of emitting phosphorescence. In addition, the organometallic complexes according to the present invention can be applied to a light-emitting element as a luminescent material. In addition, the organometallic complexes according to the present invention can be applied to a light-emitting element as a photosensitizer.

(Synthesis Method of Organometallic Complex According to the Present Invention)

Next, a manufacturing method, that is, a synthesis method of an organometallic complex according to the present invention will be described. An organometallic complex according to the present invention, that is, an organometallic complex including a structure represented by each of the general formulas (1) to (4), that is, an organometallic complex represented by each of the general formulas (5) to (8) can be obtained by orthometallation of a ligand. For example, an organometallic complex including a ligand represented by the following general formula (56), that is, an organometallic complex including a structure represented by the general formula (3) or an organometallic complex represented by the general formula (7), can be obtained by orthometallation of a ligand represented by the following general formula (56). A method for synthesizing an organometallic complex represented by the general formula (7) with the use of a ligand represented by the general formula (56) will be described below.

(56)

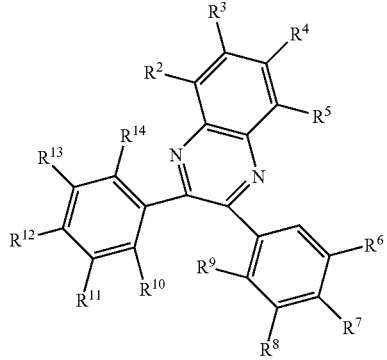

In the formula (56), $R^2$ to $R^{14}$ are individually any one selected from the group consisting of hydrogen, a halogen element, an acyl group, an alkyl group, an alkoxyl group, an aryl group, a cyano group, a heterocyclic group, and an electron-withdrawing group.

It is to be noted that a ligand represented by the general formula (56) can be synthesized, for example, in accordance with the following synthesis scheme. In addition, another ligand in an organometallic complex according to the present invention can be synthesized in a similar way.

(57)

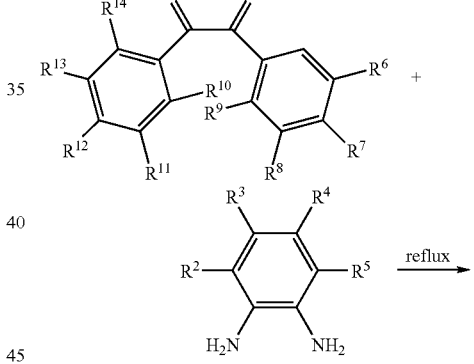

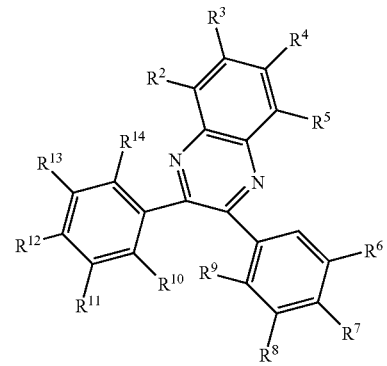

In the formula (57), $R^2$ to $R^{14}$ are individually any one selected from the group consisting of hydrogen, a halogen element, an acyl group, an alkyl group, an alkoxyl group, an aryl group, a cyano group, a heterocyclic group, and an electron-withdrawing group.

The thus obtained ligand represented by the general formula (56) is used to synthesize an organometallic complex according to the present invention. The following synthesis method may be used for a reaction (orathometallation) in this case.

For example, when an organometallic complex with iridium as a central metal according to the present invention is synthesized, a chloro-bridged dinuclear complex is first synthesized with the use of iridium chloride hydrate as a raw material for the central metal by mixing the iridium chloride hydrate with the ligand represented by the general formula (56) and holding the iridium chloride hydrate mixed with the ligand at reflux in a nitrogen atmosphere.

The synthesis scheme is shown by the following formula (58).

In the formula (58), $R^2$ to $R^{14}$ are individually any one selected from the group consisting of hydrogen, a halogen element, an acyl group, an alkyl group, an alkoxyl group, an aryl group, a cyano group, a heterocyclic group, and an electron-withdrawing group.

Next, by mixing the obtained dinuclear complex with a ligand L and holding the dinuclear complex mixed with the ligand L at reflux in a nitrogen atmosphere, the chlorine bridge is cut with the ligand L to obtain an organometallic complex according to the present invention.

The synthesis scheme is shown by the following formula (59).

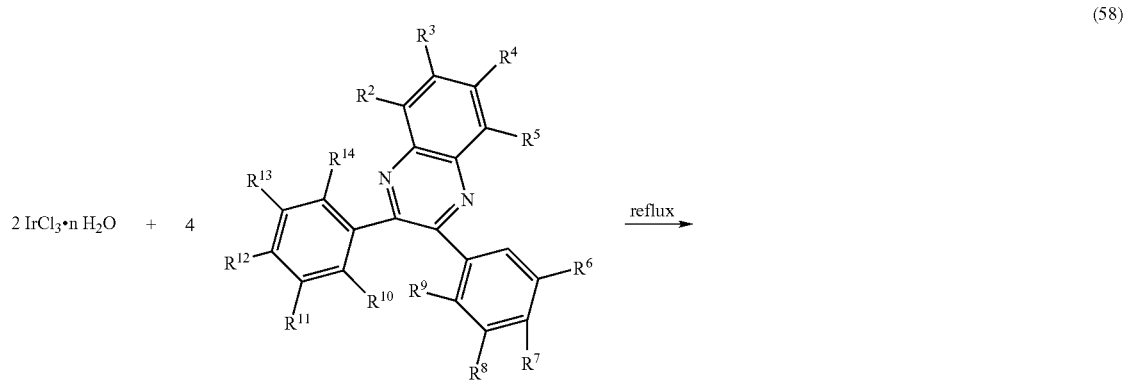

(58)

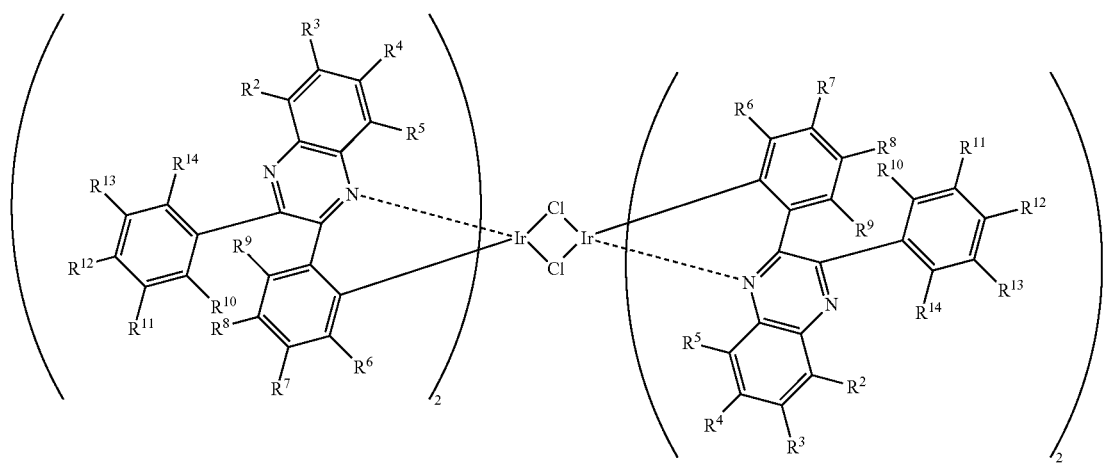

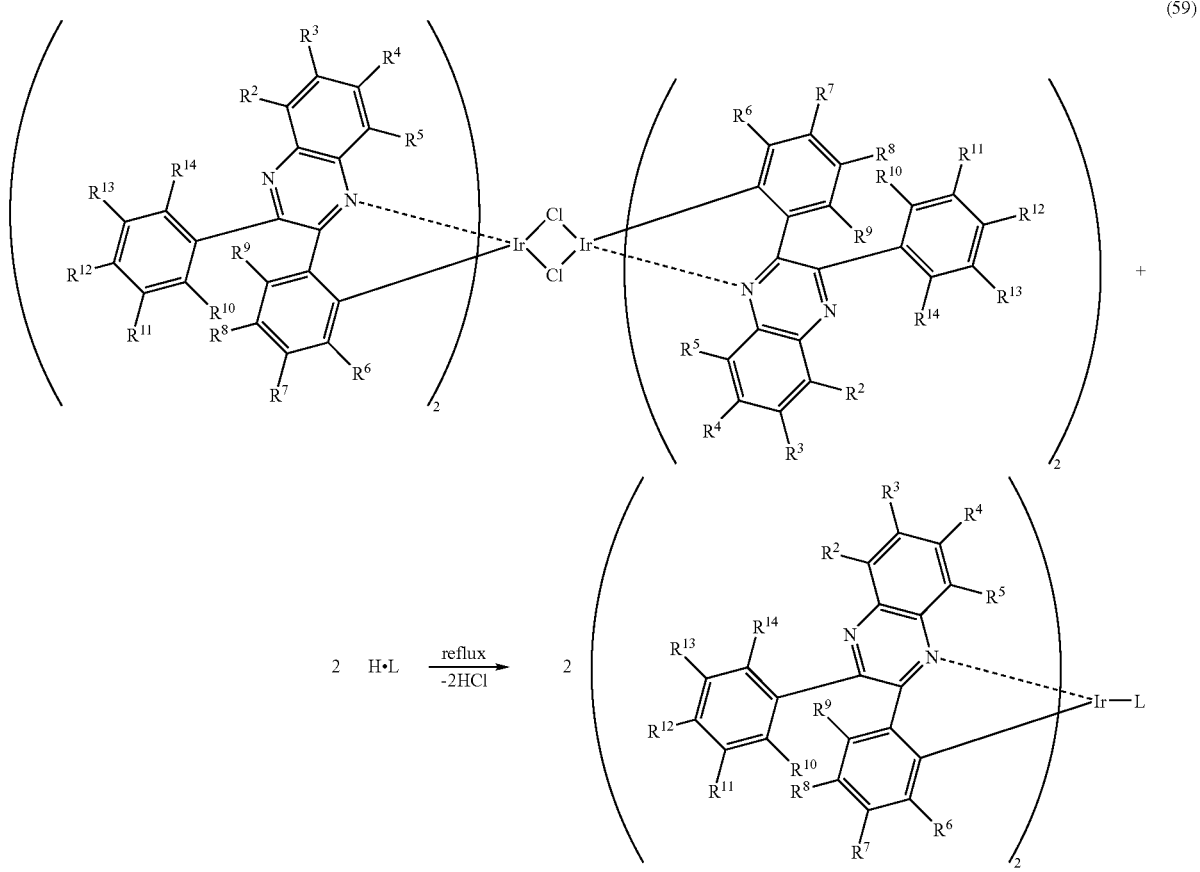

In the formula (59), $R^2$ to $R^{14}$ are individually any one selected from the group consisting of hydrogen, a halogen element, an acyl group, an alkyl group, an alkoxyl group, an aryl group, a cyano group, a heterocyclic group, and an electron-withdrawing group.

It is to be noted that the synthesis method of an organometallic complex according to the present invention is not to be considered limited to the synthesis method described above.

EMBODIMENT MODE MODES OF LIGHT-EMITTING ELEMENTS ACCORDING TO THE PRESENT INVENTION

Next, light-emitting elements according to the present invention will be described with reference to the accompanying drawings.

Embodiment Mode 1

In Embodiment mode 1, a light-emitting element according to the present invention will be described with reference to FIG. 1.

As shown in FIG. 1, the light-emitting element according to the present invention has a structure in which a first electrode 101 is formed on a substrate 100, a layer 102 including a luminescent material is formed on the first electrode 101, and a second electrode 103 is formed thereon. As a material to be used for the substrate 100 here, a material that is used for a conventional light-emitting element may be used. For example, glass, quartz, transparent plastic, and a flexible substrate can be used. In addition, the first electrode 101 and the second electrode 103 in Embodiment mode 1 function as an anode and a cathode, respectively.

Namely, the first electrode 101 is formed by using an anode material. As the anode material that can be used here, it is preferable to use a metal, an alloy, an electrically conductive compound, or a mixture thereof, which has a larger work function (a work function of 4.0 eV or more). As specific examples of the anode material, a metal such as gold (Au), platinum (Pt), nickel (Ni), tungsten (W), chromium (Cr), molybdenum (Mo), iron (Fe), cobalt (Co), copper (Cu), or palladium (Pd), and a nitride of a metal material such as TiN can be used in addition to ITO (indium tin oxide), ITSO (indium tin silicon oxide), and IZO (indium zinc oxide) of indium oxide mixed with zinc oxide (ZnO) at 2 to 20%.

On the other hand, as a cathode material to be used for the second electrode 103, it is preferable to use a metal, an alloy, an electrically conductive compound, or a mixture thereof, which has a smaller work function (a work function of 3.8 eV or less). As specific examples of the cathode material, in addition to an element belonging to Group 1 or 2 of the periodic table of the elements, that is, alkali metals such as Li and Cs and alkali-earth metals such as Mg, Ca, and Sr, and an alloy (Mg:Ag or Al:Li) and a compound (LiF, CsF, or $CaF_2$) including the element, a transition metal including a rare-earth metal can be used to form the second electrode 103. The second electrode 103 can be formed also by using a lamination layer of the material mentioned above and a metal (including an alloy) such as Al, Ag, or ITO.

A thin film composed of the above-mentioned anode material and a thin film composed of the above-mentioned cathode material are formed by a method such as evaporation or sputtering to form the first electrode 101 and the second electrode 103, respectively, which preferably have a film thickness of 10 to 500 nm. Finally, a protective layer (a barrier layer) composed of an inorganic material such as SiN or an organic material such as Teflon® or a styrene polymer is formed. The barrier layer may be transparent or non-transparent, and the inorganic material or organic material is formed by a method such as evaporation or sputtering.

In the light-emitting element according to the present invention, light generated by recombination of carriers in a light-emitting layer is emitted from one or both of the first electrode 101 and the second electrode 103 to the outside. Namely, the first electrode 101 is formed by using a light-transmitting material when the light is emitted from the first electrode 101 while the second electrode 103 is formed by using a light-transmitting material when the light is emitted from the second electrode 103. The layer 102 including the luminescent material is formed by stacking a plurality of layers, in Embodiment mode 1, by stacking a hole injecting layer 111, a hole transporting layer 112, a light-emitting layer 113, a hole blocking layer 114, and an electron transporting layer 115 in order.

In the layer 102 including the luminescent material, the hole injecting layer 111 is provided to come in contact with the first electrode 101. In addition, it is preferable to form the hole injecting layer 111 with the use of a material that is capable of receiving holes from the first electrode 101, and further, be formed with a material that is capable of injecting holes into a layer provided on the second electrode 103 side of the hole injecting layer 111 to come in contact with the hole injecting layer 111. Specifically, it is preferable to form the hole injecting layer 111 with the use of a phthalocyanine compound. The phthalocyanine compound includes, for example, phthalocyanine (abbreviation: $H_2$—Pc) and copper phthalocyanine (abbreviation: Cu—Pc).

In addition, aromatic amine compounds such as 4,4'-bis[N-{4-(N,N-di-m-tolylamino)phenyl}-N-phenylamino]biphenyl (abbreviation: DNTPD) and 4,4',4''-tris[N-(3-methylphenyl)-N-phenylamino]-triphenylamine (abbreviation: MTDATA). In addition, conductive inorganic compounds (including semiconductors) such as molybdenum oxide (MoOx) and vanadium oxide (VOx) can be also used. Further, a mixture of the conductive inorganic compound and the aromatic amine compound described above or below can be used. This mixture can be formed by a method such as co-evaporation.

It is preferable to form the hole transporting layer 112 with the use of a material that is capable of transporting holes, specifically, an aromatic amine compound (that is, a compound having a benzene ring-nitrogen bond). For example, in addition to 4,4'-bis[N-(3-methylphenyl)-N-phenyl-amino]-biphenyl (abbreviation: TPD) and 4,4'-bis[N-(1-naphthyl)-N-phenyl-amino]-biphenyl (abbreviation: α-NPD), starburst aromatic amine compounds such as MTDATA mentioned above and 4,4',4''-tris(N,N-diphenyl-amino)-triphenylamine (abbreviation: TDATA) are preferably used to form the hole transporting layer 112. In addition, a mixture of a conductive inorgaic compound (including semiconductors) such as molybdenum oxide (MoOx) or vanadium oxide (VOx) and the aromatic amine compound described above can be used. This mixture can be formed by a method such as co-evaporation.

It is preferable that the light-emitting layer 113 be formed by co-evaporation of at least one organometallic complex and a host material. The organometallic complex is an organometallic complex including a structure represented by one of the general formulas (1) to (4), or an organometallic complex represented by one of the general formulas (5) to (8). As the host material, it is preferable to use a material that has a larger energy gap (Eg) than the organometallic complex, which has a structure represented by one of the general formulas (1) to (4), or is represented by one of the general formulas (5) to (8).

In addition, in particular, as the host material, it is preferable to use a material that has a larger energy gap and further has a larger ionization potential (Ip) and a smaller electron affinity (EA) than the organometallic complex, which has a structure represented by one of the general formulas (1) to (4), or is represented by one of the general formulas (5) to (8). Examples thereof include 4,4'-bis(N-carbazolyl)-biphenyl (abbreviation: CBP), 4,4',4''-tris(N-carbazolyl)-triphenylamine (abbreviation: TCTA), and 1,3,5-tris[4-(N-carbazolyl)phenyl]benzene (abbreviation: TCPB). Further, it is more preferable that the host material be composed of a material that is capable of transporting either one or both carriers of a hole and an electron, specifically, a material that has a carrier mobility of $10^{-6}$ cm$^2$/Vs or more. This makes it possible to reduce the driving voltage and improve the reliability of the element.

Specific examples of materials that can be used as the host material include α-NPD and tris(8-quinolinolato) aluminum (abbreviation: Alq$_3$). It is to be noted that the hole mobility in α-NPD is approximately $10^{-4}$ cm$^2$/Vs, and that the electron mobility in tris(8-quinolinolato) aluminum (abbreviation: Alq$_3$) is approximately $10^{-5}$ cm$^2$/Vs. As described above, it is preferable that the mobilities of either one or both carriers of a hole and an electron be $10^{-6}$ cm$^2$/Vs or more. However, the host material is not to be considered limited to α-NPD and Alq$_3$, and the above-mentioned aromatic amine compounds such as TPD and metal complexes such as tris(8-quinolinolato) gallium (abbreviation: Gaq$_3$) and tris(4-methyl-8-quinolinolato) aluminum (abbreviation: Almq$_3$) can be also used as the host material. These materials, Alq$_3$, Gaq$_3$, and Almq$_3$, correspond to examples of electron transporting metal complexes.

When the light-emitting layer 113 is formed to have the structure described above, holes and electrons are easily transported in the light-emitting layer 113, and those holes and electrons are efficiently trapped in the organometallic complex without passing through the light-emitting layer to produce luminescence. Therefore, it is not easy for holes or electrons to pass through the light-emitting layer, and exciton formation is made more efficient. Accordingly, a stable device that shows less decrease in luminous efficiency (that is, deterioration in luminance) can be constructed.

The organometallic complexes represented by the formulas (16) to (55) easily receive holes due to the organic moiety-metal bond, and further, easily receive also electrons due to the quinoxaline skeleton. Therefore, the organometallic complexes have the advantage that carriers can be trapped effectively.

It is to be noted that it is preferable to form the light-emitting layer 113 with the use of an organometallic complex having a fluoro group or a trifluoromethyl group, particularly, such as the organometallic complexes represented by the formulas (16) and (18) among the organometallic complexes represented by the formulas (16) to (55). This expands the range of choices for the host materials. In addition, in particular, the affinity for electrons is increased to provide the advantage that electrons can be trapped more effectively.

It is preferable to form the hole blocking layer 114 with the use of a material that has a large ionization potential such as bis(2-methyl-8-quinolinolato)-4-phenylphenolato-aluminum (abbreviation: BAlq), 1,3-bis[5-(p-tert-butylphenyl)-1,3,4-oxadiazole-2-yl]benzene (abbreviation: OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), or bathocuproin (abbreviation: BCP), and more preferable to form the hole blocking layer 114 with the use of a material that has an at least 0.3 eV larger ionization potential than the light-emitting layer 113. This makes it possible to prevent holes injected from the first electrode 101 side into the layer 102 including the luminescent material from flowing toward the second electrode 103 to serve as a cathode. In addition, light energy can be prevented from transferring toward the electron transporting layer 115.

It is preferable to form the electron transporting layer 115 with the use of a material that is capable of transporting, toward the light-emitting layer 113, electrons injected from the second electrode 103 to serve as a cathode into the layer 102 including the luminescent material. In addition, it is preferable to form the electron transporting layer 115 with the use of a material that has a larger ionization potential than the material forming the light-emitting layer 113. However, in the case of providing a hole blocking layer 114 as in the present embodiment mode, it is not always necessary to use a material that has a larger ionization potential than the material forming the light-emitting layer 113.

Specific examples of such a material include metal complexes having a quinoline skeleton or a benzoquinoline skeleton such as $Alq_3$, $Gaq_3$, $Almq_3$, and bis(10-hydroxybenzo[h]-quinolinato) beryllium (abbreviation: $BeBq_2$), and BAlq mentioned above. In addition, metal complexes having an oxazole ligand or a thiazole ligand such as bis[2-(2-hydroxyphenyl)-benzoxazolato]zinc (abbreviation: $Zn(BOX)_2$) and bis[2-(2-hydroxyphenyl)-benzothiazolato]zinc (abbreviation: $Zn(BTZ)_2$) can be also used as a material for forming the electron transporting layer 115. Further, in addition to 2-(4-biphenylyl)-5-(4-tert-butylphenyl)-1,3,4-oxadiazole (abbreviation: PBD), and OXD-7, TAZ, p-EtTAZ, BPhen, and BCP mentioned above, inorganic materials such as titanium oxide may be also used.

The above-described light-emitting element according to the present invention shows less decrease in luminance over emission time, and shows a favorable lifetime.

Embodiment Mode 2

A light-emitting element according to the present invention will be described with reference to FIG. 2.

Figure 2:
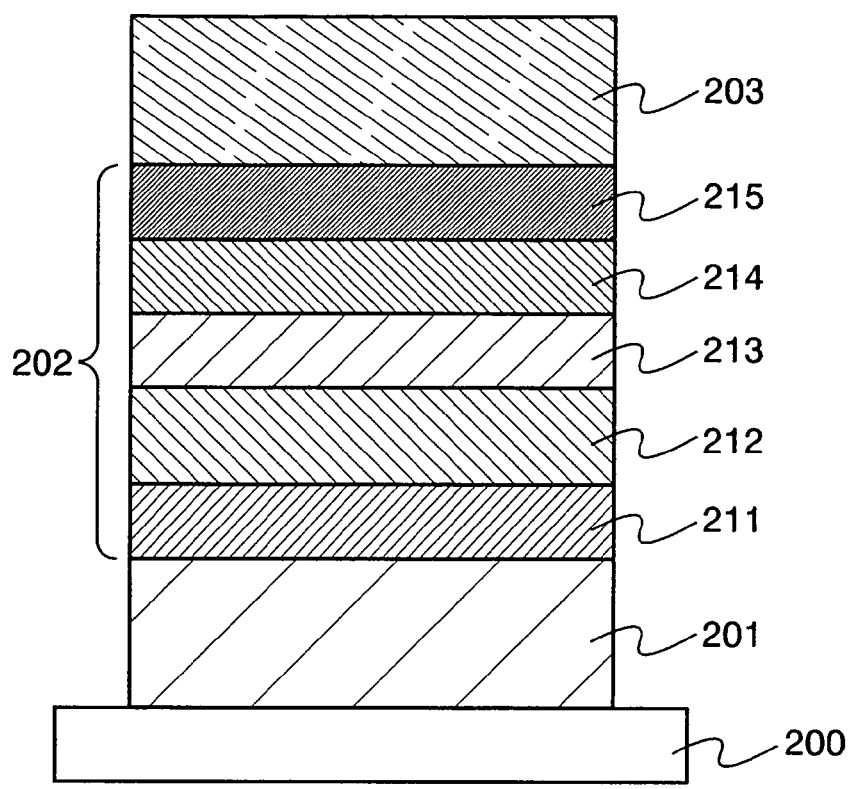
FIG. 2 is a diagram illustrating the structure of a light-emitting element according to the present invention.

The light-emitting element shown in FIG. 2 has a first electrode 201 on a substrate 200 to serve as a cathode, a layer 202 including a luminescent material on the first electrode, and a second electrode 203 on the layer 202 including the luminescent material to serve as an anode. As shown in FIG. 2, the layer 202 including the luminescent material is formed by stacking an electron transporting layer 211, a hole blocking layer 212, a light-emitting layer 213, a hole transporting layer 214, and a hole injecting layer 215 in order, where the electron transporting layer 211 and the hole transporting layer 214 are provided respectively on the first electrode 201 side and on the second electrode 203 side with the light-emitting layer 213 as a center.

The electron transporting layer 211, the hole blocking layer 212, the light-emitting layer 213, the hole transporting layer 214, and the hole injecting layer 215 may be formed by evaporation or the like respectively with the use of the same materials as those for the electron transporting layer 115, the hole blocking layer 114, the light-emitting layer 113, the hole transporting layer 112, and the hole injecting layer 111 described in Embodiment mode 1. As described above, a light-emitting element in which an electrode to serve as a cathode is provided on a substrate side may be used. It is to be noted that light generated by recombination of carriers in the layer 202 including the luminescent material is emitted from one or both of the first electrode 201 and the second electrode 203 in the light-emitting element according to the present invention.

The above-described light-emitting element according to the present invention shows less decrease in luminance over emission time, and shows a favorable lifetime.

Embodiment Mode 3

Figure 3:
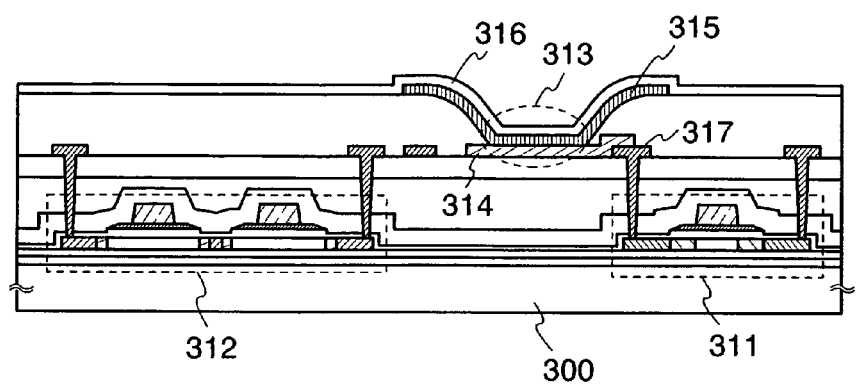
FIG. 3 is a diagram illustrating a light-emitting device.

In Embodiment mode 3, a light-emitting element using an organometallic complex according to the present invention is manufactured over a substrate 300 composed of glass, quartz, a metal, a bulk semiconductor, transparent plastics, a flexible substrate, or the like. By manufacturing a plurality of light-emitting elements using the organometallic complex according to the present invention over a substrate, a passive matrix light-emitting device can be manufactured. In addition, other than a substrate composed of glass, quartz, transparent plastics, a flexible substrate, or the like, for example, a light-emitting element in contact with a thin film transistor (TFT) array may be manufactured as shown in FIG. 3 where a light-emitting element 313 is manufactured together with TFTs 311 and 312.

For the light-emitting element 313, a first electrode 314, a layer 315 including a luminescent material, and a second electrode 316 can be manufactured. Further, a wiring 317 is manufactured to come in contact with the first electrode 314. In this way, an active matrix light-emitting device where driving of a light-emitting element is controlled by a TFT can be manufactured. It is to be noted that the structures of the TFTs are not particularly limited. For example, a staggered TFT and an inversely staggered TFT may be used. In addition, the degree of crystallinity of a semiconductor layer forming the TFT is not particularly limited, either. A crystalline semiconductor layer and an amorphous semiconductor layer may be used.

Embodiment Mode 4

The example of a light-emitting element using an organometallic complex according to the present invention as a luminescent material will be described with reference to FIG. 4.

Figure 4:
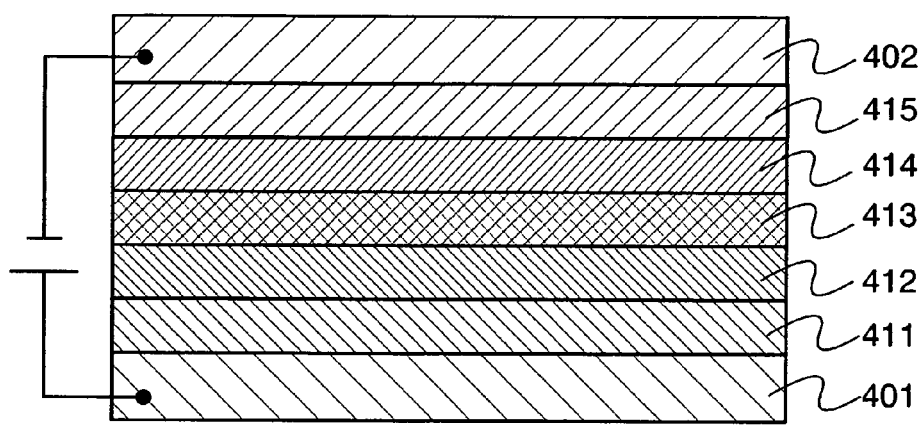
FIG. 4 is a diagram illustrating Embodiment mode 4 of the present invention.

FIG. 4 shows a light-emitting element that has a light-emitting layer 413 between a first electrode 401 and a second electrode 402. In the light-emitting layer 413, an organometallic complex including a structure represented by any one of the general formulas (1) to (4) according to the present invention or an organometallic complex represented by any one of the general formulas (5) to (8) according to the present invention is included.

In this light-emitting element, a hole injected from the first electrode 401 and an electron injected from the second electrode 402 are recombined in the light-emitting layer 413 to bring the organometallic complex according to the present invention to an excited state. Then, light is emitted when the organometallic complex according to the present invention in the excited state returns to the ground state. As just described, the organometallic complex according to the present invention serves as a luminescent material. It is to be noted that the first electrode 401 and the second electrode 402 respectively serve as an anode and a cathode in the light-emitting element in the present embodiment mode.

Here, the light-emitting layer 413 is not particularly limited. However, it is preferable that the light-emitting layer 413 be a layer in which the organometallic complex according to the present invention is included so as to be dispersed in a layer composed of a material that has a larger energy gap than the organometallic complex has. This makes it possible to prevent quenching of luminescence from the organometallic complex according to the present invention due to the concentration. It is to be noted that an energy gap indicates an energy gap between a LUMO level and a HOMO level.

The material to be used for dispersing the organometallic complex according to the present invention is not particularly limited. However, carbazole derivatives such as 4,4'-bis(N-carbazolyl)-biphenyl (abbreviation: CBP) and 4,4',4"-tris(N-carbazolyl)-triphenylamine (abbreviation: TCTA) and metal complexes such as bis[2-(2'-hydroxyphenyl)-pyridinato]zinc (abbreviation: $Znpp_2$), bis[2-(2'-hydroxyphenyl)-benzoxazolato]zinc (abbreviation: ZnBOX), and tris(8-quinolinolato) aluminum (abbreviation: $Alq_3$) are preferable in addition to compounds having an arylamine skeleton such as 2,3-bis(4-diphenylaminophenyl) quinoxaline (abbreviation: TPAQn) and 4,4'-bis[N-(1-naphthyl)-N-phenylamino]-biphenyl (abbreviation: α-NPD).

It is to be noted that it is preferable to be a light-emitting element particularly using, among the organometallic complexes, an organometallic complex having an electron-withdrawing group such as a halogen group, a holoalkyl group, or a cyano group as a luminescent material. This makes it possible to obtain a light-emitting element that is excellent in chromaticity and quantum efficiency.

In addition, a fluoro group among hologen groups and a trifluoromethyl group among holoalkyl groups are particularly preferable. By using an organometallic complex having any of these groups as a luminescent material, a light-emitting element that is high in recombination efficiency can be obtained.

Although the first electrode 401 is not particularly limited, it is preferable that the first electrode 401 be formed by using a material that has a larger work function when the first electrode 401 functions as an anode as in the present embodiment mode. Specifically, in addition to indium tin oxide (ITO), indium tin oxide including silicon oxide, and indium oxide including zinc oxide at 2 to 20%, gold (Au), platinum (Pt), nickel (Ni), tungsten (W), chromium (Cr), molybdenum (Mo), iron (Fe), cobalt (Co), copper (Cu), palladium (Pd), and the like can be used. The first electrode 401 can be formed by, for example, sputtering or evaporation.

In addition, although the second electrode 402 is not particularly limited, it is preferable that the second electrode 402 be formed by using a material that has a smaller work function when the second electrode 402 functions as a cathode as in the present embodiment mode. Specifically, aluminum containing an alkali metal or an alkali-earth metal such as lithium (Li) or magnesium, and the like can be used. The second electrode 402 can be formed by, for example, sputtering or evaporation.

Further, in order to extract emitted light to the outside, it is preferable that any one or both of the first electrode 401 and the second electrode 402 be an electrode composed of a material such as indium tin oxide or an electrode formed to be several to several tens nm in thickness so that visible light can be transmitted.

In addition, a hole transporting layer 412 may be provided between the first electrode 401 and the light-emitting layer 413 as shown in FIG. 4. Here, a hole transporting layer is a layer that has a function of transporting holes injected from the first electrode 401 to the light-emitting layer 413. By providing the hole transporting layer 412 to keep the first electrode 401 away from the light-emitting element 413 in this way, quenching of luminescence due to a metal can be prevented.

The hole transporting layer 412 is not particularly limited, and it is possible to use a layer formed with the use of, for example, an aromatic amine compound (that is, compound including a bond of a benzene ring-nitrogen) such as 4,4'-bis [N-(1-naphthyl)-N-phenyl-amino]-biphenyl (abbreviation: α-NPD), 4,4'-bis[N-(3-methylphenyl)-N-phenyl-amino]-biphenyl (abbreviation: TPD), 4,4', 4"-tris(N, N-diphenyl-amino)-triphenylamine (abbreviation: TDATA), or 4,4', 4"-tris[N-(3-methylphenyl)-N-phenyl-amino]-triphenylamine (abbreviation: MTDATA).

In addition, the hole transporting layer 412 may be a layer that has a multilayer structure formed by combining two or more layers each including the material mentioned above.

Further, an electron transporting layer 414 may be provided between the second electrode 402 and the light-emitting layer 413 as shown in FIG. 4. Here, an electron transporting layer is a layer that has a function of transporting electrons injected from the second electrode 402 to the light-emitting layer 413. By providing the electron transporting layer 414 to keep the second electrode 402 away from the light-emitting element 413 in this way, quenching of luminescence due to a metal can be prevented.

The electron transporting layer 414 is not particularly limited, and it is possible to use a layer formed with the use of, for example, a metal complex including a quinoline skeleton or a benzoquinoline skeleton such as tris(8-quinolinolato) aluminum (abbreviation: $Alq_3$), tris(4-methyl-8-quinolinolato) aluminum (abbreviation: A $mq_3$), bis(10-hydroxybenzo[h]quinolinato) beryllium (abbreviation: $BeBq_2$), or bis(2-methyl-8-quinolinolato)-4-phenylphenolato-aluminum (abbreviation: BAlq). In addition, a layer formed with the use of, for example, a metal complex including a oxazole-based ligand or a thiazole-based ligand such as bis[2-(2'-hydroxyphenyl)-benzoxazolato]zinc (abbreviation: ZnBOX) or bis [2-(2'-hydroxyphenyl)-benzothiazolato]zinc (abbreviation: $Zn(BTZ)_2$), may be used. Further, a layer formed with the use of 2-(4-biphenylyl)-5-(4-tert-butylphenyl)-1,3,4-oxadiazole (abbreviation: PBD), 1,3-bis[5-(p-tert-butylphenyl)-1,3,4-oxadiazole-2-yl]benzene (abbreviation: to as OXD-7), 3-(4-tert-butylphenyl)-4-phenyl-5-(4-biphenylyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: BPhen), bathocuproin (abbreviation: BCP) or the like may be used.

In addition, the electron transporting layer 414 may be a layer that has a multilayer structure formed by combining two or more layers each including the material mentioned above.

Further, a hole injecting layer 411 may be provided between the first electrode 401 and the hole transporting layer 412 as shown in FIG. 4. Here, a hole injecting layer is a layer that has a function of assisting injection of holes from an electrode to serve as an anode to the hole transporting layer 412. It is to be noted that injection of holes into a light-emitting layer may be assisted by providing a hole injecting layer between an electrode to serve as an anode and the light-emitting layer when no hole transporting layer is particularly provided.

The hole injecting layer 411 is not particularly limited, and it is possible to use a layer formed with the use of, for example, a metal oxide such as molybdenum oxide (MoOx), vanadium oxide (VOx), ruthenium oxide (RuOx), tungsten oxide (WOx), manganese oxide (MnOx). In addition, the hole injecting layer 411 can be formed with the use of a phthalocyanine compound such as phthalocyanine (abbreviation: $H_2Pc$) or copper phthalocyanine (abbreviation: CuPc), a poly(ethylenedioxythiophene)/poly(styrene sulfonate) aqueous solution (PEDOT/PSS), or the like.

Further, an electron injecting layer 415 may be provided between the second electrode 402 and the electron transporting layer 414 as shown in FIG. 4. Here, an electron injecting layer is a layer that has a function of assisting injection of electrons from an electrode to serve as a cathode to the electron transporting layer 414. It is to be noted that injection of electrons into a light-emitting layer may be assisted by providing an electron injecting layer between an electrode to serve as a cathode and the light-emitting layer when no electron transporting layer is particularly provided.

The electron injecting layer 415 is not particularly limited, it is possible to use a layer formed with the use of, for example, a compound of an alkali metal or an alkali-earth metal such as lithium fluoride (LiF), cesium fluoride (CsF), or calcium fluoride ($CaF_2$). In addition, a layer in which a highly electron transporting material such as $Alq_3$ or 4,4-bis(5-methylbenzoxazol-2-yl) stilbene (abbreviation: BzOS) is mixed with an alkali metal or an alkali-earth metal such as magnesium or lithium can also be used as the electron injecting layer 415.

In the above-described light-emitting element according to the present invention, each of the hole injecting layer 411, the hole transporting layer 412, the light-emitting layer 413, the electron transporting layer 414, and the electron injecting layer 415 may be formed by any method, for example, evaporation, inkjet, or coating. In addition, the first electrode 401 and the second electrode 402 may be formed by any method, for example, sputtering or evaporation.

The above-described light-emitting element according to the present invention is capable of providing red luminescence that is excellent in chromaticity since the organometallic complex according to the present invention is used. In addition, the light-emitting element according to the present invention is excellent in luminous efficiency since phosphorescence can be emitted. Further, a light-emitting element including a layer in which an organometallic complex according to the present invention is dispersed in a layer composed of a quinoxaline derivative particularly emits light efficiently.

Embodiment Mode 5

A light-emitting element according to the present invention may have a plurality of light-emitting layers. For example, white light can be obtained by providing a plurality of light-emitting layers and mixing luminescence from respective light-emitting layers. In the present embodiment mode, examples of a light-emitting element that has a plurality of light-emitting layers will be described with reference to FIGS. 5 and 6.

Figure 5:
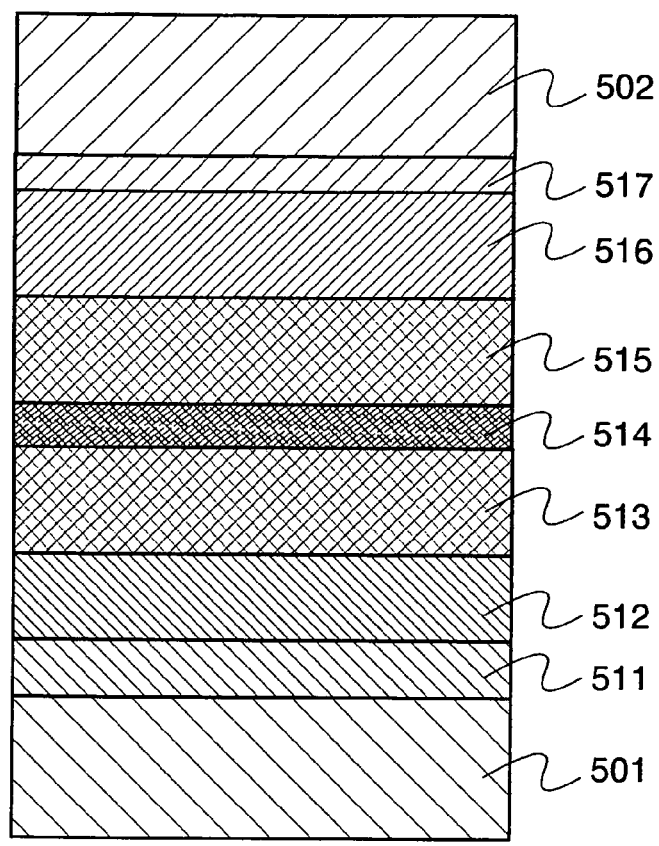
FIG. 5 is a diagram illustrating Embodiment mode 5 of the present invention.

In FIG. 5, a first light-emitting layer 513 and a second light-emitting layer 515 are provided between a first electrode 501 and a second electrode 502. It is preferable to provide a partition layer 514 between the first light-emitting layer 513 and the second light-emitting layer 515.

When a voltage is applied so that the potential of the second electrode 502 is higher than the potential of the first electrode 501, current flows between the first electrode 501 and the second electrode 502, and a hole and an electron are recombined in the first light-emitting layer 513, the second light-emitting layer 515, or the partition layer 514. Generated excitation energy transfers to both the first light-emitting layer 513 and the second light-emitting layer 515 through the partition layer 514, and a first luminescent material included in the first light-emitting layer 513 and a second luminescent material included in the second light-emitting layer 515 are excited. Then, light is emitted when the excited first and second luminescent materials return to the respective ground states.

The first light-emitting layer 513 includes a luminescent material typified by a fluorescent material such as perylene, 2,5,8,11-tetra-tert-butylperylene (TBP), 4,4'-bis(2,2-diphenylvinyl) biphenyl (DPVBi), 4,4'-bis[2-(N-ethylcarbazole-3-yl) vinyl]biphenyl (BCzVBi), bis(2-methyl-8-quinolinolato)-4-phenylphenolato-aluminum (BAlq), or bis(2-methyl-8-quinolinolato)-chlorogallium ($Gamq_2Cl$), or a phosphorescent material such as bis[2-(3',5'-bis(trifluoromethyl)phenyl)pyridinato-N,$C^{2'}$]iridium (III) picolinate (Ir($CF_3$ ppy)$_2$(pic)), bis[2-(4',6'-difluorophenyl)pyridinato-N, $C^{2'}$]iridium (III) acetylacetonate (FIr(acac)), or bis[2-(4',6'-difluorophenyl)pyridinato-N,$C^{2'}$]iridium (III) picolinate (FIr(pic)), from which luminescence with a peak at 450 to 510 nm in an emission spectrum can be obtained.

In addition, the second light-emitting layer 515 includes an organometallic complex according to the present invention to serve as a luminescent material, and luminescence with a peak at 580 to 680 nm in an emission spectrum can be obtained form the second light-emitting layer 515. Then, the luminescent color of luminescence from the first light-emitting layer 513 and the luminescent color of luminescence from the second light-emitting layer 515 are emitted to the outside through one or both of the first electrode 501 and the second electrode 502. Each luminescence emitted to the outside is visually mixed to be visually recognized as white light.

It is preferable that the first light-emitting layer 513 be a layer in which a luminescent material that is capable of providing luminescence of 450 to 510 nm is included to be dispersed in a layer composed of a material (first host) that has a larger energy gap than the luminescent material, or a layer composed of a luminescent material that is capable of providing luminescence of 450 to 510 nm. As the first host, in addition to α-NPD, CBP, TCTA, $Znpp_2$, and ZnBOX mentioned above, 9,10-di(2-naphthyl) anthracene (abbreviation: DNA), 9,10-di(2-naphthyl)-2-tert-butylanthracene (abbreviation: t-BuDNA), and the like can be used. Further, it is preferable that the second light-emitting layer 515 be a layer in which an organometallic complex according to the present invention is included to be dispersed in a layer composed of a material (second host) that has a larger energy gap than the organometallic complex according to the present invention. As the second host, TPAQn, α-NPD, CBP, TCTA, $Znpp_2$, ZnBOX, $Alq_3$, and the like can be used. Further, it is preferable that the partition layer 514 be formed so that energy generated in the first light-emitting layer 513, the second light-emitting layer 515, or the partition layer 514 can transfer to both the first light-emitting layer 513 and the second light-emitting layer 515, and be formed to have a function for preventing energy from transferring only one of the first light-emitting layer 513 and the second light-emitting layer 515. Specifically, the partition layer 514 can be formed with the use of TPAQn, α-NPD, CBP, TCTA, $Znpp_2$, ZnBOX, or the like. As described above, by providing the partition layer 514, it is possible to prevent a problem that stronger emission strength from only one of the first light-emitting layer 513 and the second light-emitting layer 515 makes it impossible to obtain white light.

In the present embodiment mode, the luminescent material included in each of the first light-emitting layer 513 and the second light-emitting layer 515 is not particularly limited. However, as in the present embodiment mode, when an organometallic complex according to the present invention is used for a light-emitting layer (the second electrode 502 in the present embodiment mode) that is closer to an electrode to serve as an anode (the second light-emitting layer 515 in the present embodiment mode), the luminescent material included in each layer is made to emit light more efficiently.

In addition, in the present embodiment mode, the light-emitting layer in which the two light-emitting layers are provided as shown in FIG. 5 is described. However, the number of light-emitting layer is not to be considered limited to two, and for example, three light-emitting layers may be used. Further, luminescence from each light-emitting layer may be combined to be visually recognized as white light.

Furthermore, an electron transporting layer 512 may be provided between the first light-emitting layer 513 and the first electrode 501 as shown in FIG. 5, an electron injecting layer 511 may be provided between the electron transporting layer 512 and the first electrode 501 in addition to the electron transporting layer 512, a hole transporting layer 516 may be provided between the second light-emitting layer 515 and the second electrode 502 as shown in FIG. 5, and a hole injecting layer 517 may be provided between the hole transporting layer 516 and the second electrode 502.

In addition to the light-emitting element described with reference to FIG. 5, a light-emitting element shown in FIG. 6 may be used.

Figure 6:
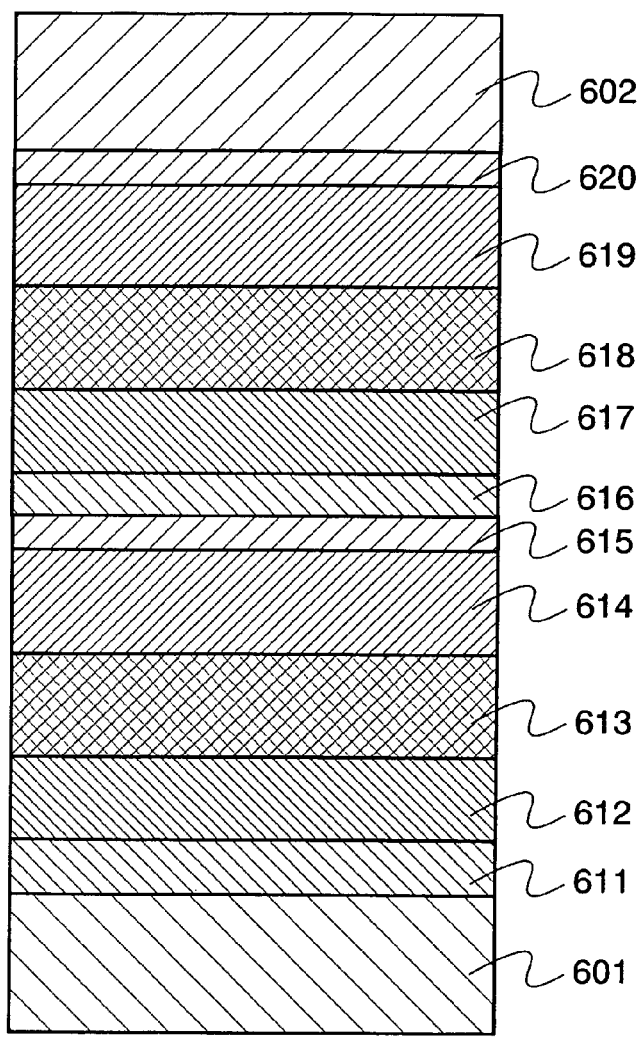
FIG. 6 is a diagram illustrating Embodiment mode 5 of the present invention.

The light-emitting element shown in FIG. 6 has a first light-emitting layer 613 and a second light-emitting layer 618 between a first electrode 601 and a second electrode 602. Between the first light-emitting layer 613 and the second light-emitting layer 618, a first layer 615 and a second layer 616 are provided.

The first layer 615 is a layer that generates holes, and the second layer 616 is a layer that generates electrons. When a voltage is applied so that the potential of the second electrode 602 is higher than the potential of the first electrode 601, an electron injected from the first electrode 601 and a hole injected from the first layer 615 are recombined in the first light-emitting layer 613, and a luminescent material included in the first light-emitting layer 613 emits light. Further, a hole injected from the second electrode 602 and an electron injected from the second layer 616 are recombined in the second light-emitting layer 618, and a luminescent material included in the second light-emitting layer 618 emits light.

In the first light-emitting layer 613, an organometallic complex according to the present invention is included so as to serve as a luminescent material, and luminescence with a peak at 580 to 680 nm in an emission spectrum can be obtained form the first light-emitting layer 613. In addition, the second light-emitting layer 618 includes a luminescent material typified by a fluorescent material such as perylene, TBP, DPVBi, BCzVBi, BAlq, or Gamq$_2$Cl, or a phosphorescent material such as Ir(CF$_3$ ppy)$_2$(Pic), FIr(acac), or FIr(pic), from which luminescence with a peak at 450 to 510 nm in an emission spectrum can be obtained. Luminescence from the first light-emitting layer 613 and the second light-emitting layer 618 is emitted from one or both of the first electrode 601 and the second electrode 602. Then, the luminescence from each light-emitting layer is visually mixed to be visually recognized as white light.

In the first light-emitting layer 613, it is preferable that the organometallic complex according the present invention be included to be dispersed in the second host as described above. It is also preferable that the second light-emitting layer 618 be formed in the same way as the first light-emitting layer 513 described above.

It is preferable that the first layer 615 be a layer in which a highly hole transporting material rather than an electron transporting material includes a material that shows an electron-accepting property to the highly hole transporting material. As the highly hole transporting material, the same material as a material that is used for forming a hole transporting layer may be used. In addition, as the material that shows an electron-accepting property to the highly hole transporting material, molybdenum oxide, vanadium oxide, 7,7,8,8-tetracyanoquinodimethane (abbreviation: TCNQ), 2,3,5,6-tetrafluoro-7,7,8,8-tetracyanoquinodimethane (abbreviation: F4-TCQN), and the like can be used.

It is preferable that the second layer 616 be a layer in which a highly electron transporting material rather than a hole transporting material includes a material that shows an electron-donating property to the highly electron transporting material. As the highly electron transporting material, the same material as a material that is used for forming an electron transporting layer may be used. In addition, as the material that shows an electron-donating property to the highly electron transporting material, alkali metals such as lithium and cesium, alkali-earth metals such as magnesium and calcium, rare-earth metals such as erbium and ytterbium, and the like can be used.

Furthermore, an electron transporting layer 612 may be provided between the first light-emitting layer 613 and the first electrode 601 as shown in FIG. 6, an electron injecting layer 611 may be provided between the electron transporting layer 612 and the first electrode 601, a hole transporting layer 614 may be provided between the first light-emitting layer 613 and the first layer 615, a hole transporting layer 619 may be provided between the second light-emitting layer 618 and the second electrode 602, a hole injecting layer 620 may be provided between the hole transporting layer 619 and the second electrode 602, and an electron transporting layer 617 may be provided between the second light-emitting layer 618 and the second layer 616.

In addition, in the present embodiment mode, the light-emitting layer in which the two light-emitting layers are provided as shown in FIG. 6 is described. However, the number of the light-emitting layer is not to be considered limited to two, and for example, three light-emitting layers may be used. Further, luminescence from each light-emitting layer may be combined to be visually recognized as white light.

Embodiment Mode 6

The example of a light-emitting element using an organometallic complex according to the present invention as a sensitizer will be described with reference to FIG. 7.

Figure 7:
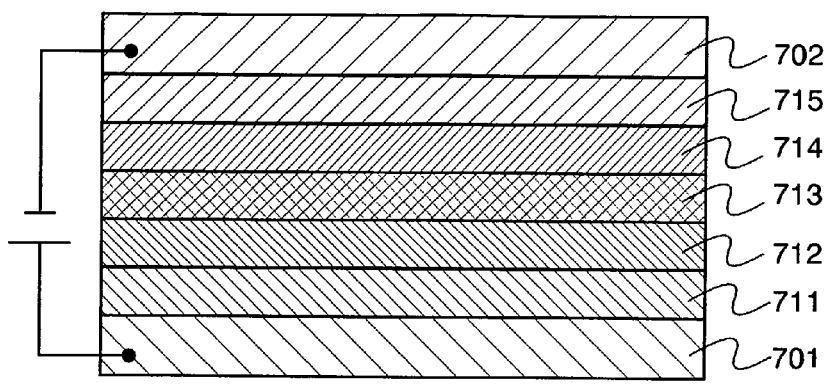
FIG. 7 is a diagram illustrating Embodiment mode 6 of the present invention.

FIG. 7 shows a light-emitting element that has a light-emitting layer 713 between a first electrode 701 and a second electrode 702. The light-emitting layer 713 includes an organometallic complex including a structure represented by any one of the general formulas (1) to (4) according to the present invention or an organometallic complex represented by any one of the general formulas (5) to (8) according to the present invention, and a fluorescent material that is capable of providing luminescence of a longer wavelength than organometallic complex according to the present invention.

In this light-emitting element, a hole injected from the first electrode 701 and an electron injected from the second electrode 702 are recombined in the light-emitting layer 713 to bring the fluorescent material into an excited state. Then, light is emitted when the fluorescent material in the excited state returns to the ground state. In this case, the organometallic complex acts as a sensitizer for the fluorescent material to increase the number of singlet excited states of the fluorescent material. As described above, a light-emitting element that is excellent in luminous efficiency can be obtained by using an organometallic complex according to the present invention as a sensitizer. It is to be noted that the first electrode 701 and the second electrode 702 respectively serve as an anode and a cathode in the light-emitting element in the present embodiment mode.

Here, the light-emitting layer 713 is not particularly limited. However, it is preferable that the light-emitting layer 713 be a layer in which the organometallic complex according to the present invention and the fluorescent material are included so as to be dispersed in a layer composed of a material that has a larger energy gap than the organometallic complex has. This makes it possible to prevent quenching of luminescence from the organometallic complex according to the present invention due to the concentration. It is to be noted that an energy gap indicates an energy gap between a LUMO level and a HOMO level.

Here, although the fluorescent material is not particularly limited, compounds that show red to infrared luminescence such as magnesium phthalocyanine and phthalocyanine are preferable.

In addition, the material to be used for dispersing the organometallic complex according to the present invention and the fluorescent material is not particularly limited, and the materials that can be used for dispersing the organometallic complex according to the present invention, which are described in Embodiment mode 3, and the like can be used.

In addition, the first electrode 701 or the second electrode 702 is not particularly limited, and the same materials as those for the first electrode 401 and second electrode 402 described in Embodiment mode 4, can be used.

Furthermore, a hole injecting layer 711, a hole transporting layer 712, and the like may be provided between the first electrode 701 and the light-emitting layer 713 as shown in FIG. 7, and an electron transporting layer 714, an electron injecting layer 715, and the like may be provided also between the second electrode 702 and the light-emitting layer 713.

For the hole injecting layer 711, the hole transporting layer 712, the electron transporting layer 714, and the electron injecting layer 715, the same materials as those for the hole injecting layer 411, the hole transporting layer 412, the electron transporting layer 414, and the electron injecting layer 415 described in Embodiment mode 4, can be used, respectively. In addition, another functional layer that has a different function from the hole injecting layer 711, the hole transporting layer 712, the electron transporting layer 714, and the electron injecting layer 715 may be provided.

The light-emitting element described above can be obtained by using an organometallic complex according to the present invention as a sensitizer.

Embodiment Mode 7

Since a light-emitting element including an organometallic complex according to the present invention shows a favorable luminescent color, a light-emitting device that has a function of displaying favorable images in terms of color can be obtained by using the light-emitting element according to the present invention for a pixel. Further, since the light-emitting element according to the present invention is capable of emitting light efficiently, a light-emitting device with low power consumption can be obtained by using the light-emitting element according to the present invention for a pixel or the like.

In the present embodiment mode, a circuit configuration and driving method of a light-emitting device that has a display function will be described with reference to FIGS. 8 to 11.

Figure 8:
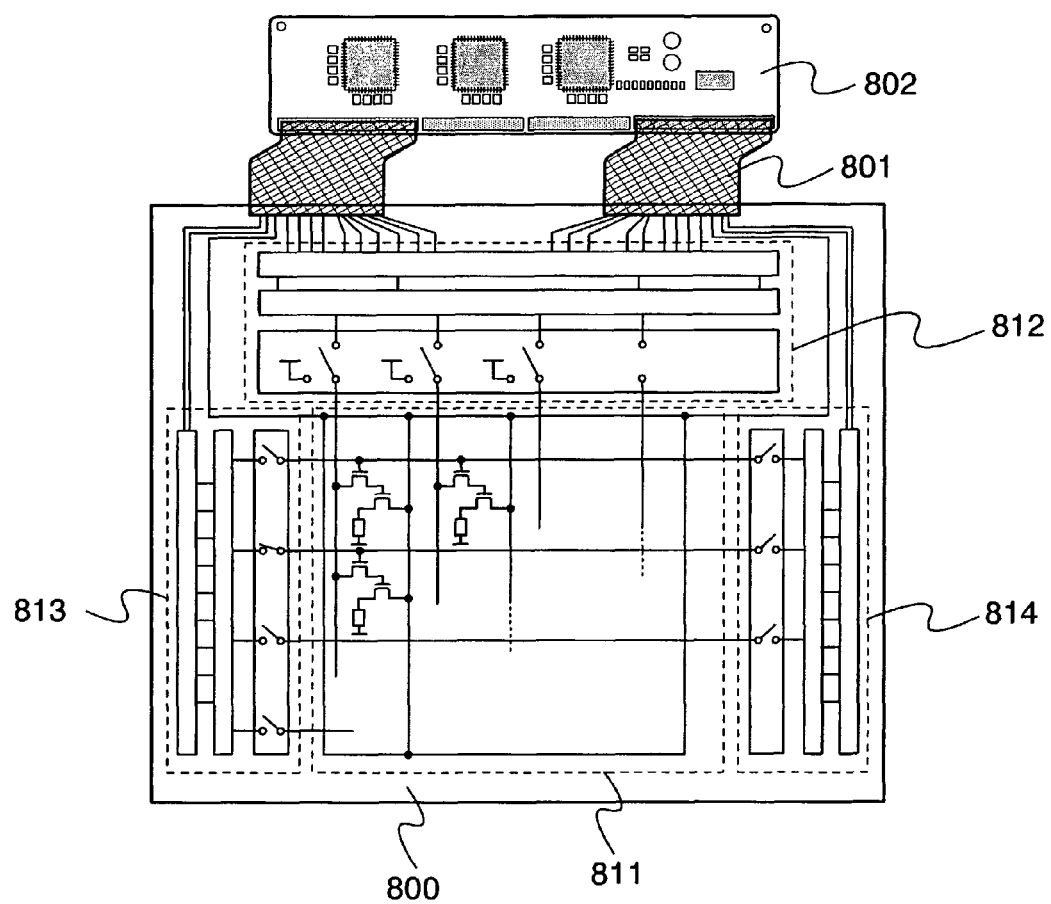
FIG. 8 is a diagram illustrating Embodiment mode 7 of the present invention.

FIG. 8 is an overhead schematic view of a light-emitting device to which the present invention is applied. In FIG. 8, a pixel portion 811, a source signal line driver circuit 812, a writing gate signal line driver circuit 813, and an erasing gate signal line driver circuit 814 are provided on a substrate 800. Each of the source signal line driver circuit 812, the writing gate signal line driver circuit 813, and the erasing gate signal line driver circuit 814 is connected to FPC (Flexible Printed Circuit) 801 that is an external input-terminal through a group of wirings. Further, each of the source signal line driver circuit 812, the writing gate signal line driver circuit 813, and the erasing gate signal line driver circuit 814 receives signals such as a clock signal, a start signal, and a reset signal from the FPC 801. In addition, a printed wiring board (PWB) 802 is attached to the FPC 801. It is to be noted that it is not always necessary to provide the driver circuit portion on the same substrate on which the pixel portion 811 is provided as described above. For example, the driver circuit portion may be provided outside the substrate by using a TCP that has an IC chip on an FPC on which a wiring pattern is formed.

In the pixel portion 811, a plurality of source signal lines extending in columns is arranged in rows, current supply lines are arranged to line in rows, and a plurality of gate signal lines extending in rows is arranged to line in columns. Further, in the pixel portion 811, a plurality of circuits each including a light-emitting element is arranged.

Figure 9:
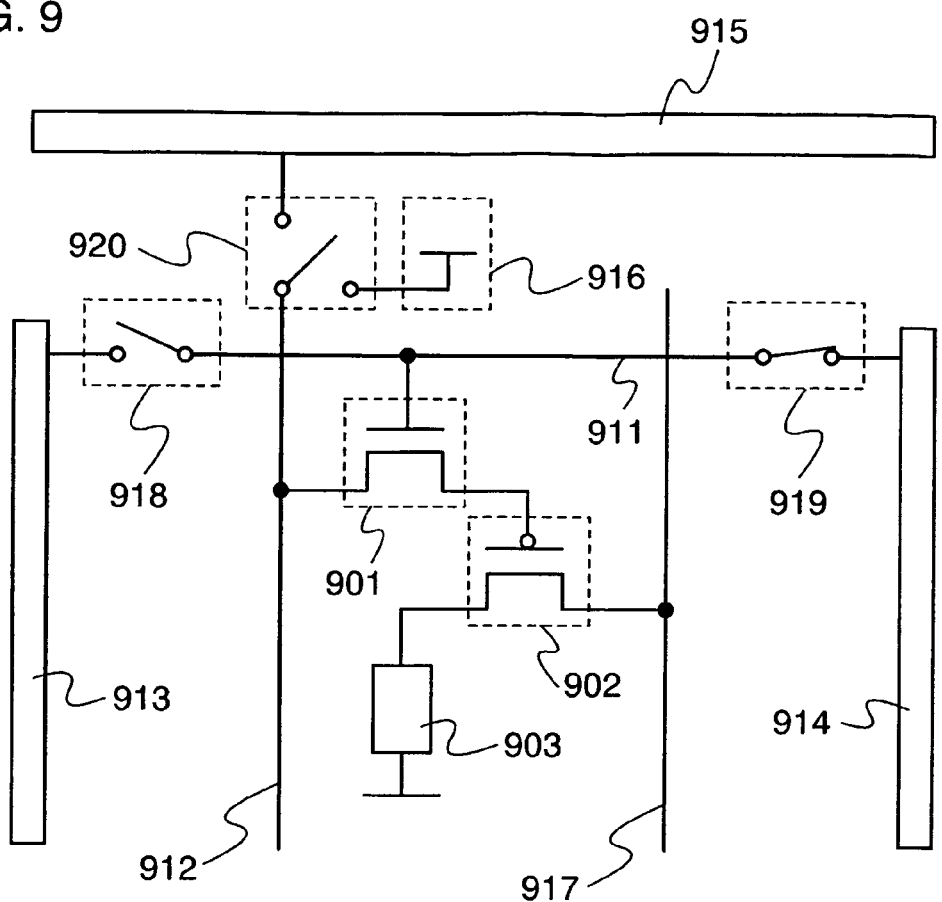
FIG. 9 is a diagram illustrating Embodiment mode 7 of the present invention.

FIG. 9 is a diagram showing a circuit for operating one pixel. The circuit shown in FIG. 9 includes a first transistor 901, a second transistor 902, and a light-emitting element 903.

Each of the first transistor 901 and the second transistor 902 is a three-terminal element including a gate electrode, a drain region, and a source region, and including a channel region between the drain region and the source region. Here, since a source region and a drain region are switched with each other in accordance with a structure or operating conditions of a transistor, it is difficult to identify which one is the drain region or the source region. Consequently, regions that serve as a source or a drain are referred to as first and second electrodes in the present embodiment mode.

A gate signal line 911 and a writing gate signal line driver circuit 913 are provided so as to be electrically connected or unconnected by a switch 918, the gate signal line 911 and an erasing gate signal line driver circuit 914 are provided so as to be electrically connected or unconnected by a switch 919, and a source signal line 912 is provided so as to be electrically connected to any one of a source signal line driver circuit 915 and a power source 916 by a switch 920. Further, the first transistor 901 has a gate electrically connected to the gate signal line 911, a first electrode electrically connected to the source signal line 912, and a second electrode electrically connected to a gate electrode of the second transistor 902. The second transistor 902 has a first electrode electrically connected to a current supply line 917 and a second electrode electrically connected to one electrode included in the light-emitting element 903. It is to be noted that the switch 918 may be included in the writing gate signal line driver circuit 913, the switch 919 may be included in the erasing gate signal line driver circuit 914, and the switch 920 may be included in the source signal line driver circuit 915.

Figure 10:
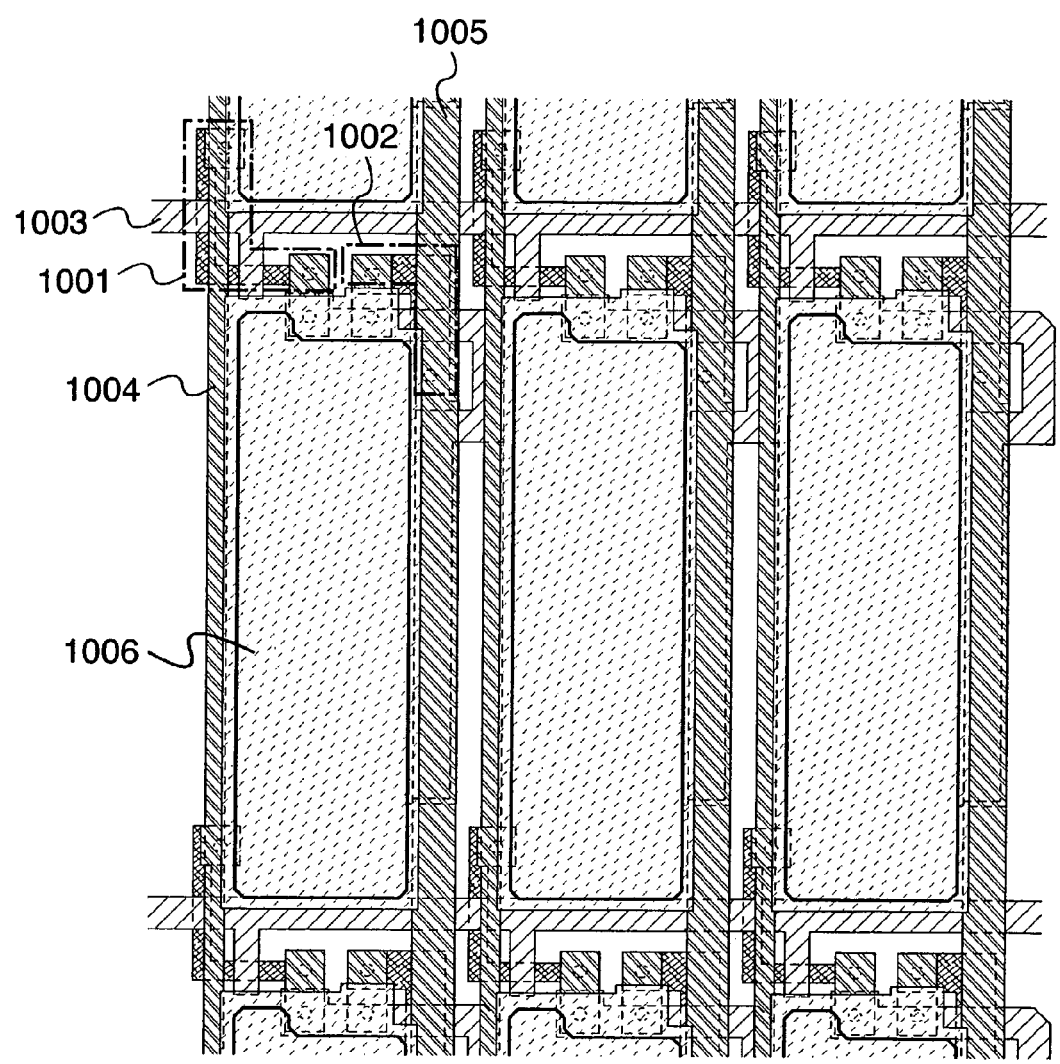
FIG. 10 is a diagram illustrating Embodiment mode 7 of the present invention.

In addition, arrangement of a transistor, a light-emitting element, and the like is not particularly limited. For example, arrangement shown in a top view of FIG. 10 can be employed. In FIG. 10, a first transistor 1001 has a first electrode connected to a source signal line 1004 and a second electrode connected to a gate electrode of a second transistor 1002. Further, the second transistor 1002 has a first electrode connected to a current supply line 1005 and a second electrode connected an electrode 1006 of a light-emitting element. A portion of a gate signal line 1003 serves as a gate electrode of the first transistor 1001.

Figure 11:
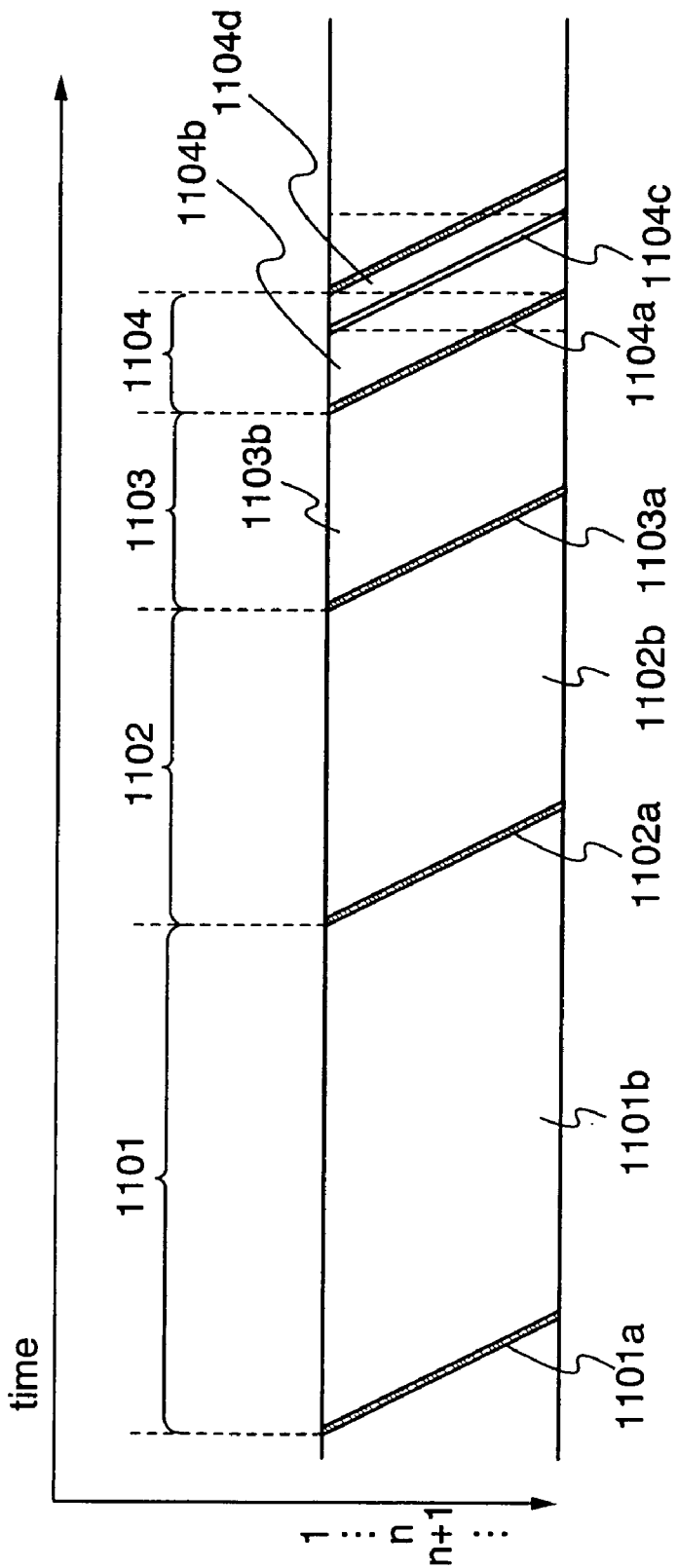
FIG. 11 is a diagram illustrating Embodiment mode 7 of the present invention.

Next, a driving method will be described. FIG. 11 is a diagram illustrating operation per frame with time. In FIG. 11, the lateral direction indicates passage of time, and the vertical direction indicates ordinal numbers of gate signal lines.

When a light-emitting device according to the present invention is used to display images, rewrite operation and image display operation for a screen are repeated in a display period. Although the number of rewrites is not particularly limited, it is preferable that the number of rewrites be about 60 times per second so as not to make an image viewer recognize flickers. Here, a period for which rewrite operation and display operation are performed for a screen (one frame) is referred to as one frame period.

As shown in FIG. 11, one frame is divided into four sub-frames 1101, 1102, 1103, and 1104 respectively including writing periods 1101*a*, 1102*a*, 1103*a*, and 1104*a* and retention periods 1101*b*, 1102*b*, 1103*b*, and 1104*b*. In the retention period, a light-emitting element to which a signal for emitting light is given is made to be in an emitting state. The ratio of the length of the retention period in each sub-frame is first sub-frame 1101: second sub-frame 1102: third sub-frame 1103: fourth sub-frame 1104=$2^3:2^2:2^1:2^0$=8:4:2:1. This makes 4-bit gradation possible. However, the number of bits or the number of gradations is not limited to that described here. For example, eight sub-frames may be provided so as to perform 8-bit gradation.

Operation in one frame will be described. First, in the sub-frame 1101, writing operation is sequentially performed for each of the first row to the last row. Accordingly, the start time of the writing period 1101*a* is different depending on the row. When the writing period 1101*a* is completed, the row is sequentially moved into the retention period 1101*b*. In the retention period 1101*b*, a light-emitting element to which a signal for emitting light is given is made to be in an emitting state. Further, when the retention period 1101*b* is completed, the row is sequentially moved into the next sub-frame 1102, and writing operation is sequentially performed for each of the first row to the last row as in the case of the sub-frame 1101. The operation described above is repeated to complete the retention period 1104*b* of the sub-frame 1104. When the operation in the sub-frame 1104 is completed, the row is moved into the next frame. Thus, the total of time for which light is emitted in each sub-frame is emission time for each light-emitting element in one frame. By varying this emission time with respect to each light-emitting element to have various combinations in one pixel, various different display colors in luminosity and chromaticity can be made.

As in the sub-frame 1104, when forcible termination of a retention period of a row for which writing is already completed to move into the retention time is required before writing for the last row is completed, it is preferable that an erasing period 1104*c* be provided after the retention period 1104*b* and a row be controlled so as to be in a non-emitting state forcibly. Further, the row made to be in the non-emitting state forcibly is kept the non-emitting state for a certain period (this period is referred to as a non-emission period 1104*d*). Then, immediately after the writing period 1104*a* of the last row is completed, the rows are sequentially moved into the next writing period (or the next frame), starting from the first row. This makes it possible to prevent the writing period 1104*a* of the sub-frame 1104 from overlapping with the writing period of the next sub-frame.

One horizontal period is divided into two periods, a selection period for inputting an erasing signal to a row and a selection period for inputting image signals to another row, and the signal to be input to the source signal line 912 is switched in accordance with each selection period. According to such an operation method, the retention period 1104*b* can be made shorter than the time required for writing to all the rows by providing the non-emission period 1104*d*.

Although the sub-frames 1101 to 1104 are arranged in the order of retention period from longest to shortest in the present embodiment mode, the arrangement as in the present embodiment mode is not always necessary. For example, the sub-frames 1101 to 1104 may be arranged in the order of retention period from shortest to longest, or may be arranged in random order. In addition, the sub-frames may be divided further into a plurality of frames. Namely, scanning of the gate signal lines may be performed more than once while giving the same image signal.

Now, operation of the circuit shown in FIG. 9 in a writing period and an erasing period will be described.

First, operation in a writing period will be described. In the writing period, the n-th (n is a natural number) gate signal line 911 is electrically connected to the writing gate signal line driver circuit 913 through the switch 918, and unconnected to the erasing gate signal line driver circuit 914. In addition, the source signal line 912 is electrically connected to the source signal line driver circuit 915 through the switch 920. In this case, a signal is input to the gate of the first transistor 901 connected to the n-th (n is a natural number) gate signal line 911 to turn on the first transistor 901. Then, at this moment, image signals are input simultaneously to the first to last source signal lines 912. It is to be noted that the image signals input from the respective source signal lines 912 are independent of each other. The image signal input from each of the source signal lines 912 is input to the gate electrode of the second transistor 902 through the first transistor 901 connected to the source signal line 912. At this moment, switching of the second transistor 902 is controlled in accordance with the signal input to the second transistor 902. Therefore, depending on the signal input to the gate electrode of the second transistor 902, whether the light-emitting element 903 emits light or not is determined. For example, when the second transistor 902 is a p-channel transistor, the light-emitting element 903 is made to emit light by inputting a Low Level signal to the gate electrode of the second transistor 902. On the other hand, when the second transistor 902 is an n-channel transistor, the light-emitting element 903 is made to emit light by inputting a High Level signal to the gate electrode of the second transistor 902.

Next, operation in an erasing period will be described. In the erasing period, the n-th (n is a natural number) gate signal line 911 is electrically connected to the erasing gate signal line driver circuit 914 through the switch 919 and unconnected to the wiring gate signal line driver circuit 913. In addition, the source signal line 912 is electrically connected to the power source 916 through the switch 920. In this case, a signal is input to the gate of the first transistor 901 connected to the n-th (n is a natural number) gate signal line 911 to turn on the first transistor 901. Then, at this moment, erasing signals are input simultaneously to the first to last source signal lines 912. The erasing signal input from each of the source signal lines 912 is input to the gate electrode of the second transistor 902 through the first transistor 901 connected to the source signal line 912. At this moment, current supply from the current supply line 917 to the light-emitting element 903 is blocked in accordance with the signal input to the second transistor 902. Then, the light-emitting element 903 is forcibly made to be in a non-emitting state. For example, when the second transistor 902 is a p-channel transistor, the light-emitting element 903 is made to emit no light by inputting a High Level signal to the gate electrode of the second transistor 902. On the other hand, when the second transistor 902 is an n-channel transistor, the light-emitting element 903 is made to emit no light by inputting a Low Level signal to the gate electrode of the second transistor 902.

It is to be noted that, as for the n-th row (n is a natural number), signals for erasing are input by the operation as described above in an erasing period. However, as described above, the other row (referred to as the m-th row (m is a natural number)) may be in a writing period while the n-th row is in an erasing period. In such a case, it is necessary to input a signal for erasing to the n-th row and input a signal for writing to the m-th row by using the same source signal line. Therefore, operation described below is preferable.

Immediately after the n-th light-emitting element 903 is made to emit no light by the operation in the erasing period described above, the gate signal line 911 and the erasing gate signal line driver circuit 914 are made to be unconnected to each other, and the switch 920 is switched to connect the source signal line 912 and the source signal line driver circuit 915. Then, in addition to connecting the source signal line 912 to the source signal line driver circuit 915, the gate signal line 911 is connected to the writing gate signal line driver circuit 913. Then, a signal is input selectively to the m-th gate signal line 911 from the writing gate signal line driver circuit 913 to turn on the first transistor 901, and signals for writing are input to the first to last source signal lines 912 from the source signal line driver circuit 915. This signal makes the m-th light-emitting element 903 is made to be in an emitting or non-emitting state.

Immediately after the writing period for the m-th row is completed as described above, an erasing period for the (n+1)-th row is started. For that purpose, the gate signal line 911 and the writing gate signal line driver circuit 913 are made to be unconnected to each other, and the switch 920 is switched to connect the source signal line 912 and the power source 916. Further, the gate signal line 911, which is unconnected to the writing gate signal line driver circuit 913, is made to be connected to the erasing gate signal line driver circuit 914. Then, a signal is input selectively to the (n+1)-th gate signal line 911 from the erasing gate signal line driver circuit 914 to turn on the first transistor 901, and an erasing signal is input from the power source 916. Immediately after the erasing period for the (n+1)-th row is completed, a writing period for the (m+1)-th row is started. Then, an erasing period and a writing period may be repeated in the same way until an erasing period for the last row is completed.

Although the example in which the writing period for the m-th row is provided between the erasing period for the n-th row and the erasing period for the (n+1)-th row is described in the present embodiment mode, the present invention is not limited to this. The writing period for the m-th row may be provided between an erasing period for (n−1)-th row and an erasing period for n-th row.

In addition, in the present embodiment mode, the operation in which the erasing gate signal line driver circuit 914 and one gate signal line 911 are made to be unconnected to each other and the writing gate signal line driver circuit 913 and the other gate signal line 911 are made to be connected to each other is repeated as the non-emission period 1104*d* is provided in the sub-frame 1104. This type of operation may be performed in a sub-frame in which a non-emission period is not particularly provided.

Embodiment Mode 8

One example of cross sections of a light-emitting device including a light-emitting element according to the present invention will be described with reference to FIGS. 12A to 12C.

Figure 12A:
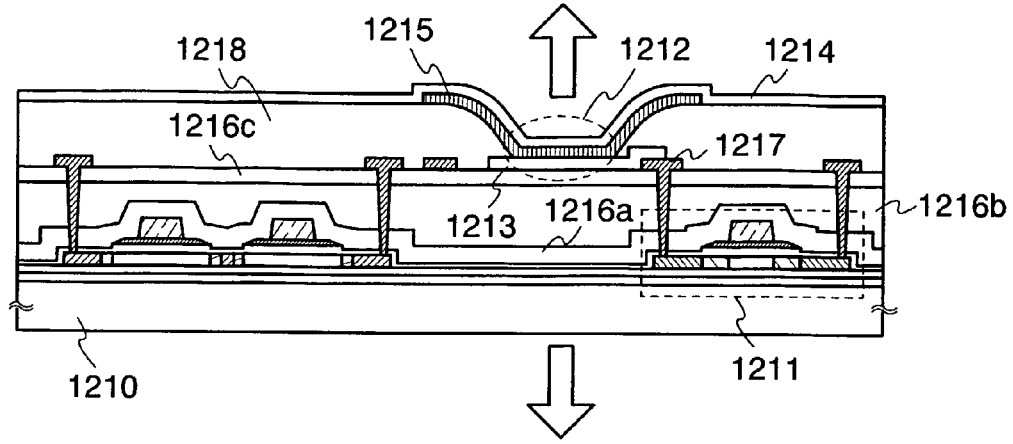
FIGS. 12A to 12C are diagrams illustrating Embodiment mode 8 of the present invention.
Figure 12B:
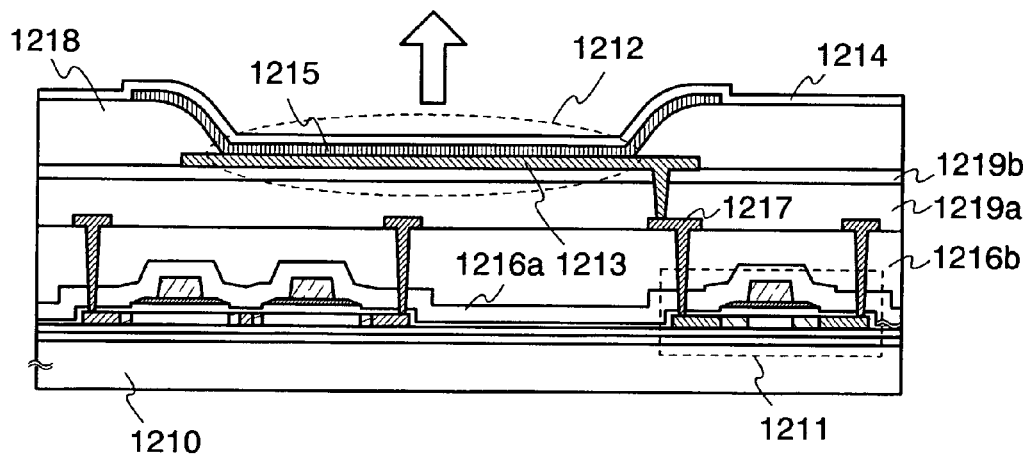
Figure 12C:
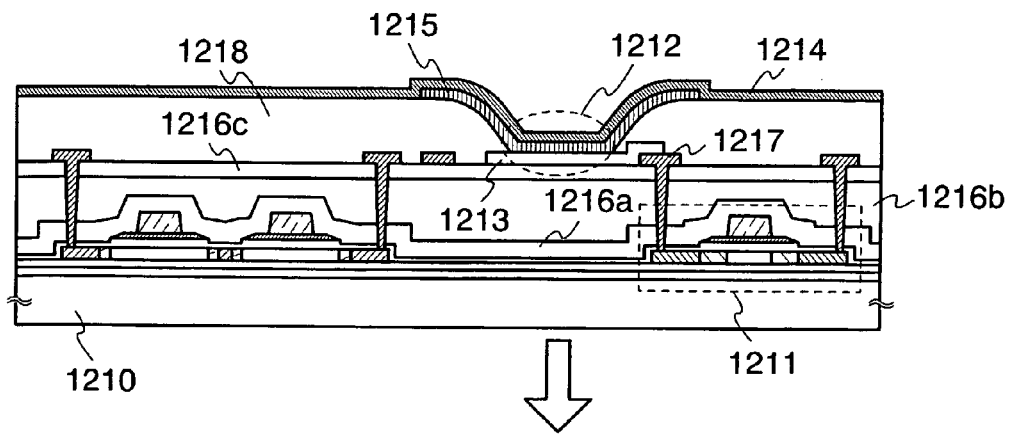

In each of FIGS. 12A to 12C, a portion surrounded by a dotted line is a transistor 1211 provided for driving a light-emitting element 1212 according to the present invention. The light-emitting element 1212 is a light-emitting element according to the present invention, which has a layer 1215 in which a hole generation layer, an electron generation layer, and a layer including a luminescent material are stacked between a first electrode 1213 and a second electrode 1214. The first electrode 1213 and a drain of the transistor 1211 are electrically connected to each other by a wiring 1217 running through a first interlayer insulating film 1216 (1216*a* to 1216*c*). In addition, the light-emitting element 1212 is separated by a partition layer 1218 from another light-emitting element provided adjacently. A light-emitting device that has this structure according to the present invention is provided over substrate 1210.

It is to be noted that the transistor 1211 shown in each of FIGS. 12A to 12C is a top-gate TFT in which a gate electrode is provided on the opposite side of a semiconductor layer as a center from a substrate. However, the structure of the transistor 1211 is not particularly limited. For example, a bottom-gate TFT may be used. In the case of a bottom-gate TFT, a TFT where a protective film is formed on a semiconductor layer that forms a channel (a channel-protection TFT) may be used, or a TFT where a portion of a semiconductor layer that forms a channel is concave (a channel-etch TFT) may be used.

In addition, a semiconductor layer forming the transistor 1211 may be either crystalline or amorphous, or alternatively, may be semi-amorphous.

The following will describe a semi-amorphous semiconductor. The semi-amorphous semiconductor is a semiconductor that has an intermediate structure between amorphous and crystalline (such as single-crystal or polycrystalline) structures and has a third state that is stable in terms of free energy, which includes a crystalline region that has short range order and lattice distortion. Further, a crystal grain from 0.5 to 20 nm is included in at least a region in a film of the semi-amorphous semiconductor. A raman spectrum of the semi-amorphous semiconductor has a shift to a lower wavenumber side than 520 cm$^{-1}$. In X-ray diffraction, diffraction peaks of (111) and (220) due to a Si crystal lattice are observed. Hydrogen or halogen is included at 1 atomic % or more in the semi-amorphous semiconductor to terminate a dangling bond. Therefore, the semi-amorphous semiconductor is also referred to as a micro-crystalline semiconductor. A silicide gas is decomposed by glow discharge (plasma CVD) to form the semi-amorphous semiconductor. As the silicide gas, in addition to $SiH_4$, a gas such as $Si_2H_6$, $SiH_2Cl_2$, $SiHCl_3$, $SiCl_4$, or $SiF_4$ can be used. This silicide gas may be diluted with $H_2$ or with $H_2$ and one kind or plural kinds of rare gas elements selected from He, Ar, Kr, and Ne, where the dilution ratio is in the range of 2:1 to 1000:1. The pressure during glow discharge is approximately in the range of 0.1 Pa to 133 Pa, and the power supply frequency is in the range of 1 MHz to 120 MHz, preferably 13 MHz to 60 MHz. The substrate heating temperature may be 300° C. or less, preferably 100 to 250° C. It is desirable to control an impurity of an atmospheric constituent such as oxygen, nitrogen, or carbon to have a concentration of $1\times10^{20}/cm^3$ or less as an impurity element in the film, in particular, the oxygen concentration is controlled to be $5\times10^{19}/cm^3$ or less, preferably $1\times10^{19}/cm^3$ or less. Further, a TFT (thin film transistor) using the semi-amorphous semiconductor has a mobility of approximately 1 to 10 $m^2/Vsec$.

Further, specific examples of crystalline semiconductors for the semiconductor layer include single-crystal or polycrystalline silicon and silicon-germanium, which may be formed by laser crystallization or may be formed by crystallization with solid-phase growth using an element such as nickel.

In the case of using an amorphous material, for example, amorphous silicon to form the semiconductor layer, it is preferable that the light-emitting device have a circuit in which the transistor 1211 and the other transistor (a transistor forming the circuit for driving the light-emitting element) are all n-channel transistors. Other than that case, the light-emitting device may have a circuit including one of an n-channel transistor and a p-channel transistor or may have a circuit including both an n-channel transistor and a p-channel transistor.

Further, the first interlayer insulating film 1216 may be a multilayer as shown in FIGS. 12A and 12C, or may be a single layer. The first interlayer insulating film 1216*a* includes an inorganic material such as silicon oxide or silicon nitride, and the first interlayer insulating film 1216*b* includes a material with self-flatness such as acrylic, siloxane or silicon oxide that can be used in coating deposition. It is to be noted that siloxane has a framework structure formed by the bond between silicon (Si) and oxygen (O), in which an organic group (for example, an alkyl group or an aromatic hydrocarbon group) including at least hydrogen is used as a substituent. As a substituent, a fluoro group may be used, or an organic group including at least hydrogen and a fluoro group may be used as substituents. In addition, the first interlayer insulating film 1216*c* has a silicon nitride film including argon (Ar). The materials included in the respective layers are not particularly limited, and therefore materials other than the materials mentioned here may be used. Further, a layer including a material other than these materials may be combined. In this way, both of an inorganic material and an organic material, or one of an inorganic material and an organic material may be used to form the first interlayer insulating film 1216.

As for the partition layer 1218, it is preferable that an edge portion have a shape varying continuously in curvature radius. In addition, a material such as acrylic, siloxane, resist, or silicon oxide is used to form the partition layer 1218. One or both of an inorganic material and an organic material may be used to form the partition layer 1218.

In each of FIGS. 12A and 12C, only the first interlayer insulating film 1216 is provided between the transistor 1211 and the light-emitting element 1212. However, as shown in FIG. 12B, a second interlayer insulating film 1219 (1219*a* and 1219*b*) may be provided in addition to the first interlayer insulating film 1216 (1216*a* and 1216*b*). In the light-emitting device shown in FIG. 12B, the first electrode 1213 is connected to the wiring 1217 through the second interlayer insulating film 1219.

The second interlayer insulating film 1219 may be a multilayer or a single layer in the same way as the first interlayer insulating film 1216. The second interlayer insulating film 1219*a* includes a material with self-flatness such as acrylic, siloxane, or silicon oxide that can be used in coating deposition. It is to be noted that siloxane has a framework structure formed by the bond between silicon (Si) and oxygen (O), in which an organic group (for example, an alkyl group or an aromatic hydrocarbon group) including at least hydrogen is used as a substituent. As a substituent, a fluoro group may be used, or an organic group including at least hydrogen and a fluoro group may be used as substituents. In addition, the second interlayer insulating film 1219*b* has a silicon nitride film including argon (Ar). The materials included in the respective layers are not particularly limited, and therefore materials other than the materials mentioned here may be used. Further, a layer including a material other than these materials may be combined. In this way, both of an inorganic material and an organic material, or one of an inorganic material and an organic material may be used to form the second interlayer insulating film 1219.

In the light-emitting element 1212, in the case where both the first electrode 1213 and the second electrode 1214 are formed by using a light-transmitting material, emitted light can be extracted from both the first electrode 1213 side and the second electrode 1214 side as indicated by outline arrows of FIG. 12A. In the case where only the second electrode 1214 is formed by using a light-transmitting material, emitted light can be extracted from only the second electrode 1214 side as indicated by an outline arrow of FIG. 12B. In this case, it is preferable that the first electrode 1213 include a highly reflective material or that a film composed of a highly reflective material (a reflective film) be provided below the first electrode 1213. In the case where only the first electrode 1213 is formed by using a light-transmitting material, emitted light can be extracted from only the first electrode 1213 side as indicated by an outline arrow of FIG. 12C. In this case, it is preferable that the second electrode 1214 include a highly reflective material or that a reflective film be provided above the second electrode 1214.

In addition, the layer 1215 may be stacked so that the light-emitting element 1212 operates when a voltage is applied so that the potential of the second electrode 1214 is higher than the potential of the first electrode 1213, or the layer 1215 may be stacked so that the light-emitting element 1212 operates when a voltage is applied so that the potential of the second electrode 1214 is lower than the potential of the first electrode 1213. The transistor 1211 is an n-channel transistor in the former case, and the transistor 1211 is a p-channel transistor in the latter case.

As described above, an active light-emitting device in which driving of a light-emitting element is controlled by a transistor is described in the present embodiment mode. However, in addition, the present invention may be applied to a passive light-emitting device in which a light-emitting element is driven without providing an element for driving such as a transistor. Also in the case of a passive light-emitting device, driving with low power consumption is possible when the passive light-emitting device includes a light-emitting element according to the present invention, which operates at a lower driving voltage.

EMBODIMENTS

Base on the embodiment mode, the present invention will be described in more detail below. However, as a matter of course, the present invention is not limited to these embodiments. First, synthesis examples of organometallic complexes for light-emitting elements according to the present invention and properties of the organometallic complexes will be described, and then, the structures of light-emitting elements according to the present invention and manufacturing methods thereof, and an example of a light-emitting device will be described.

Embodiment 1

Synthesis Example of Organometallic Complex and Properties thereof

Synthesis Example 1

The present synthesis example is a synthesis example of {2,3-bis(4-fluorophenyl) quinoxalinato}(acetylacetonato) iridium (III) (abbreviation: Ir(Fdpq)$_2$(acac)) represented by the formula (16).

<Step 1: Synthesis of Ligand (HFdpq)>

First, 3.71 g of 4,4'-difluorobenzil and 1.71 g of o-phenylenediamine were stirred on heating in a solvent (200 mL of chloroform) for 6 hours. The reaction solution was cooled to room temperature, washed with HCl (1N) and a saturated aqueous solution of sodium chloride, and dried with magnesium sulfate. The solvent was removed to obtain a ligand HFdpq (2,3-bis(4-fluorophenyl) quinoxaline) (pale yellow powder, yield: 99%).

The synthesis scheme and the structure formula of the ligand HFdpq are shown by the following formula (60).

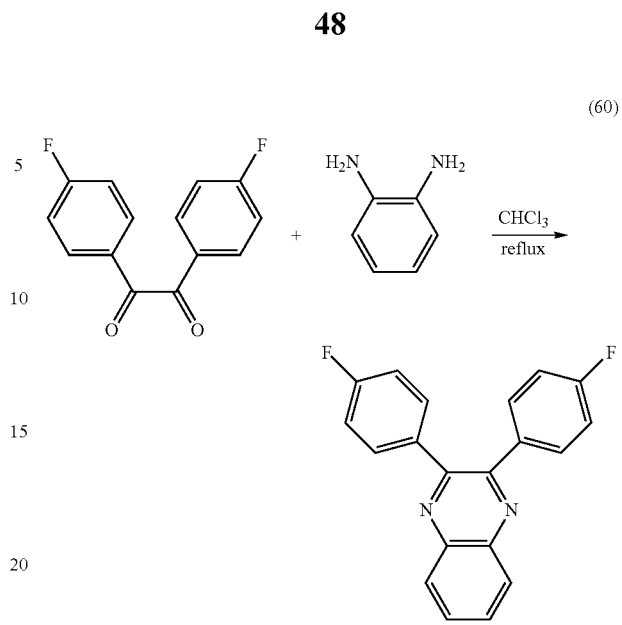

(60)

<Step 2: Synthesis of Dinuclear Complex [Ir(Fdpq)$_2$Cl]$_2$>

With a mixture of 30 mL of 2-ethoxyethanol and 10 mL of water as a solvent, 3.61 g of the ligand HFdpq (2,3-bis(4-fluorophenyl) quinoxaline) and 1.35 g of iridium chloride (IrCl$_3$.HCl.H$_2$O) were mixed, and held at reflux in a nitrogen atmosphere for 17 hours to obtain a dinuclear complex [Ir(Fdpq)$_2$Cl]$_2$ (brown powder, yield: 99%).

The synthesis scheme and the structure formula of the dinuclear complex [Ir(Fdpq)$_2$Cl]$_2$ are shown by the following formula (61).

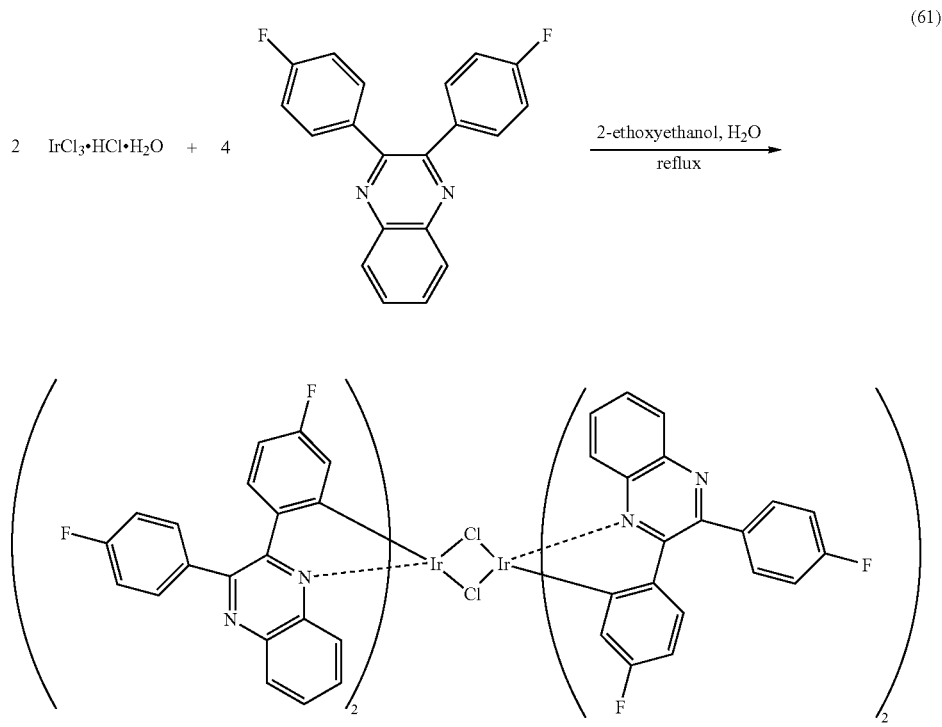

(61)

<Step 3: Synthesis of Organometallic Complex Ir(Fdpq)$_2$(acac) for Light-Emitting Element According to the Present Invention>

Further, with 30 mL of 2-ethoxyethanol as a solvent, 2.00 g of the dinuclear complex [Ir(Fdpq)$_2$Cl]$_2$ obtained in Step 2 described above, 0.44 mL of acetylacetone (Hacac), and 1.23 g of sodium carbonate were mixed, and held at reflux in a nitrogen atmosphere for 20 hours to obtain an organometallic complex Ir(Fdpq)$_2$(acac) represented by the formula (16) according to the present invention (red powder, yield: 44%).

The synthesis scheme is shown by the following formula (62).

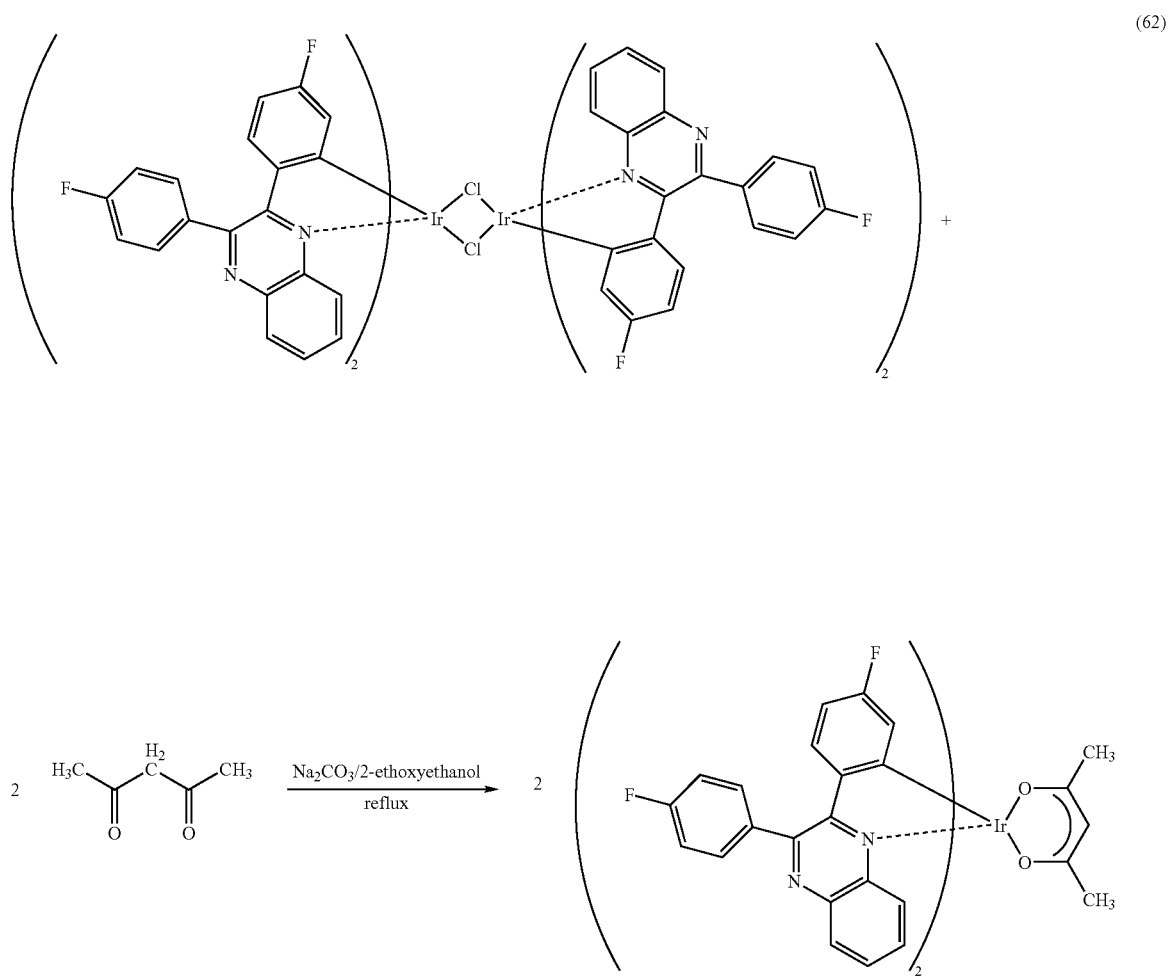

The result of analysis of the organometallic complex Ir(Fdpq)$_2$(acac) by nuclear magnetic resonance ($^1$H-NMR) is as follows.

$^1$H-NMR. δ (CDCl$_3$): 8.20 (d, 2H), 8.11 (d, 2H), 8.01 (brs, 4H), 7.68 (t, 2H), 7.52 (t, 2H), 7.32 (brm, 4H), 7.08 (m, 2H), 6.39 (td, 2H), 6.05 (dd, 2H), 4.71 (s, 1H), 1.62 (s, 6H)

In addition, measurement of the thermal decomposition temperature T$_d$ of the obtained Ir(Fdpq)$_2$(acac) was performed by a Thermogravimetry/Differential Thermal Analysis simultaneous measurement system (from Seiko Instruments Inc., TG/DTA-320) to find T$_d$=365° C., and thus, it is determined that the organometallic complex Ir(Fdpq)$_2$(acac) shows favorable heat resistance.

Figure 13:
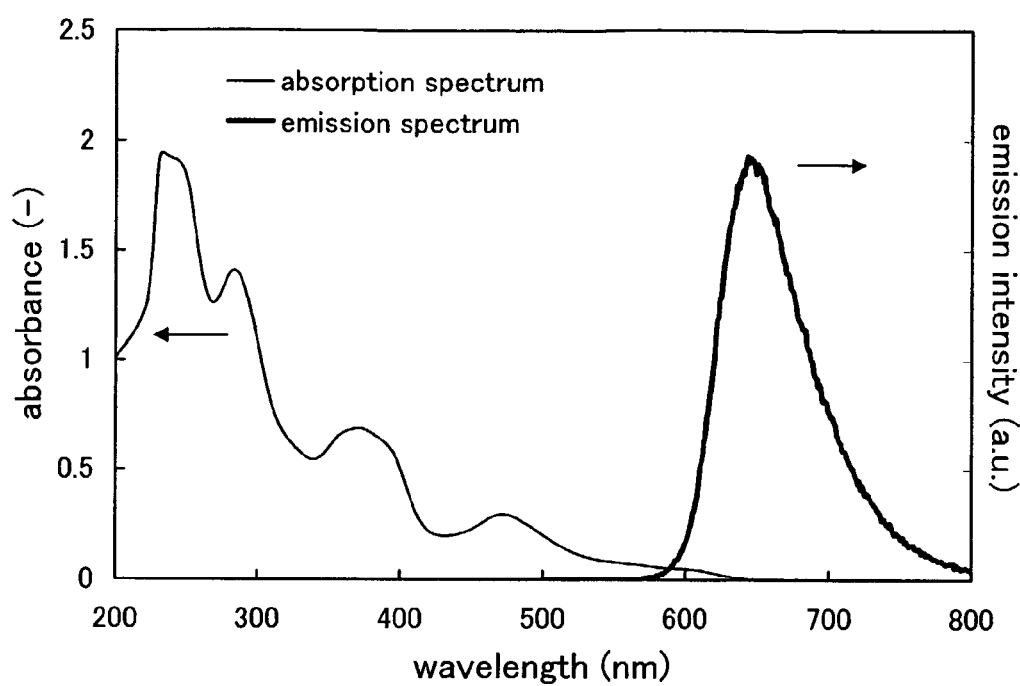
FIG. 13 is a diagram showing an absorption spectrum and an emission spectrum of an organometallic complex obtained in Synthesis Example 1 of Embodiment 1.

Further, FIG. 13 shows an absorption spectrum of the obtained Ir(Fdpq)$_2$(acac) in dichloromethane and an emission spectrum (Photo Luminescence) thereof. It is to be noted that the emission spectrum was obtained when light with a wavelength of 469 nm was used as excitation light, where the light with the wavelength of 469 nm was extracted by separating light from a halogen lamp with the use of a slit. In FIG. 13, the horizontal axis indicates a wavelength (nm), the left vertical axis indicates absorbance (no unit), and the right vertical axis indicates emission intensity (a.u.: auxiliary unit). As can be seen from FIG. 13, the organometallic complex Ir(Fdpq)$_2$(acac) according to the present invention has absorption peaks at 232 nm, 284 nm, 371 nm, and 472 nm. In addition, the emission spectrum shows luminescence with an emission peak at 644 nm, and this luminescence was visible as red luminescence.

In the case of the obtained Ir(Fdpq)$_2$(acac), the several absorption peaks are observed. This is absorption unique to an organometallic complex as in the case of an orthometalated complex or the like, and is believed to correspond to singlet MLCT transition, triplet π-π* transition, triplet MLCT (metal to ligand charge transfer) transition, and the like. In particular, the absorption peak at the longest wavelength side has a broad peak in the visible region, which is considered to be an absorption spectrum unique to triplet MLCT transition. Namely, it is determined that Ir(Fdpq)$_2$(acac) is a compound capable of direct photoexcitation to an excited triplet state and intersystem crossing.

In addition, a gas including oxygen was injected into a dichloromethane solution including the obtained Ir(Fdpq)$_2$(acac), and the emission intensity of Ir(Fdpq)$_2$(acac) was examined when the Ir(Fdpq)$_2$(acac) with dissolved oxygen was made to produce luminescence. Further, a gas including argon was injected into a dichloromethane solution including the obtained Ir(Fdpq)$_2$(acac), and the emission intensity of Ir(Fdpq)$_2$(acac) was examined when the Ir(Fdpq)$_2$(acac) with dissolved argon was made to produce luminescence. From the result, it was determined that luminescence derived from Ir(Fdpq)$_2$(acac) shows the same tendency as luminescence of a phosphorescent material, where the tendency is that the emission intensity is stronger in the case of dissolved argon than dissolved oxygen. Accordingly, luminescence derived from Ir(Fdpq)$_2$(acac) is believed to be phosphorescence.

Synthesis Example 2

The present synthesis example is a synthesis example of bis(2,3-diphenylquinoxalinato)(acetylacetonato) iridium (III) (abbreviation: Ir(dpq)$_2$(acac)) represented by the formula (17).

<Step 1: Synthesis of Dinuclear Complex [Ir(dpq)$_2$Cl]$_2$>

First, with a mixture of 30 mL of 2-ethoxyethanol and 10 mL of water as a solvent, 2.36 g of a ligand Hdpq (2,3-diphenylquinoxaline) and 1.00 g of iridium chloride (IrCl$_3$·HCl·H$_2$O) were mixed, and held at reflux in a nitrogen atmosphere for 15 hours to obtain a dinuclear complex [Ir(dpq)$_2$Cl]$_2$ (dark brown powder, yield: 91%).

The synthesis scheme and the structure formula of the dinuclear complex [Ir(dpq)$_2$Cl]$_2$ are shown by the following formula (63).

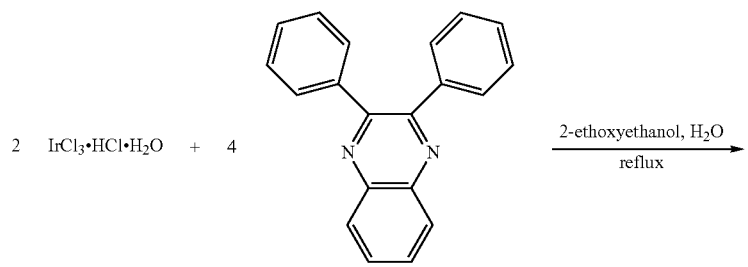

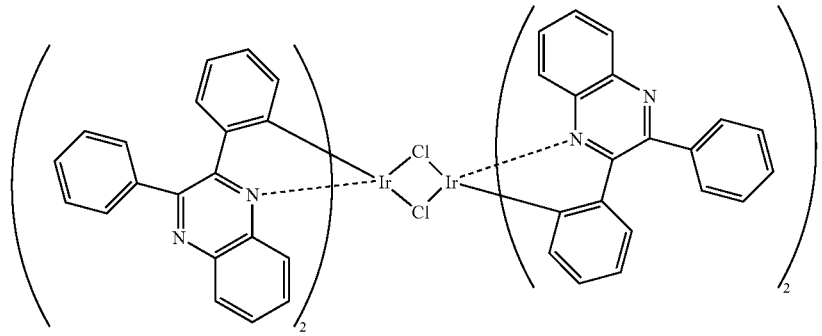

(63)

<Step 2: Synthesis of Organometallic Complex Ir(dpq)$_2$(acac) According to the Present Invention Further, with 30 mL of 2-ethoxyethanol as a solvent, 1.00 g of the dinuclear complex [Ir(dpq)$_2$Cl]$_2$ obtained in Step 1 described above, 0.20 mL of acetylacetone (Hacac), and 0.67 g of sodium carbonate were mixed, and held at reflux in a nitrogen atmosphere for 15 hours. This reaction solution was filtered, and the obtained solution was purified by column chromatography with the use of a dichloromethane solvent. Recrystallization was performed with the use of a dichloromethane/ethanol solvent to obtain an organometallic complex Ir(dpq)$_2$(acac) according to the present invention (reddish brown powder, yield: 40%).

The synthesis scheme is shown by the following formula (64).

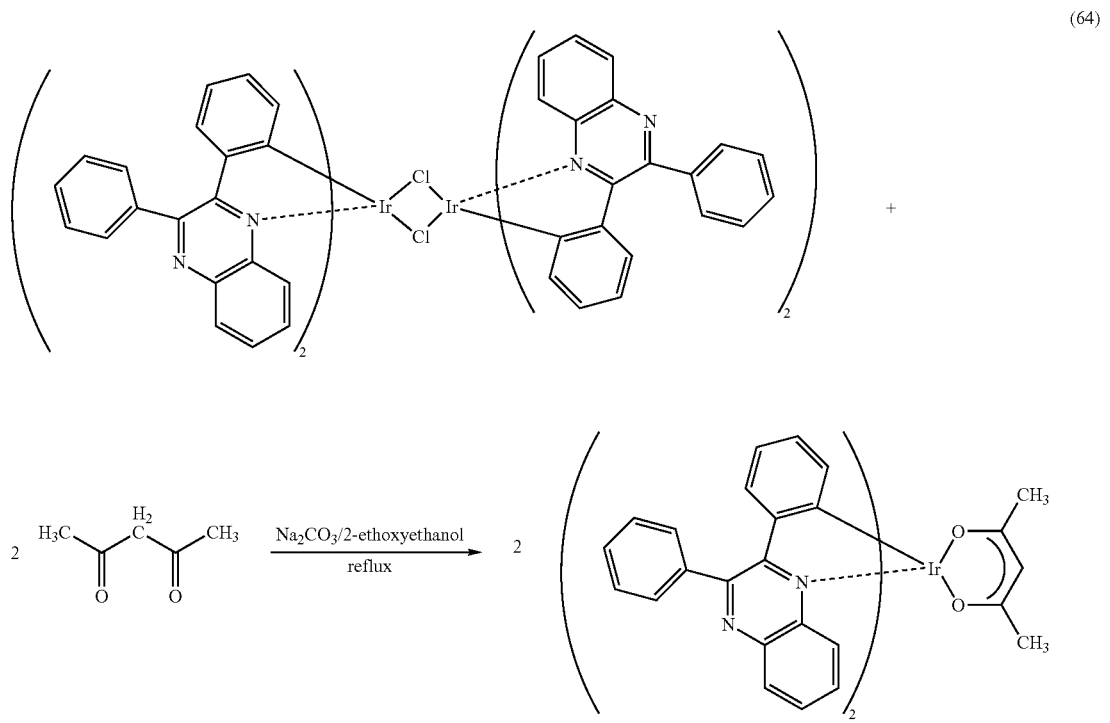

(64)

The result of analysis of the organometallic complex Ir(dpq)$_2$(acac) by nuclear magnetic resonance ($^1$H-NMR) is as follows.

$^1$H-NMR. δ (CDCl$_3$): 8.15 (t, 4H), 7.89 (brs, 4H), 7.79 (t, 2H), 7.69 (m, 8H), 6.94 (d, 2H), 6.57 (t, 2H), 6.48 (t, 2H), 6.33 (d, 2H), 4.81 (s, 1H), 1.64 (s, 6H)

In addition, measurement of the thermal decomposition temperature T$_d$ of the obtained Ir(dpq)$_2$(acac) was performed by a Thermogravimetry/Differential Thermal Analysis simultaneous measurement system (from Seiko Instruments Inc., TG/DTA-320) to find T$_d$=340° C., and thus, it is determined that the organometallic complex Ir(dpq)$_2$(acac) shows favorable heat resistance.

Figure 14:
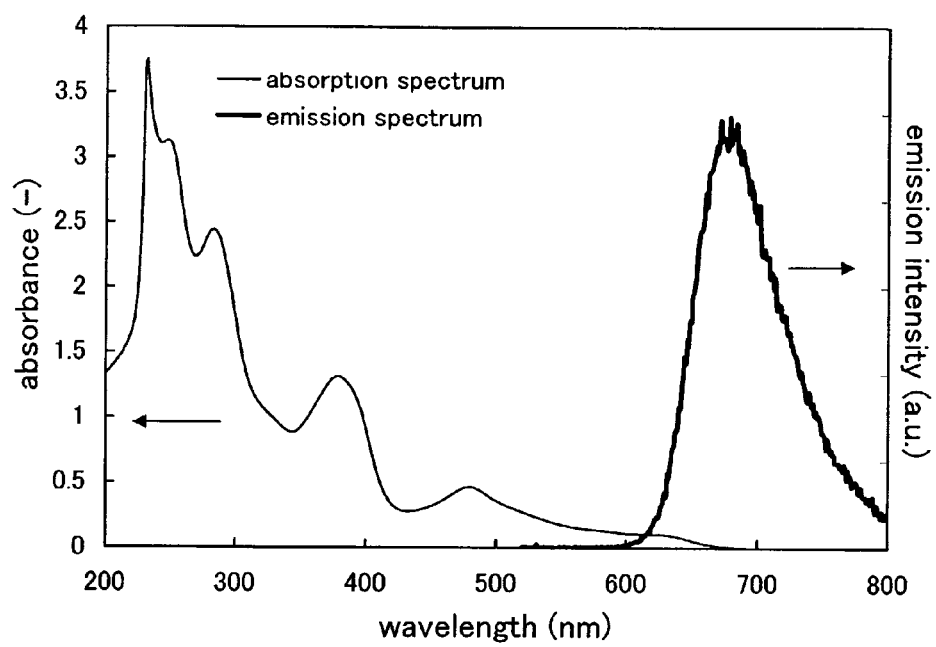
FIG. 14 is a diagram showing an absorption spectrum and an emission spectrum of an organometallic complex obtained in Synthesis Example 2 of Embodiment 1.

Further, FIG. 14 shows an absorption spectrum of the obtained Ir(dpq)$_2$(acac) in dichloromethane and an emission spectrum (PL) thereof. It is to be noted that the emission spectrum was obtained when light with a wavelength of 469 nm was used as excitation light, where the light with the wavelength of 469 nm was extracted by separating light from a halogen lamp with the use of a slit. In FIG. 14, the horizontal axis indicates a wavelength (nm), the left vertical axis indicates absorbance (no unit), and the right vertical axis indicates emission intensity (a.u.). As can be seen from FIG. 14, the obtained organometallic complex Ir(dpq)$_2$(acac) has absorption peaks at 248 nm, 283 nm, 378 nm, and 479 nm. In addition, the emission spectrum shows luminescence with an emission peak at 687 nm, and this luminescence was visible as deep red luminescence.

In the case of the obtained Ir(dpq)$_2$(acac), the several absorption peaks are observed. This is absorption unique to an organometallic complex as in the case of an orthometa-lated complex or the like, and is believed to correspond to singlet MLCT transition, triplet π-π* transition, triplet MLCT transition, and the like. In particular, the absorption peak at the longest wavelength side has a broad peak in the visible region, which is considered to be an absorption spectrum unique to triplet MLCT transition. Namely, it is determined that Ir(dpq)$_2$(acac) is a compound capable of direct photoexcitation to an excited triplet state and intersystem crossing.

In addition, a gas including oxygen was injected into a dichloromethane solution including the obtained Ir(dpq)$_2$(acac), and the emission intensity of Ir(dpq)$_2$(acac) was examined when the Ir(dpq)$_2$(acac) with dissolved oxygen was made to produce luminescence. Further, a gas including argon was injected into a dichloromethane solution including the obtained Ir(dpq)$_2$(acac), and the emission intensity of Ir(dpq)$_2$(acac) was examined when the Ir(dpq)$_2$(acac) with dissolved argon was made to produce luminescence. From the result, it was determined that luminescence derived from Ir(dpq)$_2$(acac) shows the same tendency as luminescence of a phosphorescent material, where the tendency is that the emission intensity is stronger in the case of dissolved argon than dissolved oxygen. Accordingly, luminescence derived from Ir(dpq)$_2$(acac) is believed to be phosphorescence.

Synthesis Example 3

The present synthesis example is a synthesis example of {2,3-bis(4-fluorophenyl) quinoxalinato}(picolinato) iridium (III) (abbreviation: Ir(Fdpq)$_2$(Pic)) represented by the following formula (65).

The structure formula of Ir(Fdpq)₂(pic) is shown by the following formula (65).

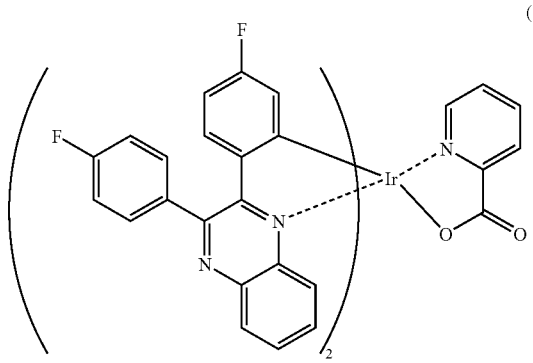

(65)

First, the dinuclear complex [Ir(Fdpq)₂Cl]₂ obtained in Step 1 of Synthesis Example 1 was used as a material. With 30 mL of dichloromethane as a solvent, 2.87 g of [Ir(Fdpq)₂Cl]₂ and 1.67 g of picolinic acid (Hpic) were mixed, and held at reflux in a nitrogen atmosphere for 16 hours. This reaction solution was filtered to obtain an organometallic complex Ir(Fdpq)₂(Pic) (red powder, yield: 56%)

The synthesis scheme is shown by the following formula (66).

The result of analysis of the organometallic complex Ir(Fdpq)₂(pic) by nuclear magnetic resonance (¹H-NMR) is as follows.

¹H-NMR. δ (CDCl₃): 8.66 (d, 1H), 8.45 (d, 1H), 8.04 (m, 4H), 7.95 (d, 1H), 7.81 (m, 3H), 7.69 (m, 2H), 7.59 (t, 1H), 7.53 (t, 1H), 7.33 (m, 5H), 7.18 (t, 1H), 7.07 (t, 2H), 6.51 (td, 1H), 6.38 (m, 2H), 5.78 (dd, 1H)

In addition, measurement of the thermal decomposition temperature $T_d$ of the obtained Ir(Fdpq)₂(acac) was performed by a Thermogravimetry/Differential Thermal Analysis simultaneous measurement system (from Seiko Instruments Inc., TG/DTA-320) to find $T_d$=347° C., and thus, it is determined that the organometallic complex Ir(Fdpq)₂(Pic) shows favorable heat resistance.

Figure 15:
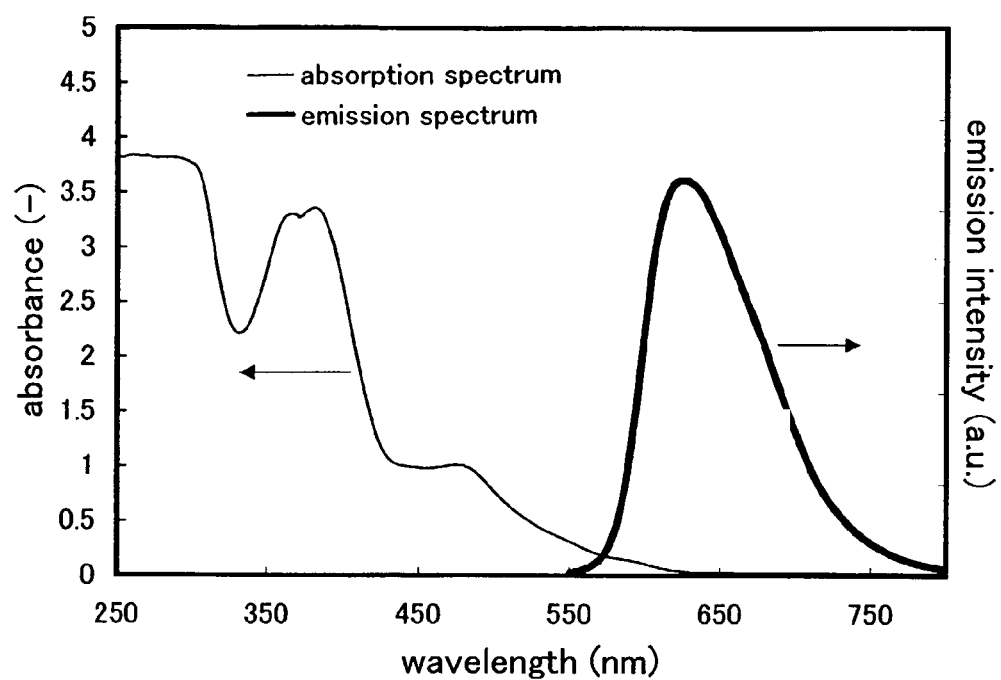
FIG. 15 is a diagram showing an absorption spectrum and an emission spectrum of an organometallic complex obtained in Synthesis Example 3 of Embodiment 1.

Further, FIG. 15 shows an absorption spectrum of the obtained Ir(Fdpq)₂(Pic) in dichloromethane and an emission spectrum (PL) thereof. It is to be noted that the emission spectrum was obtained when light with a wavelength of 468 nm was used as excitation light, where the light with the wavelength of 468 nm was extracted by separating light from a halogen lamp with the use of a slit. In FIG. 15, the horizontal axis indicates a wavelength (nm), the left vertical axis indicates absorbance (no unit), and the right vertical axis indicates emission intensity (a.u.). As can be seen from FIG. 15, the obtained organometallic complex Ir(Fdpq)₂(pic) has a plurality of absorption peaks. In addition, the emission spectrum shows luminescence with an emission peak at 625 nm, and this luminescence was visible as red luminescence.

The absorption peak at the longest wavelength side has a broad peak in the visible region, which is considered to be an absorption spectrum unique to triplet MLCT transition. Namely, it is determined that Ir(Fdpq)₂(Pic) is a compound capable of direct photoexcitation to an excited triplet state and intersystem crossing.

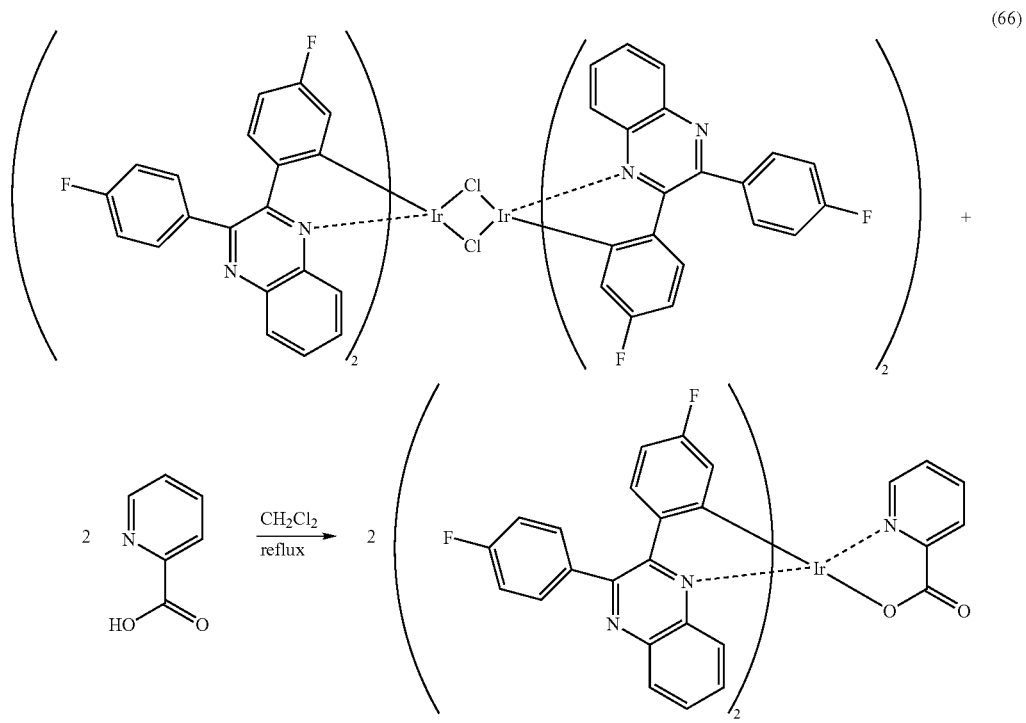

(66)

Synthesis Example 4

In the present synthesis example, synthesis of {2,3-bis(3,5-difluorophenyl) quinoxalinato}(acetylacetonato) iridium (III) represented by the following formula (67) will be described.

The structure formula of Ir(3,5-Fdpq)$_2$(acac) is shown by the following formula (67).

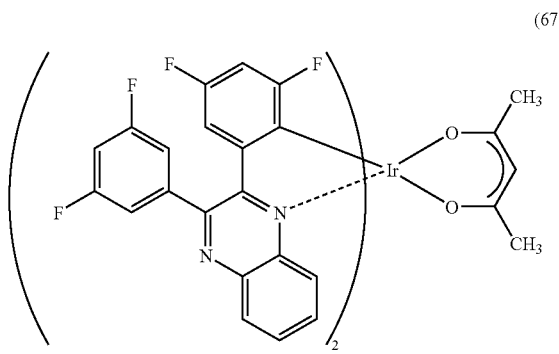

(67)

<Step 1: Synthesis of 3,3',5,5'-tetrafluorobenzyl>

3,3', 5,5'-tetrafluorobenzyl that is a material for a ligand was synthesized as follows. First, 3.16 g of magnesium was suspended in 3 mL of tetrahydrofran (abbreviation: THF), and a small amount of 1,2-dibromoethane was added. Into this mixture, a solution of 25.00 g of 1-bromo-3,5-difluorobenzene in 130 mL of THF was dropped, and stirring was performed for 1.5 hours while holding at reflux on heating. Next, 9.24 g of 1,4-dimethylpiperazine-2,3-dione was added to the solution cooled to room temperature, and stirring was performed for 13 hours while holding at reflux on heating.

Further, 200 mL of 10% hydrochloric acid was added to the solution cooled to room temperature, and the organic layer was extracted with chloroform. After drying with sodium sulfate, the solvent was condensed. Finally, purification was performed by column chromatography (hexane/dichloromethane system) to obtain 3,3', 5,5'-tetrafluorobenzyl (yellow powder, yield: 46%).

The synthesis scheme is shown by the following formula (68).

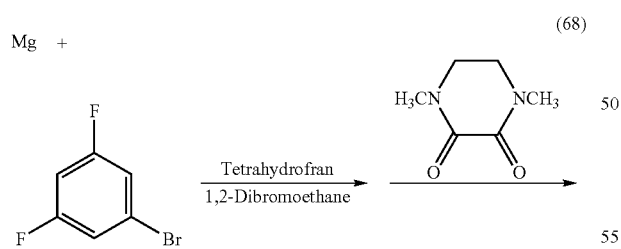

(68)

<Step 2: Synthesis of Ligand H (3,5-Fdpq)>

Chloroform (300 mL) was added to 8.32 g of 3,3',5,5'-tetrafluorobenzyl synthesized in Step 1 and 3.19 g of 1,2-phenylenediamine, and stirring was performed for 10 hours while holding at reflux on heating. The solution cooled to room temperature washed with hydrochloric acid (1N) and then a saturated aqueous solution of sodium chloride, and dried with magnesium sulfate. Then, the solvent was condensed to obtain 2,3-bis(3,5-difluorophenyl) quinoxaline (ligand H (3,5-Fdpq)) (white powder, yield: 98%).

The synthesis scheme and the structure formula of the ligand H (3,5-Fdpq) are shown by the following formula (69).

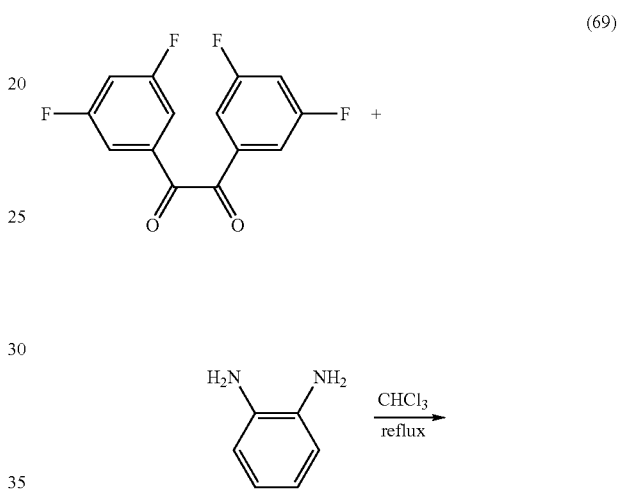

(69)

<Step 3: Synthesis of Dinuclear Complex [Ir(3,5-Fdpq)$_2$Cl]$_2$>

First, with a mixture of 30 mL of 2-ethoxyethanol and 10 mL of water as a solvent, 2.46 g of the ligand H (3,5-Fdpq) synthesized in Step 2 and 0.83 g of iridium chloride (IrCl$_3$.HCl.H$_2$O) were mixed, and held at reflux in a nitrogen atmosphere for 17 hours to obtain a dinuclear complex [Ir(3, 5-Fdpq)$_2$Cl]$_2$ (reddish brown powder, yield: 78%).

The synthesis scheme and the structure formula of the dinuclear complex [Ir(3,5-Fdpq)$_2$Cl]$_2$) are shown by the following formula (70).

(70)

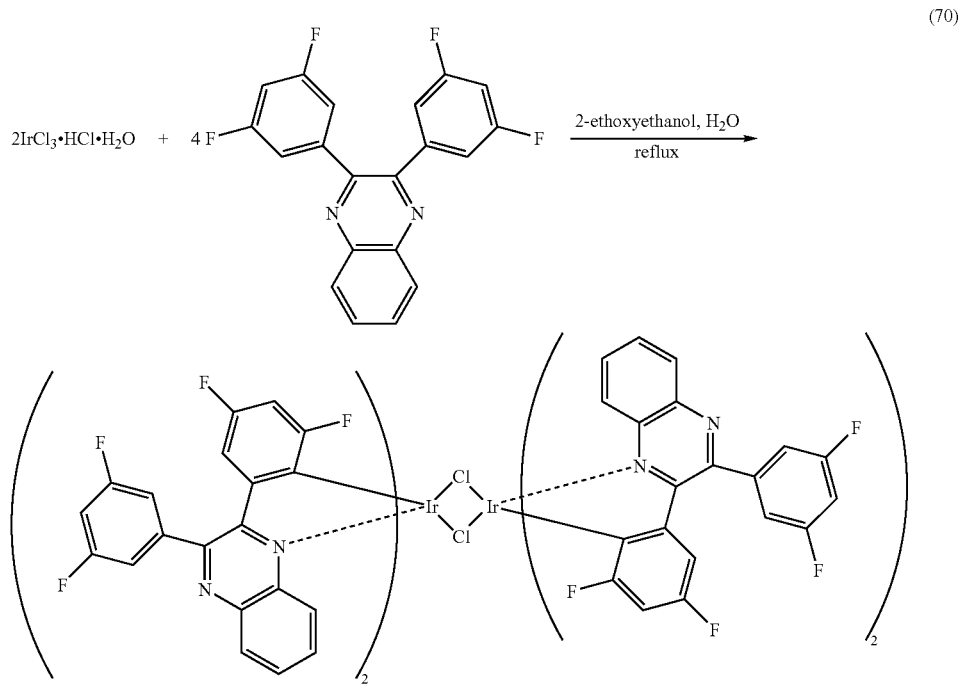

<Step 3: Synthesis of Organometallic Complex Ir(3,5-Fdpq)$_2$(acac)>

With 30 mL of 2-ethoxyethanol as a solvent, 2.34 g of the dinuclear complex [Ir(3,5-Fdpq)$_2$Cl]$_2$ obtained in Step 3 described above, 0.39 mL of acetylacetone (Hacac), and 1.32 g of sodium carbonate were mixed, and held at reflux in a nitrogen atmosphere for 20 hours to obtain an organometallic complex Ir(3,5-Fdpq)$_2$(acac) represented by the formula (67) according to the present invention (dark red powder, yield: 22%).

The synthesis scheme is shown by the following formula (71).

(71)

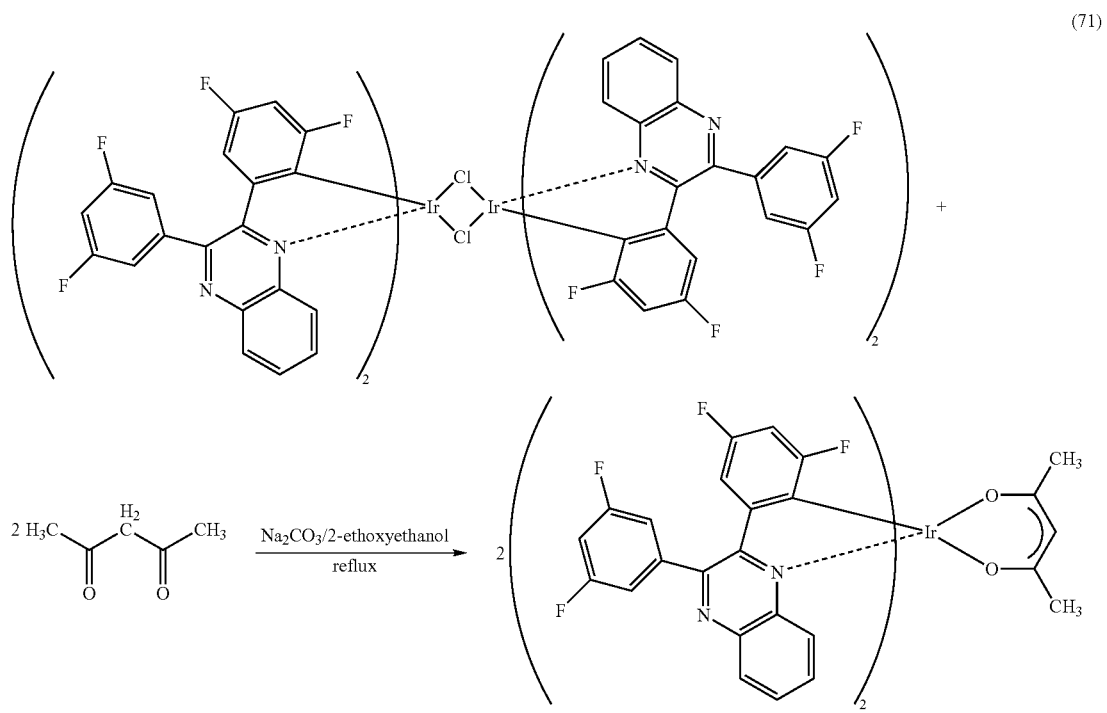

The result of analysis of the organometallic complex Ir(3,5-Fdpq)$_2$(acac) by nuclear magnetic resonance ($^1$H-NMR) is as follows.

$^1$H-NMR. δ (CDCl$_3$): 8.10 (t, 4H), 7.75 (t, 2H), 7.61 (m, 4H), 7.30 (m, 2H), 7.09 (tt, 2H), 6.77 (dd, 2H), 6.20 (td, 2H), 4.67 (s, 1H), 1.61 (s, 6H)

In addition, measurement of the thermal decomposition temperature T$_d$ of the obtained Ir(3,5-Fdpq)$_2$(acac) was performed by a Thermogravimetry/Differential Thermal Analysis simultaneous measurement system (from Seiko Instruments Inc., TG/DTA-320) to find T$_d$=342° C., and thus, it is determined that the organometallic complex Ir(Fdpq)$_2$(Pic) shows favorable heat resistance.

Figure 16:
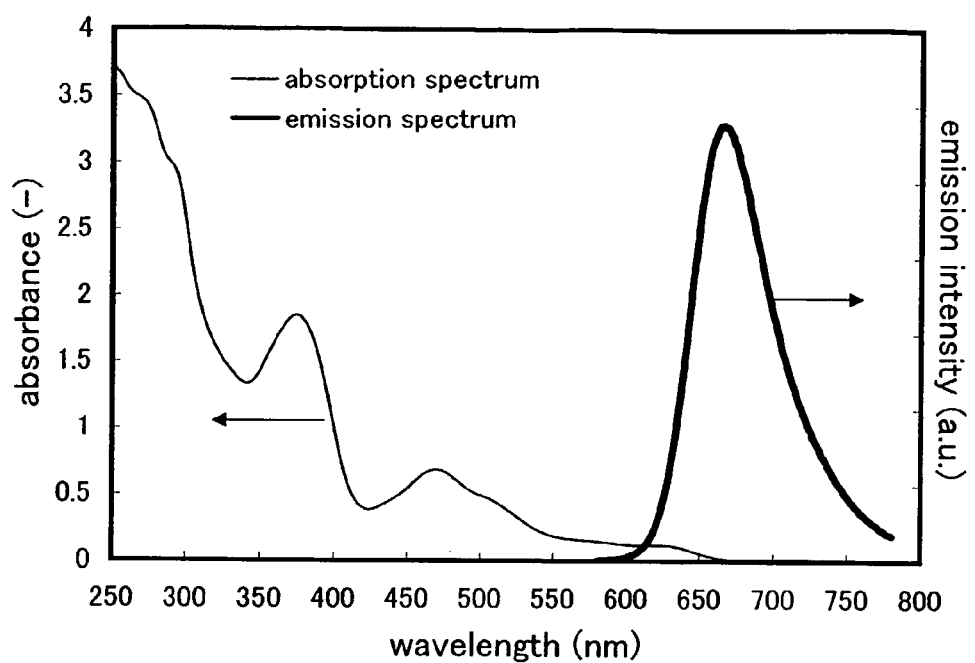
FIG. 16 is a diagram showing an absorption spectrum and an emission spectrum of an organometallic complex obtained in Synthesis Example 4 of Embodiment 1.

Further, FIG. 16 shows an absorption spectrum of the obtained Ir(3,5-Fdpq)$_2$(acac) in dichloromethane and an emission spectrum (PL) thereof. It is to be noted that the emission spectrum was obtained when light with a wavelength of 468 nm was used as excitation light, where the light with the wavelength of 468 nm was extracted by separating light from a halogen lamp with the use of a slit. In FIG. 16, the horizontal axis indicates a wavelength (nm), the left vertical axis indicates absorbance (no unit), and the right vertical axis indicates emission intensity (a.u.). As can be seen from FIG. 16, the obtained organometallic complex Ir(3,5-Fdpq)$_2$(acac) has a plurality of absorption peaks. In addition, the emission spectrum shows luminescence with an emission peak at 666 nm, and this luminescence was visible as deep red luminescence.

The absorption peak at the longest wavelength side has a broad shape in the visible region, which is considered to be an absorption spectrum unique to triplet MLCT transition. Namely, it is determined that Ir(3,5-Fdpq)$_2$(acac) is a compound capable of direct photoexcitation to an excited triplet state and intersystem crossing.

Synthesis Example 5

In the present synthesis example, synthesis of {2,3-bis(3,5-difluorophenyl) quinoxalinato}(picolinato) iridium (III) represented by the following formula (72) will be described.

The structure formula of Ir(3,5-Fdpq)$_2$(pic) is shown by the following formula (72).

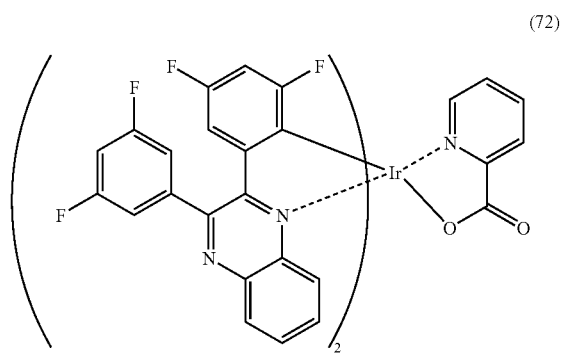

(72)

With 30 mL of dichloromethane as a solvent, 2.54 g of the dinuclear complex [Ir(3,5-Fdpq)$_2$Cl]$_2$ synthesized in Step 3 of Synthesis Example 4 and 1.34 g of picolinic acid (Hpic) were mixed, and held at reflux in a nitrogen atmosphere for 16 hours. This solution was filtered to obtain an organometallic complex Ir(3,5-Fdpq)$_2$(pic) according to the present invention (red powder, yield: 14%).

The synthesis scheme is shown by the following formula (73).

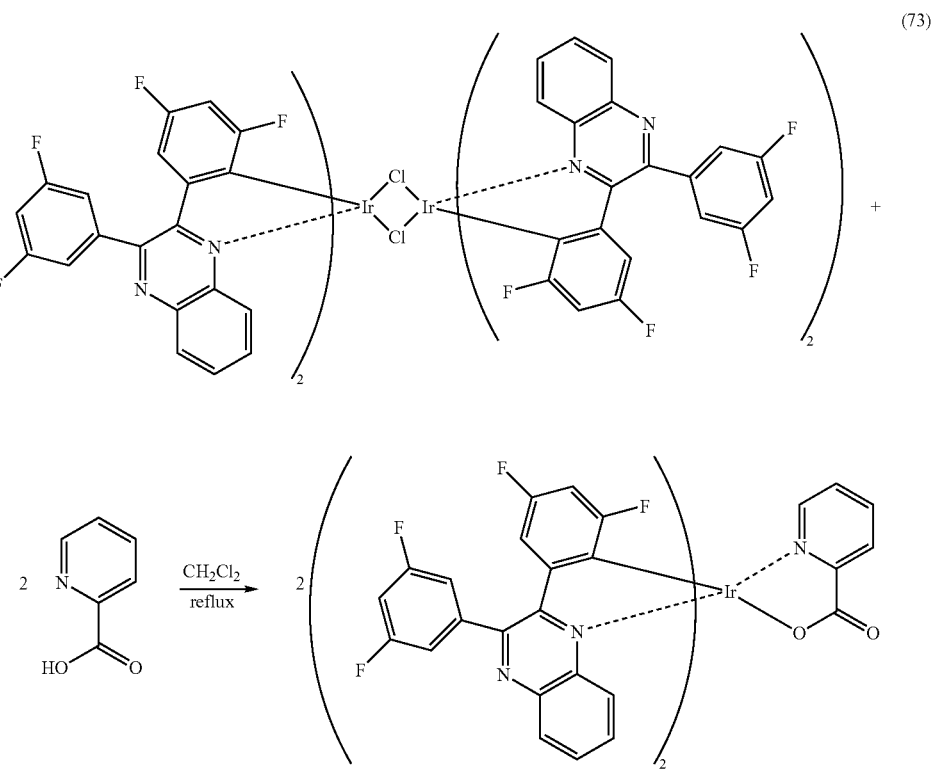

(73)

The result of analysis of the organometallic complex Ir(3,5-Fdpq)$_2$(pic) by nuclear magnetic resonance ($^1$H-NMR) is as follows.

$^1$H-NMR. δ (CDCl$_3$): 8.65 (d, 1H), 8.54 (d, 1H), 8.06 (m, 2H), 7.87-7.54 (m, 8H), 7.32 (m, 3H), 7.12 (m, 3H), 6.85 (d, 1H), 6.74 (d, 1H), 6.37 (t, 1H), 6.17 (t, 1H)

In addition, measurement of the thermal decomposition temperature T$_d$ of the obtained Ir(3,5-Fdpq)$_2$(Pic) was performed by a Thermogravimetry/Differential Thermal Analysis simultaneous measurement system (from Seiko Instruments Inc., TG/DTA-320) to find T$_d$=347° C., and thus, it is determined that the organometallic complex Ir(Fdpq)$_2$(Pic) shows favorable heat resistance.

Figure 17:
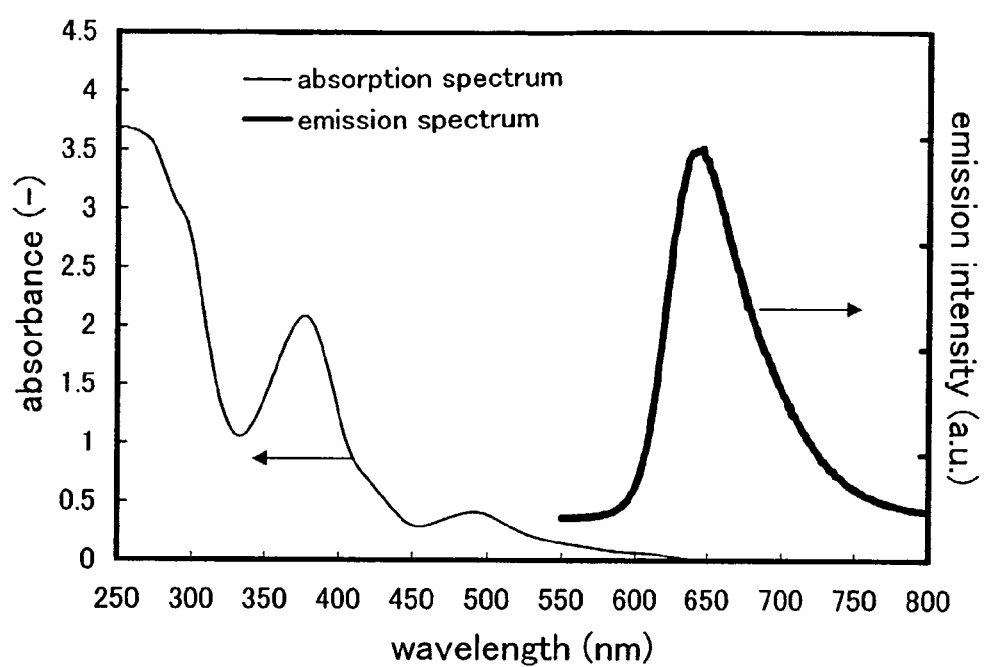
FIG. 17 is a diagram showing an absorption spectrum and an emission spectrum of an organometallic complex obtained in Synthesis Example 5 of Embodiment 1.

Further, FIG. 17 shows an absorption spectrum of the obtained Ir(3,5-Fdpq)$_2$(Pic) in dichloromethane and an emission spectrum (PL) thereof. It is to be noted that the emission spectrum was obtained when light with a wavelength of 468 nm was used as excitation light, where the light with the wavelength of 468 nm was extracted by separating light from a halogen lamp with the use of a slit. In FIG. 17, the horizontal axis indicates a wavelength (nm), the left vertical axis indicates absorbance (no unit), and the right vertical axis indicates emission intensity (a.u.). As can be seen from FIG. 17, the obtained organometallic complex Ir(3,5-Fdpq)$_2$(pic) has a plurality of absorption peaks. In addition, the emission spectrum shows luminescence with an emission peak at 645 nm, and this luminescence was visible as red luminescence.

The absorption peak at the longest wavelength side has a broad peak in the visible region, which is considered to be an absorption spectrum unique to triplet MLCT transition. Namely, it is determined that Ir(3,5-Fdpq)$_2$(pic) is a compound capable of direct photoexcitation to an excited triplet state and intersystem crossing.

The organometallic complexes described in Synthesis Examples 1 to 5 according to the present invention can be used as a luminescent material or a photosensitizer.

Next, from the absorption spectrums of the organometallic complexes according to the present invention, obtained in Synthesis Examples 1 to 5, that is, FIGS. 13 to 17, the energy gap of each organometallic complex was found. The energy gap was calculated by converting the wavelength of the absorption edge of the absorption spectrum to energy. Table 1 shows the results.

TABLE 1

| | abbreviation of organometallic complex according to the present invention | energy gap [eV] |
|---|---|---|
| synthesis example 1 | Ir(Fdpq)$_2$(acac) | 2.0 |
| synthesis example 2 | Ir(dpq)$_2$(acac) | 1.9 |
| synthesis example 3 | Ir(Fdpq)$_2$(pic) | 2.0 |
| synthesis example 4 | Ir(3,5-Fdpq)$_2$(acac) | 1.9 |
| synthesis example 5 | Ir(3,5-Fdpq)$_2$(pic) | 2.0 |

It is to be noted that it is preferable to disperse each of the above-described organometallic complexes according to the present invention appropriately in a host material when the organometallic complex is used as a luminescent material for a light-emitting element. Table 2 shows the energy gaps of typical host materials, measured in the same way as described above.

TABLE 2

| abbreviation of typical host material | energy gap [eV] |
|---|---|
| TPAQn | 2.8 |
| CBP | 3.5 |
| α-NPD | 3.1 |
| Alq$_3$ | 2.8 |

As can be seen from comparison between Table 1 and Table 2, each of the host materials has a larger energy gap than the organometallic complexes according to the present invention, and thus can be used as a host material for the organometallic complexes according to the present invention.

Further, in addition to the energy gaps, oxidation and reduction characteristics of the organometallic complexes according to the present invention, obtained in the synthesis examples, were measured by cyclic voltammetry (CV) to evaluate ionization potentials and electron affinities. First, with the use of the organometallic complex Ir(Fdpq)$_2$(acac) in Synthesis Example 1 as an example, the procedure of the CV measurement will be described below.

As a measurement system, an electrochemical analyzer (ALS Model 600A from BAS) was used. For preparing a solution in the CV measurement, tetra-n-butylammonium perchlorate (n-Bu$_4$NClO$_4$) as a supporting electrolyte was dissolved in dehydrated dimethylformamide (DMF) as a solvent so as to reach a concentration of 100 mmol, and Ir(Fdpq)$_2$(acac) as a measuring object was further dissolved to reach a concentration of 1 mmol. In addition, a platinum electrode (PTE platinum electrode from BAS), a platinum electrode (Pt counter electrode for VC-3 from BAS), and a Ag/Ag$^+$ electrode (RE5 nonaqueous solvent reference electrode from BAS) were used as a work electrode, an auxiliary electrode, and a reference electrode, respectively.

The oxidation characteristics were measured by changing the potential of the work electrode with respect to the reference electrode first from −0.4 to 1.2 V, and subsequently from 1.2 to −0.4 V. The reduction characteristics were measured by changing the potential of the work electrode with respect to the reference electrode first from −0.4 to −2.4 V, and subsequently from −2.4 to −0.4 V. It is to be noted that the scan rate in the CV measurement was controlled to be 0.1 V/s.

Figure 18A:
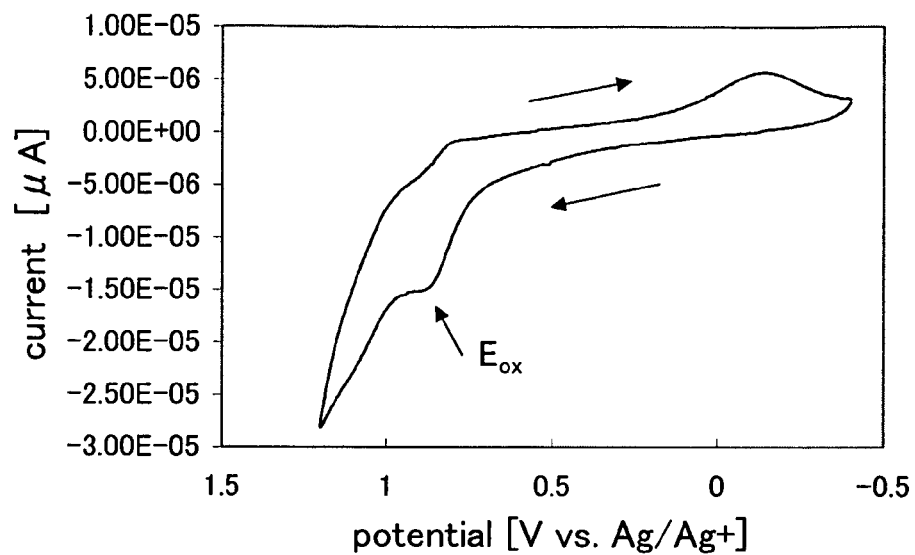
FIGS. 18A and 18B are diagrams showing CV curves respectively in the case of examining oxidation characteristics and reduction characteristics of the organometallic complex [Ir(Fdpq)$_2$(acac)] in Synthesis Example 1.
Figure 18B:
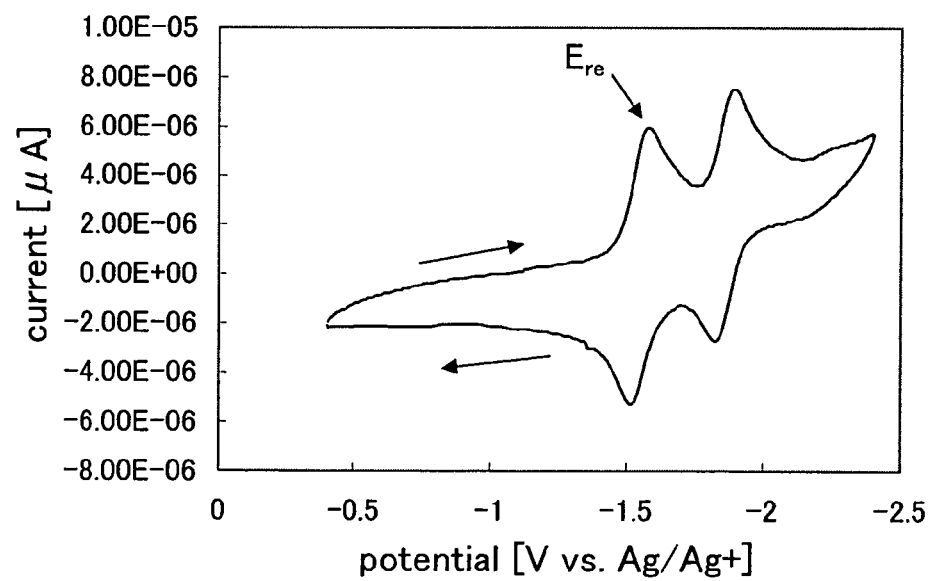

FIGS. 18A and 18B show a CV curve showing the oxidation characteristics of Ir(Fdpq)$_2$(acac) and a CV curve showing the reduction characteristics of Ir(Fdpq)$_2$(acac), respectively. In each of FIGS. 18A and 18B, the horizontal axis and the vertical axis respectively indicate a potential (V) of the work electrode with respect to the reference electrode and a current value (1×10$^{-5}$ A) that flowed between the work electrode and the auxiliary electrode. From FIG. 18A, it is determined that the oxidation peak potential (E$_{ox}$) is 0.88 V (vs. Ag/Ag$^+$ electrode). In addition, from FIG. 18B, it is determined that the reduction peak potential (E$_{re}$) is −1.58 V (vs. Ag/Ag$^+$ electrode).

In accordance with the same measurement method, the oxidation peak potential (E$_{ox}$) and reduction peak potential (E$_{re}$) were measured also for each of the organometallic complexes according to the present invention, obtained in Synthesis Examples 2 and 3. The results of the CV measurement are arranged in Table 3. It is to be noted that, in the case of these organometallic complexes according to the present invention, there was almost no variation in peak position or peak intensity of the CV curve in each case of oxidation and reduction even when 100 cycles of CV measurement were repeated. Therefore, it is also determined that the organometallic complexes are quite stable against oxidation and reduction reactions.

TABLE 3

| abbreviation of organometallic complex according to the present invention | $E_{ox}$ [eV] | $E_{re}$ [eV] |
|---|---|---|
| synthesis example 1 | Ir(Fdpq)$_2$(acac) | 0.88 | −1.58 |
| synthesis example 2 | Ir(dpq)$_2$(acac) | 0.7~0.8* | −1.82 |
| synthesis example 3 | Ir(Fdpq)$_2$(pic) | 1.0~1.1* | −1.51 |

*The peak is not clear.

By the way, when each of the above-described organometallic complexes according to the present invention is used as a luminescent material for a light-emitting element, it is preferable to disperse the organometallic complex appropriately in a host material. Consequently, in accordance with the same measurement method, the oxidation peak potentials and reduction peak potentials of typical host materials were measured. The results are shown in following Table 4.

TABLE 4

| abbreviation of typical host material | $E_{ox}$ [eV] | $E_{re}$ [eV] |
|---|---|---|
| TPAQn | 0.69 | −2.05 |
| CBP*[1] | 1.25 | −2.3~−2.4*[2] |
| α-NPD | 0.45 | −2.8~−2.9*[2] |
| Alq$_3$ | 0.7~0.8*[2] | −2.20 |

*[1]Dichloromethane is used as solvent.
*[2]The peak is not clear.

When Table 4 is compared with Table 3, it is first determined that each organometallic complex according to the present invention especially has a larger reduction potential than the host materials (the reduction potential has a smaller absolute value). This namely indicates that the organometallic complex according to the present invention has a larger electron affinity than the host materials (is more easily reduced), and accordingly suggests that the organometallic complex according to the present invention has a property of easily receiving electrons and carriers can be efficiently trapped by dispersing the organometallic complex in the host material described above.

In addition, depending on the combination, the organometallic complex according to the present invention has a smaller oxidation potential than the host material (for example, a combination of Ir(Fdpq)$_2$(acac) and Alq$_3$, and a case of using CBP as the host material). In the case of such a combination, the organometallic complex according to the present invention has a smaller ionization potential than the host materials (is more easily oxidized). Accordingly, when such a combination is applied to a light-emitting element, it is possible to trap not only electrons but also holes efficiently.

As a host material, it is preferable to use a material that allows the organometallic complex according to the present invention to trap electrons and holes efficiently. However, it is not necessary to trap both an electron and a hole, and either one may be trapped. In addition, when the energy gap of a host material is larger than the energy gap of the organometallic complex, it is not always necessary to use a material that allows the organometallic complex according to the present invention to trap electrons and holes efficiently.

Embodiment 2

Figure 19:
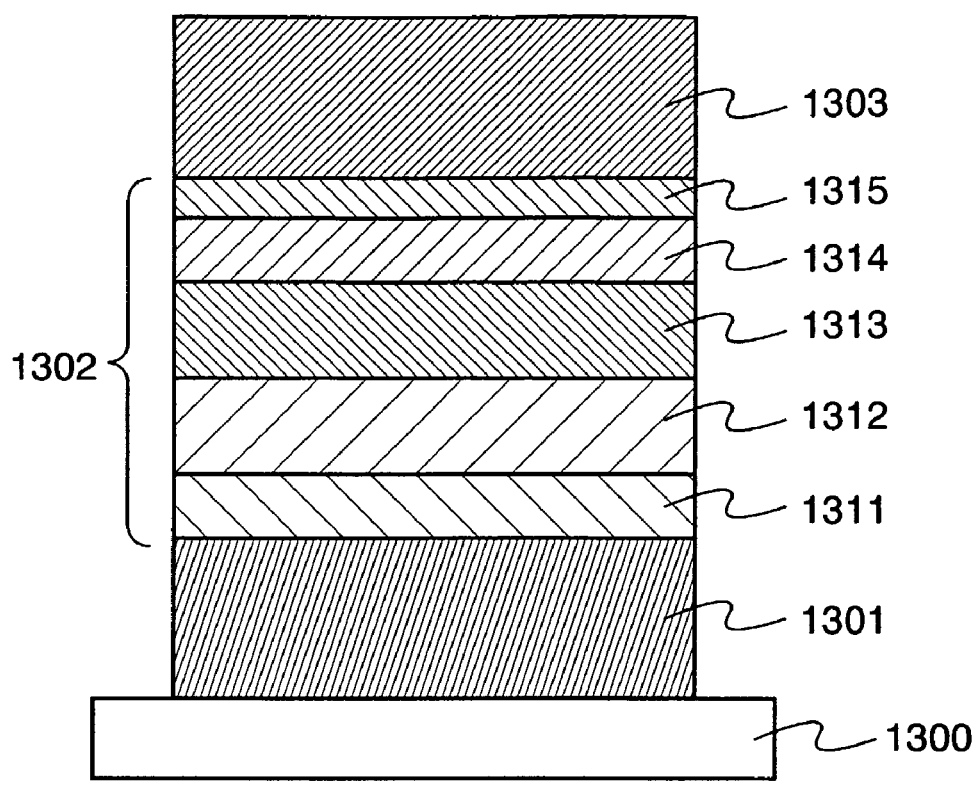
FIG. 19 is a diagram illustrating the structure of a light-emitting element in Embodiment 2 and a manufacturing method thereof.

In the present embodiment, the structure of a light-emitting element according to the present invention and a manufacturing method thereof will be described with reference to FIG. 19.

First, on a substrate 1300, a first electrode 1301 was formed by deposition of indium tin oxide so as to be 110 nm in film thickness. It is to be noted that sputtering was used for the deposition.

Next, on the first electrode 1301, a hole injecting layer 1311 was formed by deposition of copper phthalocyanine so as to be 20 nm in film thickness. The deposition was performed by evaporation using resistance heating in such a way that the substrate on which the first electrode 1301 was formed was fixed in a substrate holder of a commercially produced vacuum deposition system with the surface at which the first electrode 1301 was formed down and copper phthalocyanine was put in an evaporation source provided in the vacuum deposition system.

Next, on the hole injecting layer 1311, a hole transporting layer 1312 was formed by deposition of α-NPD so as to be 40 nm in film thickness. The deposition was performed by evaporation in the same way as the formation of the hole injecting layer 1311.

Next, a light-emitting layer 1313 was formed by deposition of α-NPD so that {2,3-bis(4-fluorophenyl)quinoxalinato} (acetylacetonato) iridium (III) (hereinafter, referred to as Ir(Fdpq)$_2$(acac)) represented by the formula (16) is included at a rate of 8 weight % in α-NPD. The deposition was performed by co-evaporation with α-NPD and Ir(Fdpq)$_2$(acac) as evaporation sources so as to be 30 nm in film thickness. Here, α-NPD functions as a host material.

Next, on the light-emitting layer 1313, an electron transporting layer 1314 was formed by deposition of Alq$_3$ so as to be 30 nm in film thickness. The deposition was performed by evaporation in the same way as the formation of the hole injecting layer 1311. Then, on the electron transporting layer 1314, an electron injecting layer 1315 was formed by deposition of calcium fluoride (CaF$_2$) so as to be 1 nm in film thickness. The deposition was performed by evaporation in the same way as the formation of the hole injecting layer 1311.

In this way, a layer including a luminescent material 1302 was formed by stacking the hole injecting layer 1311, the hole transporting layer 1312, the light-emitting layer 1313, the electron transporting layer 1314, and the electron injecting layer 1315.

Next, on the electron injecting layer 1315, a second electrode 1303 was formed by deposition of aluminum so as to be 150 nm in film thickness. The deposition was performed by evaporation in the same way as the formation of the hole injecting layer 1311.

Further, the manufactured light-emitting element was moved into a glove box in a nitrogen atmosphere, and sealing was performed with the use of a sealing material in the glove box. After sealing of the light-emitting element, the light-emitting element was taken outside the glove box, and current density-luminance characteristics, voltage-luminance characteristics, and luminance-current efficiency characteristics in an initial condition were examined at room temperature (about 25° C.). In addition, an operational stability test by constant current driving was performed to examine the lifetime of the element.

Figure 20A:
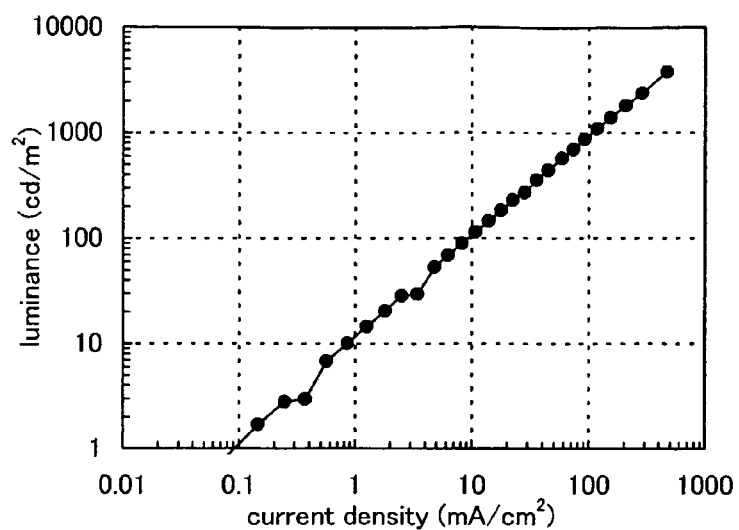
FIGS. 20A to 20C are diagrams showing initial characteristics of the light-emitting element manufactured in Embodiment 2.
Figure 20B:
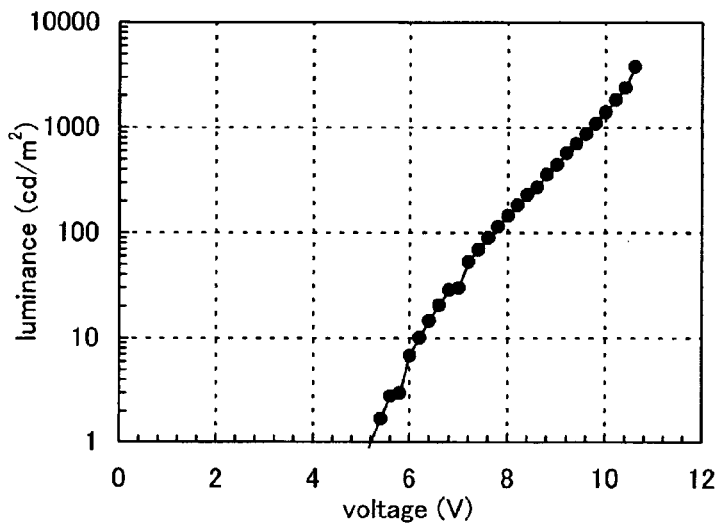
Figure 20C:
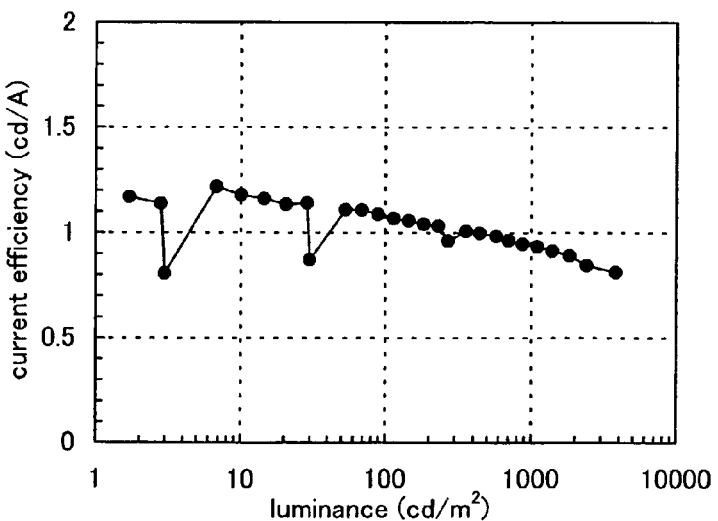

First, FIGS. 20A to 20C show initial characteristics of the manufactured light-emitting element. FIG. 20A shows current density-luminance characteristics, FIG. 20B shows voltage-luminance characteristics, and FIG. 20C shows luminance-current efficiency characteristics. From the voltage-luminance characteristics, it is determined that light was emitted with a luminance of 440 cd/m$^2$ when a voltage of 9.0 V was applied, and that the luminous efficiency was 1.0 cd/A in that case. Further, the emission spectrum has a peak at a wavelength of 647 nm, and the element exhibits CIE chromaticity coordinates of (x, y)=(0.67, 0.32), from which it is determined that red or reddish luminescence with quite high color purity is provided due to Ir(Fdpq)$_2$(acac).

Next, the operational stability test was performed by constant current driving in which a current with a constant current value is applied for a certain period of time. As a test method, a current of a current density (44.3 mA/cm$^2$) required for emitting light with a luminance of 440 cd/m$^2$ in the initial condition was kept applied for a certain period of time to examine change in luminance with time. In the result, the luminance after a lapse of 3800 hours was kept at 68% of the luminance in the initial condition without reducing by half. From this result, it is determined that the light-emitting element according to the present invention is small reduced in luminance with time, and has a favorable lifetime.

Figure 21:
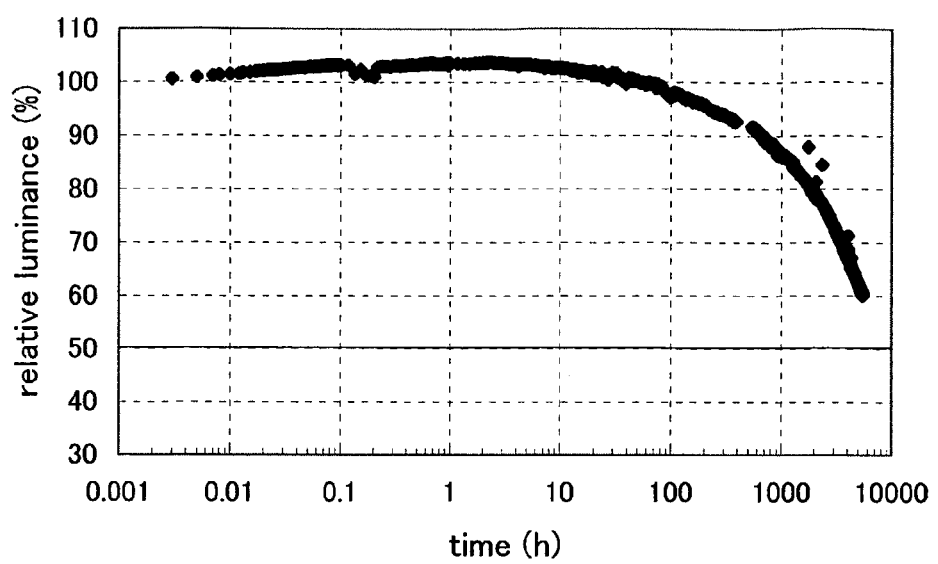
FIG. 21 is a diagram showing the result of an operational stability test for the light-emitting element manufactured in Embodiment 2.

Further, this operational stability test was performed ongoingly. FIG. 21 shows the obtained test result, where the horizontal axis indicates time (h), and the vertical axis indicates the ratio of a luminance to the luminance in the initial condition (that is, relative luminance (%)). Based on the result shown in FIG. 21, the half life of the luminance was estimated by an extrapolation method to approximate 8000 hours.

Embodiment 3

Figure 22:
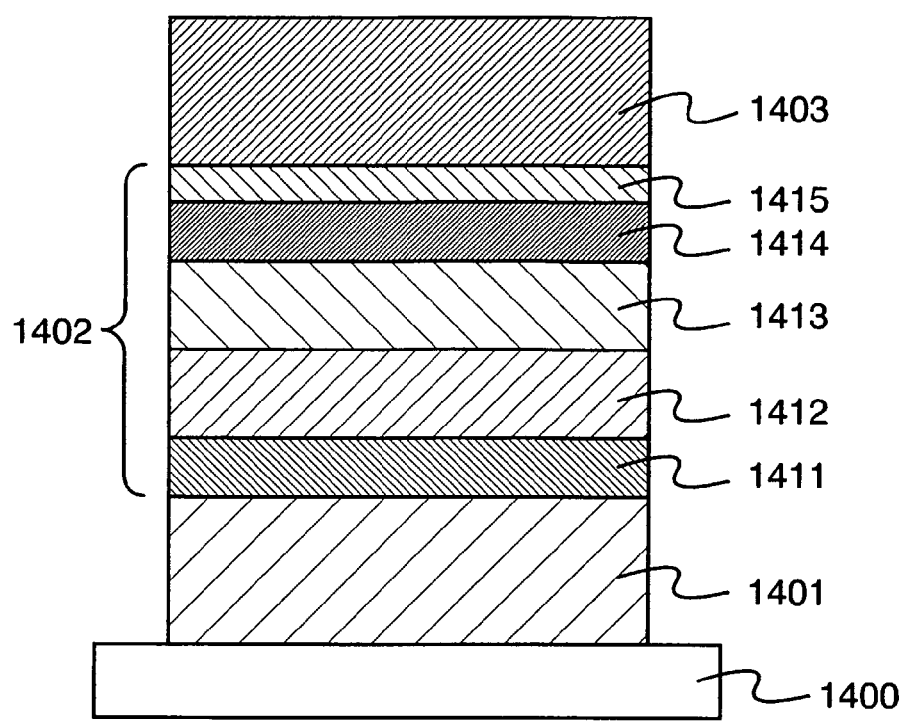
FIG. 22 is a diagram illustrating the structure of a light-emitting element in Embodiment 3 and a manufacturing method thereof.

In the present embodiment, the structure of a light-emitting element using Alq$_3$ as a host material according to the present invention and a manufacturing method thereof will be described with reference to FIG. 22.

First, on a substrate 1400, a first electrode 1401 was formed by deposition of indium tin oxide so as to be 110 nm in film thickness. It is to be noted that sputtering was used for the deposition.

Next, on the first electrode 1401, a hole injecting layer 1411 was formed by deposition of DNTPD so as to be 20 nm in film thickness. The deposition was performed by evaporation using resistance heating in such a way that the substrate on which the first electrode 1401 was formed was fixed in a substrate holder of a commercially produced vacuum deposition system with the surface at which the first electrode 1401 was formed down and DNTPD was put in an evaporation source provided in the vacuum deposition system.

Next, on the hole injecting layer 1411, a hole transporting layer 1412 was formed by deposition of α-NPD so as to be 10 nm in film thickness. The deposition was performed by evaporation in the same way as the formation of the hole injecting layer 1411.

Next, a light-emitting layer 1413 was formed by deposition of Alq$_3$ so that {2,3-bis(4-fluorophenyl) quinoxalinato} (acetylacetonato) iridium (III) (hereinafter, referred to as Ir(Fdpq)$_2$(acac)) represented by the formula (16) is included at a rate of 8 weight % in Alq$_3$. The deposition was performed by co-evaporation with Alq$_3$ and Ir(Fdpq)$_2$(acac) as evaporation sources so as to be 30 nm in film thickness. Here, Alq$_3$ functions as a host material.

Next, on the light-emitting layer 1413, an electron transporting layer 1414 was formed by deposition of Alq$_3$ so as to be 30 nm in film thickness. The deposition was performed by evaporation in the same way as the formation of the hole injecting layer 1411.

Next, on the electron transporting layer 1414, an electron injecting layer 1415 was formed by deposition of calcium fluoride (CaF$_2$) so as to be 1 nm in film thickness. The deposition was performed by evaporation in the same way as the formation of the hole injecting layer 1411.

In this way, a layer including a luminescent material 1402 was formed by stacking the hole injecting layer 1411, the hole transporting layer 1412, the light-emitting layer 1413, the electron transporting layer 1414, and the electron injecting layer 1415.

Next, on the electron injecting layer 1415, a second electrode 1403 was formed by deposition of aluminum so as to be 150 nm in film thickness. The deposition was performed by evaporation in the same way as the formation of the hole injecting layer 1411.

Further, the manufactured light-emitting element was moved into a glove box in a nitrogen atmosphere, and sealing was performed with the use of a sealing material in the glove box. After sealing of the light-emitting element, the light-emitting element was taken outside the glove box, and current density-luminance characteristics, voltage-luminance characteristics, and luminance-current efficiency characteristics in an initial condition were examined at room temperature (about 25° C.). In addition, an operational stability test by constant current driving was performed to examine the lifetime of the element.

Figure 23A:
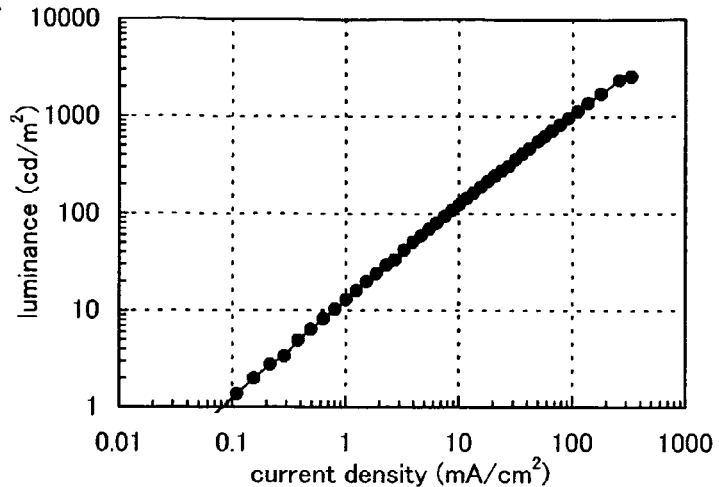
FIGS. 23A to 23C are diagrams showing initial characteristics of the light-emitting element manufactured in Embodiment 3.
Figure 23B:
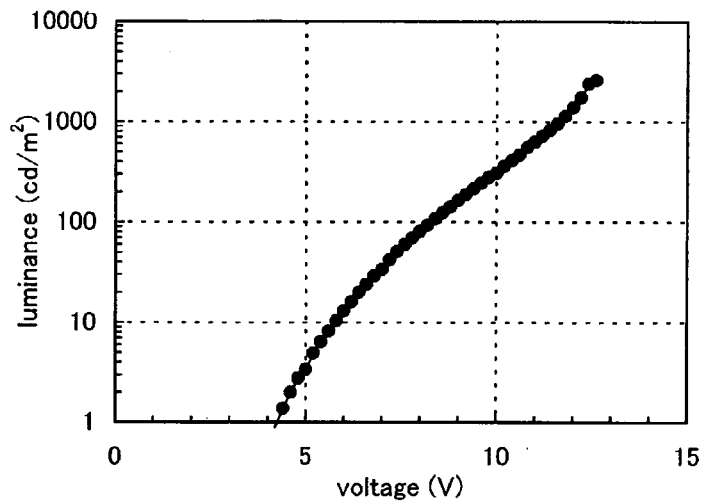
Figure 23C:
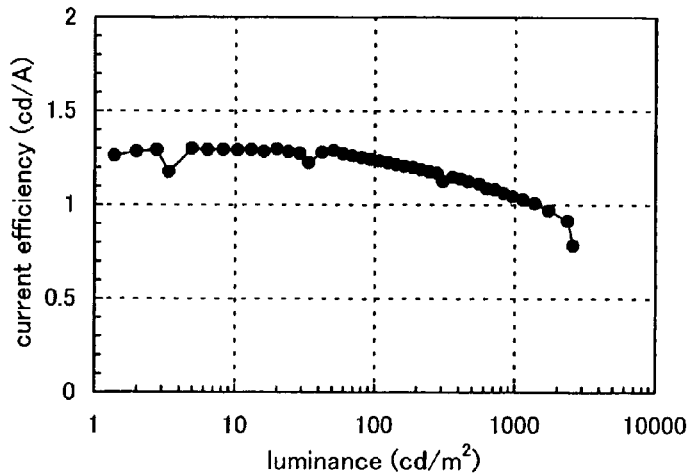

First, FIGS. 23A to 23C show initial characteristics of the manufactured light-emitting element. FIG. 23A shows current density-luminance characteristics, FIG. 23B shows voltage-luminance characteristics, and FIG. 23C shows luminance-current efficiency characteristics. From the voltage-luminance characteristics, it is determined that light was emitted with a luminance of 470 cd/m$^2$ when a voltage of 10.6 V was applied, and that the luminous efficiency was 1.1 cd/A in that case. Further, the emission spectrum has a peak at a wavelength of 659 nm, and the element exhibits CIE chromaticity coordinates of (x, y)=(0.70, 0.30), from which it is determined that red or reddish luminescence with quite high color purity is provided due to Ir(Fdpq)$_2$(acac).

Next, the operational stability test by constant current driving was performed. As a test method, a current of a current density (41.7 mA/cm$^2$) required for emitting light with a luminance of 470 cd/m$^2$ in the initial condition was kept applied for a certain period of time to examine change in luminance with time. In the result, the luminance after a lapse of 1400 hours was kept at 89% of the luminance in the initial condition without reducing by half. From this result, it is determined that the light-emitting element according to the present invention is small reduced in luminance with time, and has a favorable lifetime.

Figure 24:
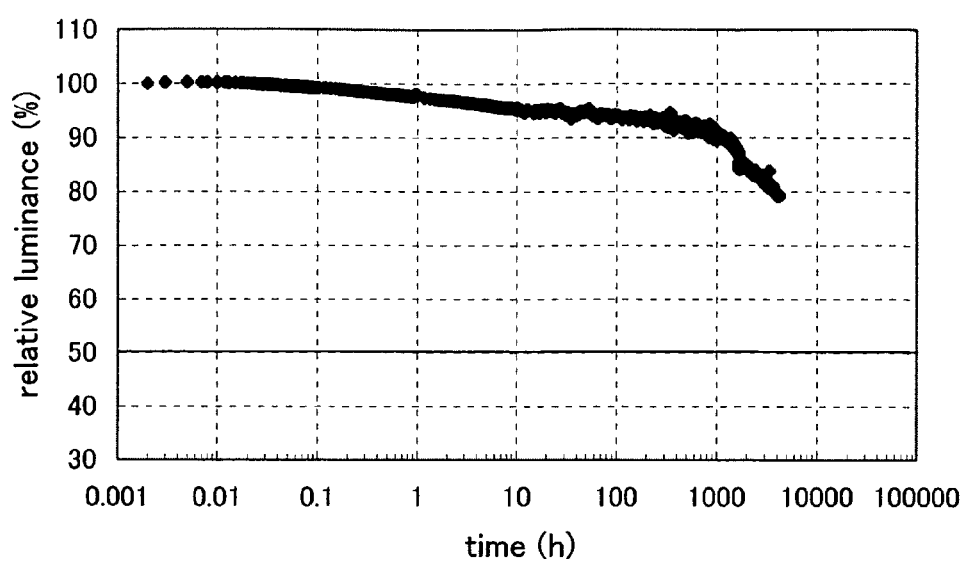
FIG. 24 is a diagram showing the result of an operational stability test for the light-emitting element manufactured in Embodiment 3.

Further, this operational stability test was performed ongoingly. FIG. 24 shows the obtained test result, where the horizontal axis indicates time (h), and the vertical axis indicates the ratio of a luminance to the luminance in the initial condition (that is, relative luminance (%)). Based on the result shown in FIG. 24, the half life of the luminance was estimated by an extrapolation method to approximate 34000 hours.

Embodiment 4

In the present embodiment, an example of a light-emitting element using two kinds of materials, α-NPD and Alq$_3$, as host materials will be described. The element in the present embodiment was manufactured in the same way as in Embodiment 3 except the structure of a light-emitting layer 1413 as described below.

The light-emitting layer 1413 was formed by three-source evaporation in which Ir(Fdpq)$_2$(acac) represented by the formula (16) was evaporated while setting the evaporation rate of α-NPD at 0.4 nm/s and setting the evaporation rate of Alq$_3$ at 0.1 nm/s. In this case, the addition amount of Ir(Fdpq)$_2$(acac) was controlled so as to be 8 weight % with respect to α-NPD. In addition, the film thickness of the light-emitting layer 1413 was made to be 30 nm. Here, α-NPD and Alq$_3$ function as host materials.

Further, the manufactured light-emitting element was moved into a glove box in a nitrogen atmosphere, and sealing was performed with the use of a sealing material in the glove box. After sealing of the light-emitting element, the light-emitting element was taken outside the glove box, and current density-luminance characteristics, voltage-luminance characteristics, and luminance-current efficiency characteristics in an initial condition were examined at room temperature (about 25° C.). In addition, an operational stability test by constant current driving was performed to examine the lifetime of the element.

Figure 25A:
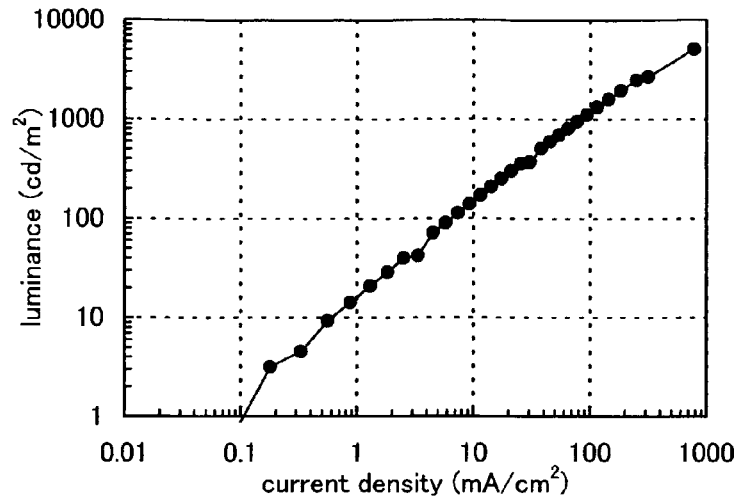
FIGS. 25A to 25C are diagrams showing initial characteristics of a light-emitting element manufactured in Embodiment 4.
Figure 25B:
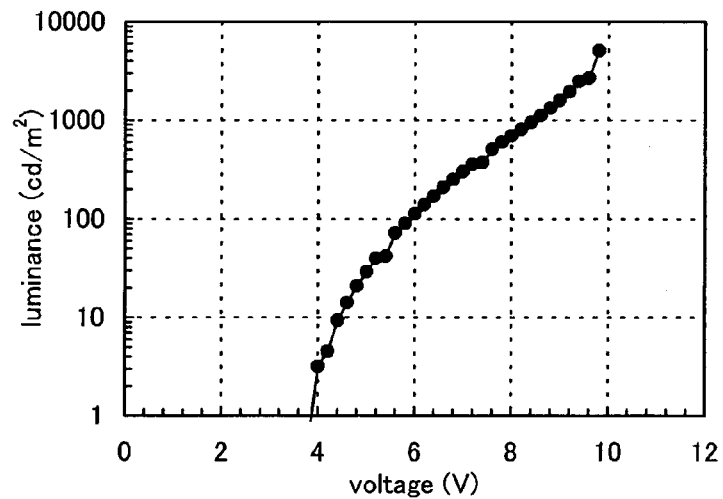
Figure 25C:
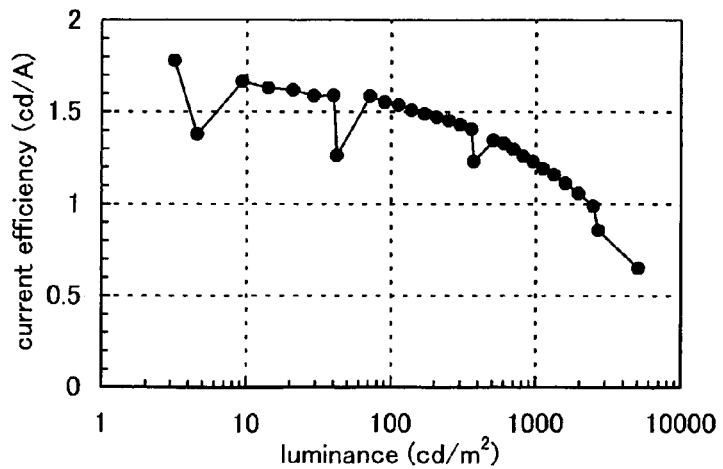

First, FIGS. 25A to 25C show initial characteristics of the manufactured light-emitting element. FIG. 25A shows current density-luminance characteristics, FIG. 25B shows voltage-luminance characteristics, and FIG. 25C shows luminance-current efficiency characteristics. From the result, it is determined that light was emitted with a luminance of 510 cd/m$^2$ when a voltage of 7.6 V was applied, and that the luminous efficiency was 1.3 cd/A in that case. Further, the emission spectrum has a peak at a wavelength of 640 nm, and the element exhibits CIE chromaticity coordinates of (x, y)= (0.70, 0.30), from which it is determined that red or reddish luminescence with quite high color purity is provided due to Ir(Fdpq)$_2$(acac).

Next, the operational stability test by constant current driving was performed. As a test method, a current of a current density (37.8 mA/cm$^2$) required for emitting light with a luminance of 510 cd/m$^2$ in the initial condition was kept applied for a certain period of time to examine change in luminance with time. In the result, the luminance after a lapse of 1200 hours was kept at 90% of the luminance in the initial condition without reducing by half. From this result, it is determined that the light-emitting element according to the present invention is small reduced in luminance with time, and has a favorable lifetime.

Figure 26:
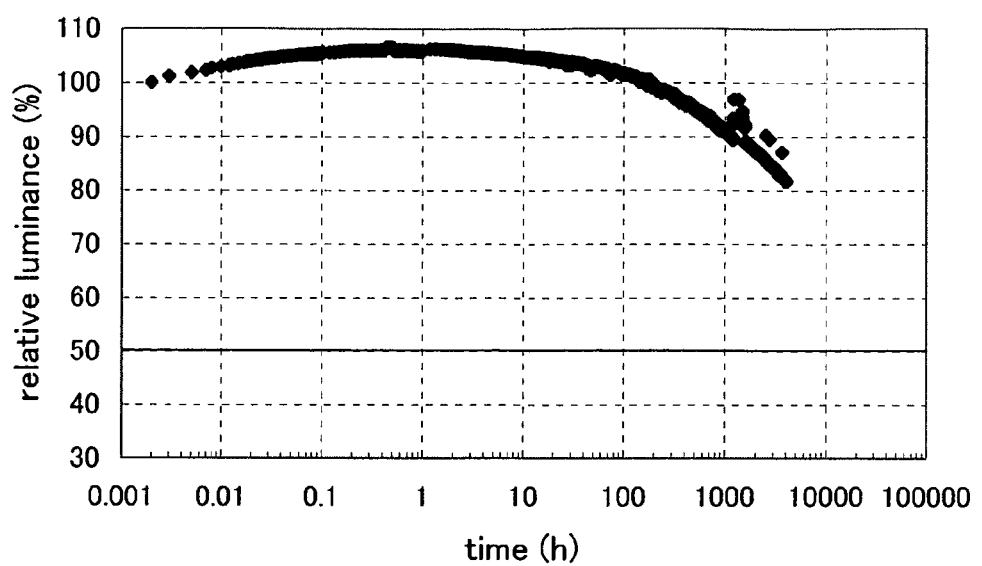
FIG. 26 is a diagram showing the result of an operational stability test for the light-emitting element manufactured in Embodiment 4.

Further, this operational stability test was performed ongoingly. FIG. 26 shows the obtained test result, where the horizontal axis indicates time (h), and the vertical axis indicates the ratio of a luminance to the luminance in the initial condition (that is, relative luminance (%)). Based on the result shown in FIG. 26, the half life of the luminance was estimated by an extrapolation method to approximate 40000 hours.

Embodiment 5

In the present embodiment, the structure of a light-emitting element using an organometallic complex according to the present invention as a luminescent material and a manufacturing method thereof will be described with reference to FIG. 19. The present embodiment is an example in which a light-emitting layer has the same structure as that in Embodiment 2, and the thickness and material of the other layer are optimized to further improve the luminous efficiency.

On a substrate 1300, indium tin oxide including silicon oxide was deposited by sputtering to form a first electrode 1301. The film thickness thereof was made to be 110 nm.

Next, the substrate 1300 on which the first electrode 1301 was formed was fixed in a substrate holder provided in a vacuum deposition system so that the surface at which the first electrode 1301 was formed was made down.

Next, on the first electrode 1301, 4,4'-bis[N-{4-(N,N-di-m-tolylamino) phenyl}-N-phenylamino]biphenyl (abbreviation: DNTPD) was deposited by evaporation using resistance heating so as to be 50 nm in film thickness to form a hole injecting layer 1311.

Next, on the hole injecting layer 1311, α-NPD was deposited by evaporation using resistance heating so as to be 10 nm in film thickness to form a hole transporting layer 1312.

Next, on the hole transporting layer 1312, Ir(Fdpq)$_2$(acac) and α-NPD were deposited by co-evaporation so as to be 30 nm in film thickness to form a light-emitting layer 1313. Here, the mass ratio of Ir(Fdpq)$_2$(acac) to α-NPD was made to be 1:0.08 (=α-NPD:Ir(Fdpq)$_2$(acac)). This ratio makes Ir(Fdpq)$_2$(acac) dispersed in a layer composed of α-NPD. It is to be noted that co-evaporation is an evaporation method in which evaporation is performed simultaneously from a plurality of evaporation sources in one processing room.

Next, on the light-emitting layer 1313, Alq$_3$ was deposited by evaporation using resistance heating so as to be 70 nm in film thickness to form an electron transporting layer 1314.

Next, on the electron transporting layer 1314, calcium fluoride was deposited by evaporation using resistance heating so as to be 1 nm in film thickness to form an electron injecting layer 1315.

Next, on the electron injecting layer 1315, aluminum was deposited by evaporation using resistance heating so as to be 200 nm in film thickness to form a second electrode 1303.

Figure 27A:
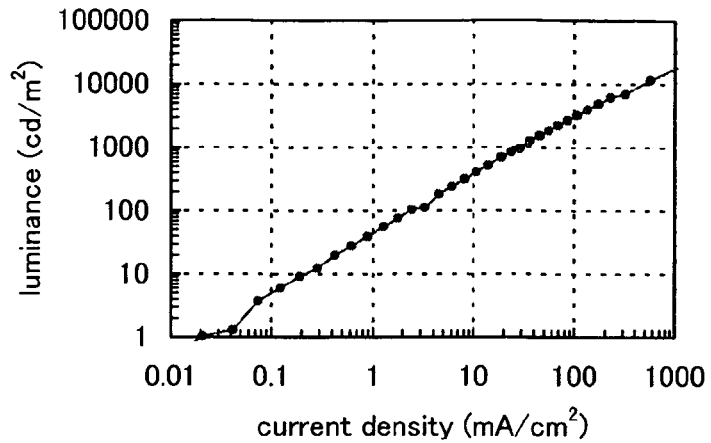
FIGS. 27A to 27C are diagrams showing operation characteristics of a light-emitting element manufactured in Embodiment 5.
Figure 27B:
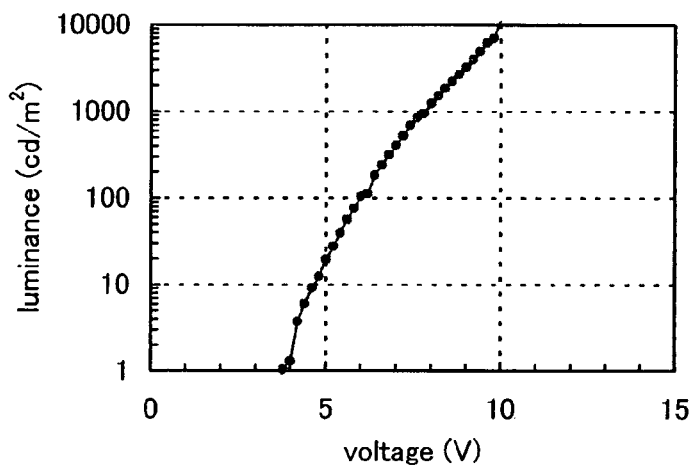
Figure 27C:
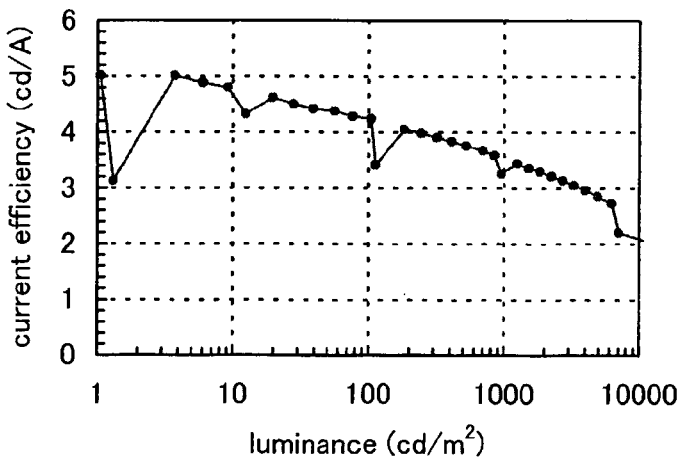

Sealing of the thus manufactured light-emitting element was performed in a nitrogen atmosphere. After that, in order to examine operation characteristics, a voltage was applied so that the potential of the first electrode 1301 was higher than the potential of the second electrode 1303. It is to be noted that the measurement was performed while maintaining at room temperature (25° C.). FIGS. 27A to 27C show results of this measurement. FIG. 27A shows a result of examining current density-luminance characteristics, FIG. 27B shows a result of examining voltage-luminance characteristics, and FIG. 27C shows a result of examining luminance-current efficiency characteristics. In FIG. 27A, the horizontal axis and the vertical axis respectively indicate a current density (mA/cm$^2$) and luminance (cd/m$^2$). In FIG. 27B, the horizontal axis and the vertical axis respectively indicate a voltage (V) and luminance (cd/m$^2$). In FIG. 27C, the horizontal axis and the vertical axis respectively indicate luminance (cd/m$^2$) and a current efficiency (cd/A).

From these results, it is determined that light was emitted with a luminance of 520 cd/m$^2$ when a voltage of 7.2 V was applied. The current efficiency in this case was 3.8 cd/A. Further, the emission spectrum has a peak at a wavelength of 644 nm, and the element exhibits CIE chromaticity coordinates of (x, y)=(0.66, 0.33), from which it is determined that red or reddish luminescence with quite high color purity is provided due to Ir(Fdpq)$_2$(acac).

Next, change in luminance with time was examined by an operational stability test. The operational stability test was performed in such a way that a current of a current density (13.9 mA/cm$^2$ in the case of the light-emitting element in the present embodiment) required for emitting light with a luminance of 520 cd/m$^2$ in the initial condition was kept applied for a certain period of time and the luminance was measured at each elapsed time. It is to be noted that the test was performed while maintaining at room temperature (25° C.).

Figure 28:
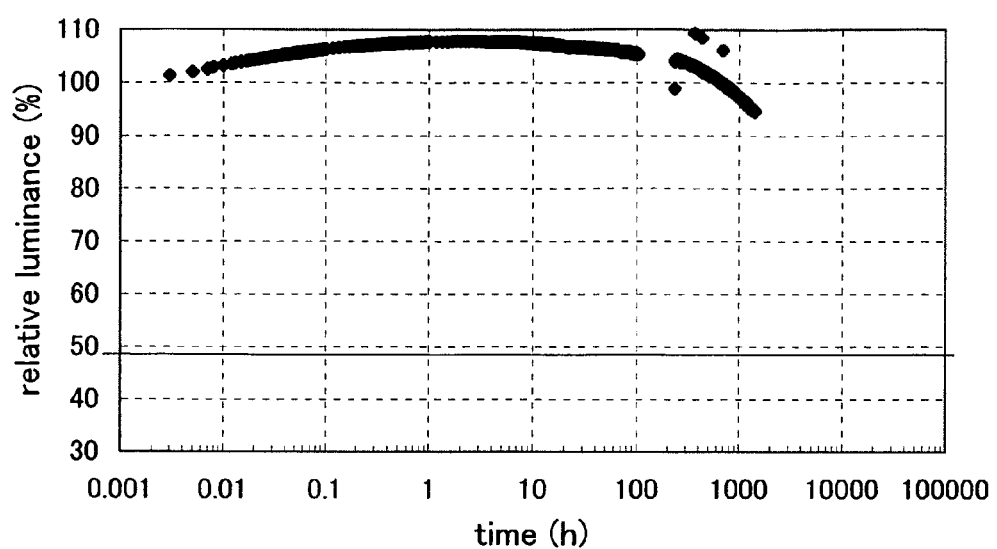
FIG. 28 is a diagram showing the result of an operational stability test for the light-emitting element manufactured in Embodiment 5.

FIG. 28 shows the result of the operational stability test. In FIG. 28, the horizontal axis indicates time (h), and the vertical axis indicates the ratio of a luminance to the luminance in the initial condition (that is, relative luminance (%)). From FIG. 28, it is determined that the relative luminance after a lapse of 1400 hours was 95%, that is, the initial luminance was degraded by 5%, without reaching half the initial luminance. Namely, it is determined that the light-emitting element according to the present invention is an element that has a favorable lifetime. In addition, based on the result shown in FIG. 28, the half life of the luminance was estimated by an extrapolation method to approximate 19000 hours.

Embodiment 6

In the present embodiment, the structure of a light-emitting layer using an organometallic complex according to the present invention as a luminescent material and a manufacturing method thereof will be described with reference to FIG. 22. Embodiment 6 is an example in which a light-emitting element has the same structure as that in Embodiment 3, and the thickness and material of the other layer are optimized to further improve the luminous efficiency.

On a substrate 1400, indium tin oxide including silicon oxide was deposited by sputtering to form a first electrode 1401. The film thickness thereof was made to be 110 nm.

Next, the substrate 1400 on which the first electrode 1401 was formed was fixed in a substrate holder provided in a vacuum deposition system so that the surface at which the first electrode 1401 was formed was made down.

Next, on the first electrode 1401, DNTPD was deposited by evaporation using resistance heating so as to be 50 nm in film thickness to form a hole injecting layer 1411.

Next, on the hole injecting layer 1411, α-NPD was deposited by evaporation using resistance heating so as to be 10 nm in film thickness to form a hole transporting layer 1412.

Next, on the hole transporting layer 1412, $Ir(Fdpq)_2(acac)$ and $Alq_3$ were deposited by co-evaporation so as to be 30 nm in film thickness to form a light-emitting layer 1413. Here, the mass ratio of $Ir(Fdpq)_2(acac)$ to $Alq_3$ was made to be 1:0.08 (=$Alq_3$: $Ir(Fdpq)_2(acac)$). This ratio makes $Ir(Fdpq)_2(acac)$ dispersed in a layer composed of $Alq_3$. It is to be noted that co-evaporation is an evaporation method in which evaporation is performed simultaneously from a plurality of evaporation sources in one processing room.

Next, on the light-emitting layer 1413, $Alq_3$ was deposited by evaporation using resistance heating so as to be 70 nm in film thickness to form an electron transporting layer 1414.

Next, on the electron transporting layer 1414, calcium fluoride was deposited by evaporation using resistance heating so as to be 1 nm in film thickness to form an electron injecting layer 1415.

Next, on the electron injecting layer 1415, aluminum was deposited by evaporation using resistance heating so as to be 200 nm in film thickness to form a second electrode 1403.

Figure 29A:
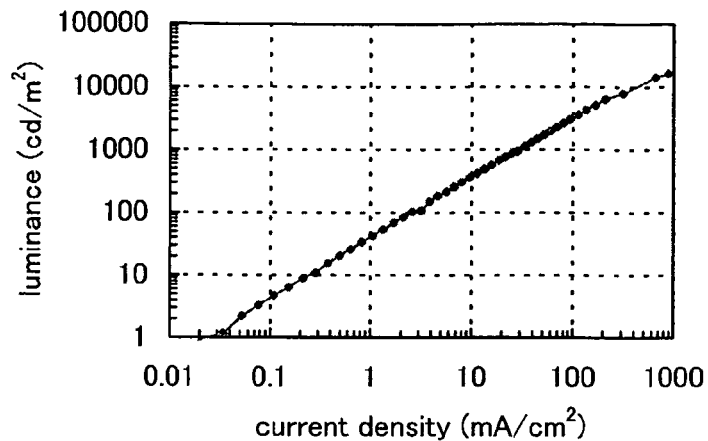
FIGS. 29A to 29C are diagrams showing operation characteristics of a light-emitting element manufactured in Embodiment 6.
Figure 29B:
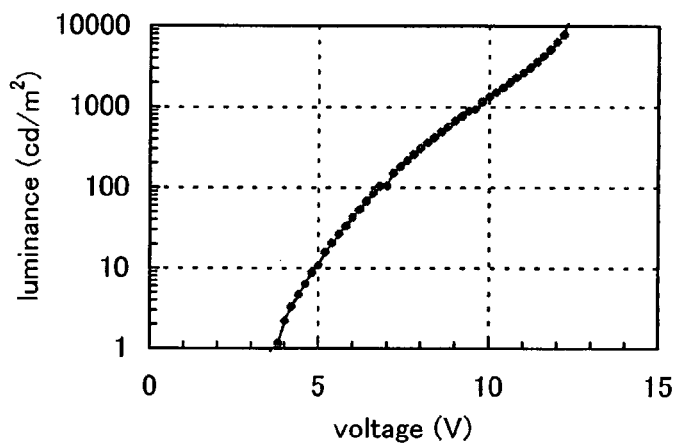
Figure 29C:
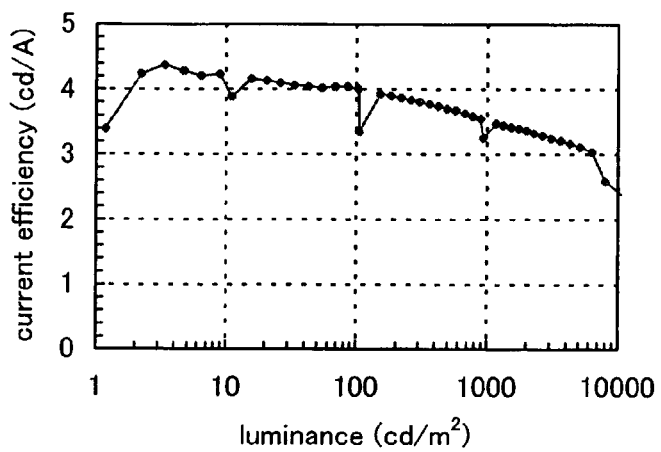

Sealing of the thus manufactured light-emitting element was performed in a nitrogen atmosphere. After that, in order to examine operation characteristics, a voltage was applied so that the potential of the first electrode 1401 was higher than the potential of the second electrode 1403. It is to be noted that the measurement was performed while maintaining at room temperature (25° C.). FIGS. 29A to 29C show results of this measurement. FIG. 29A shows a result of examining current density-luminance characteristics, FIG. 29B shows a result of examining voltage-luminance characteristics, and FIG. 29C shows a result of examining luminance-current efficiency characteristics. In FIG. 29A, the horizontal axis and the vertical axis respectively indicate a current density ($mA/cm^2$) and luminance ($cd/m^2$). In FIG. 29B, the horizontal axis and the vertical axis respectively indicate a voltage (V) and luminance ($cd/m^2$). In FIG. 29C, the horizontal axis and the vertical axis respectively indicate luminance ($cd/m^2$) and a current efficiency (cd/A).

From these results, it is determined that light was emitted with a luminance of 490 $cd/m^2$ when a voltage of 8.6 V was applied. The luminous efficiency in this case was 3.7 cd/A. Further, the emission spectrum has a peak at a wavelength of 656 nm, and the element CIE chromaticity coordinates of (x, y)=(0.64, 0.34), from which it is determined that red or reddish luminescence with quite high color purity is provided due to $Ir(Fdpq)_2(acac)$.

Next, change in luminance with time was examined by an operational stability test. The operational stability test was performed in such a way that a current of a current density (13.3 $mA/cm^2$ in the case of the light-emitting element in the present embodiment) required for emitting light with a luminance of 490 $cd/m^2$ in the initial condition was kept applied for a certain period of time and the luminance was measured at each elapsed time. It is to be noted that the test was performed while maintaining at room temperature (25° C.).

Figure 30:
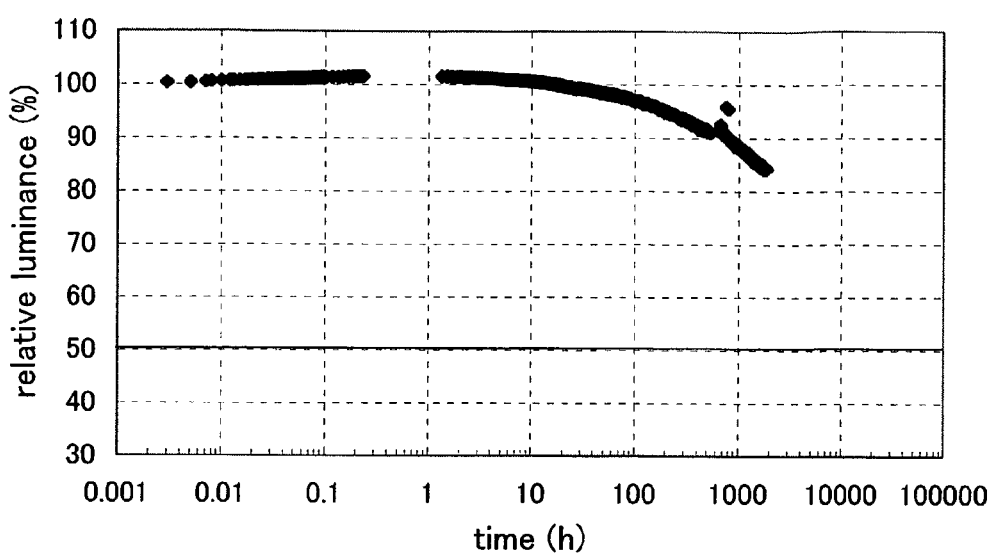
FIG. 30 is a diagram showing the result of an operational stability test for the light-emitting element manufactured in Embodiment 6.

FIG. 30 shows the result of the operational stability test. In FIG. 30, the horizontal axis indicates time (h), and the vertical axis indicates the ratio of a luminance to the luminance in the initial condition (that is, relative luminance (%)). From FIG. 30, it is determined that the relative luminance after a lapse of 1800 hours was 84%, that is, the initial luminance was degraded by 16%, without reaching half the initial luminance. Namely, it is determined that the light-emitting element according to the present invention is an element that has a favorable lifetime. In addition, based on the result shown in FIG. 30, the half life of the luminance was estimated by an extrapolation method to approximate 33000 hours.

Embodiment 7

The present embodiment is an example of a light-emitting element manufactured in the same way as in Embodiment 6 except changing the structures of the electron transporting layer 1414 and the electron injecting layer 1415 as described below, and will be described with reference to FIG. 22.

In the present embodiment, the film thickness of the electron transporting layer 1414 was made to be 30 nm. In addition, the electron injecting layer 1415 was formed by co-evaporation of $Alq_3$ and Li so as to be 40 nm in film thickness. Here, the mass ratio of Li to $Alq_3$ was made to be 1:0.01 (=$Alq_3$:Li).

Figure 31A:
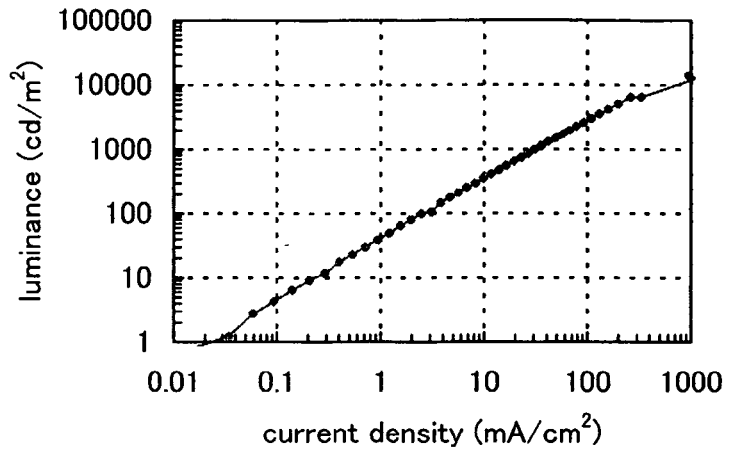
FIGS. 31A to 31C are diagrams showing operation characteristics of a light-emitting element manufactured in Embodiment 7.
Figure 31B:
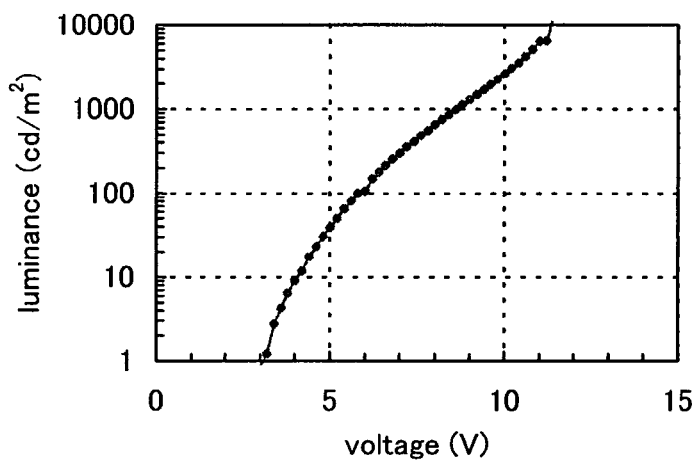
Figure 31C:
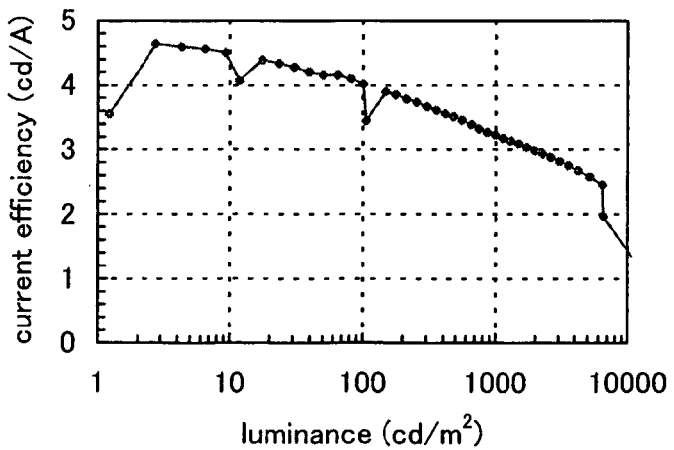

Sealing of the thus manufactured light-emitting element was performed in a nitrogen atmosphere. After that, in order to examine operation characteristics, a voltage was applied so that the potential of the first electrode 1401 was higher than the potential of the second electrode 1403. It is to be noted that the measurement was performed while maintaining at room temperature (25° C.). FIGS. 31A to 31C show results of this measurement. FIG. 31A shows a result of examining current density-luminance characteristics, FIG. 31B shows a result of examining voltage-luminance characteristics, and FIG. 31C shows a result of examining luminance-current efficiency characteristics. In FIG. 31A, the horizontal axis and the vertical axis respectively indicate a current density ($mA/cm^2$) and luminance ($cd/m^2$). In FIG. 31B, the horizontal axis and the vertical axis respectively indicate a voltage (V) and luminance (cd/m$^2$). In FIG. 31C, the horizontal axis and the vertical axis respectively indicate luminance (cd/m$^2$) and a current efficiency (cd/A).

From these results, it is determined that light was emitted with a luminance of 480 cd/m$^2$ when a voltage of 7.6 V was applied. The current efficiency in this case was 3.5 cd/A. Further, the emission spectrum has a peak at a wavelength of 656 nm, and the element exhibits CIE chromaticity coordinates of (x, y)=(0.66, 0.33), from which it is determined that red or reddish luminescence with quite high color purity is provided due to Ir(Fdpq)$_2$(acac).

Figure 32:
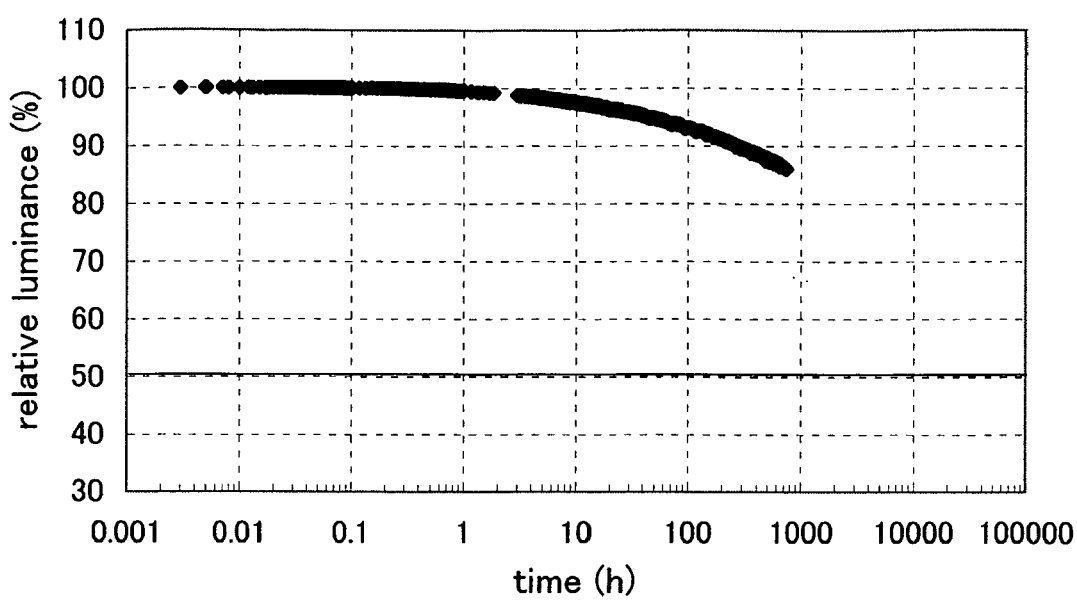
FIG. 32 is a diagram showing the result of an operational stability test for the light-emitting element manufactured in Embodiment 7.

Next, change in luminance with time was examined by an operational stability test. The operational stability test was performed in such a way that a current of a current density (13.7 mA/cm$^2$ in the case of the light-emitting element in the present embodiment) required for emitting light with a luminance of 480 cd/m$^2$ in the initial condition was kept applied for a certain period of time and the luminance was measured at each elapsed time. It is to be noted that the test was performed while maintaining at room temperature (25° C.). FIG. 32 shows the result of the operational stability test. In FIG. 32, the horizontal axis indicates time (h), and the vertical axis indicates the ratio of a luminance to the luminance in the initial condition (that is, relative luminance (%)). From FIG. 32, it is determined that the relative luminance after a lapse of 740 hours was 86%, that is, the initial luminance was degraded by 14%, without reaching half the initial luminance. Namely, it is determined that the light-emitting element according to the present invention is an element that has a favorable lifetime. In addition, based on the result shown in FIG. 32, the half life of the luminance was estimated by an extrapolation method to approximate 36000 hours.

Embodiment 8

Embodiment 8 is an example in which a light-emitting layer has the same structure as that in Embodiment 4, and the thickness and material of the other layer are optimized to further improve the luminous efficiency, and an example of a light-emitting element manufactured in the same way as in Embodiment 6 except changing the structures of the electron transporting layer 1414 and the electron injecting layer 1415 as described below. A description will be given with reference to FIG. 22.

In the present embodiment, the light-emitting layer 1413 was formed by three-source evaporation in which α-NPD, Alq$_3$, and Ir(Fdpq)$_2$(acac) were evaporated simultaneously. In this case, the deposition ratio was set so that the mass ratio is Alq$^3$:α-NPD:Ir(Fdpq)$_2$(acac)=1:1:0.08. In addition, the film thickness of the light-emitting layer 1413 was made to be 30 nm. Here, α-NPD and Alq$_3$ function as host materials. In addition, the film thickness of the electron transporting layer 1414 was made to be 60 nm.

Figure 33A:
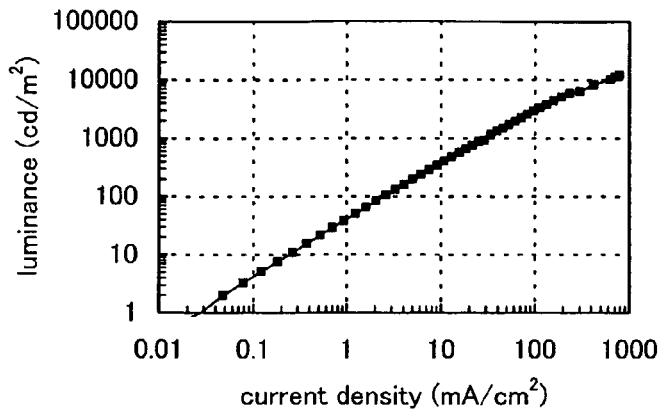
FIGS. 33A to 33C are diagrams showing operation characteristics of a light-emitting element manufactured in Embodiment 8
Figure 33B:
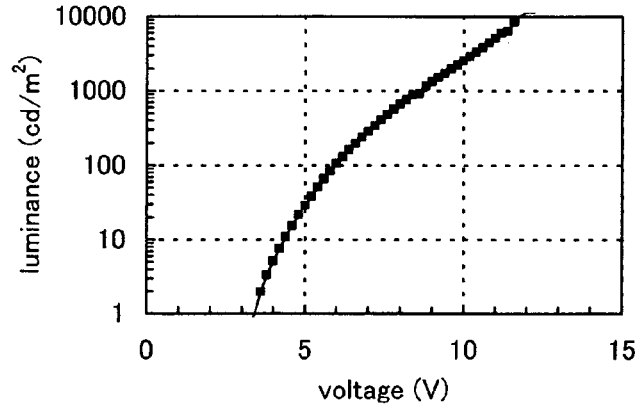
Figure 33C:
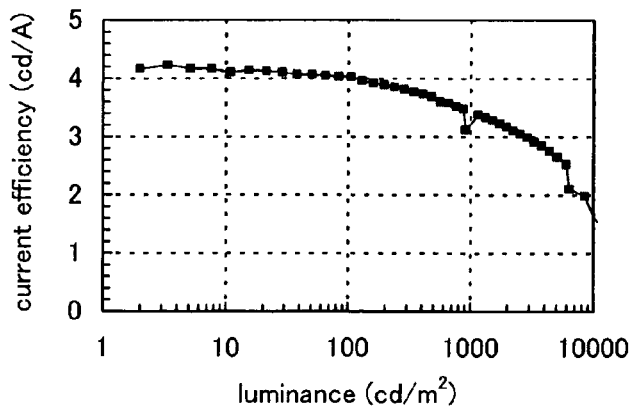

Sealing of the thus manufactured light-emitting element was performed in a nitrogen atmosphere. After that, in order to examine operation characteristics, a voltage was applied so that the potential of the first electrode 1401 was higher than the potential of the second electrode 1403. It is to be noted that the measurement was performed while maintaining at room temperature (25° C.). FIGS. 33A to 33C show results of this measurement. FIG. 33A shows a result of examining current density-luminance characteristics, FIG. 33B shows a result of examining voltage-luminance characteristics, and FIG. 33C shows a result of examining luminance-current efficiency characteristics. In FIG. 33A, the horizontal axis and the vertical axis respectively indicate a current density (mA/cm$^2$) and luminance (cd/m$^2$). In FIG. 33B, the horizontal axis and the vertical axis respectively indicate a voltage (V) and luminance (cd/m$^2$). In FIG. 33C, the horizontal axis and the vertical axis respectively indicate luminance (cd/m$^2$) and a current efficiency (cd/A).

From these results, it is determined that light was emitted with a luminance of 560 cd/m$^2$ when a voltage of 7.8 V was applied. The luminous efficiency in this case was 3.6 cd/A. Further, the emission spectrum has a peak at a wavelength of 651 nm, and the element exhibits CIE chromaticity coordinates of (x, y)=(0.68, 0.31), from which it is determined that red or reddish luminescence with quite high color purity is provided due to Ir(Fdpq)$_2$(acac).

Next, change in luminance with time was examined by an operational stability test. The operational stability test was performed in such a way that a current of a current density (15.6 mA/cm$^2$ in the case of the light-emitting element in the present embodiment) required for emitting light with a luminance of 560 cd/m$^2$ in the initial condition was kept applied for a certain period of time and the luminance was measured at each elapsed time. It is to be noted that the test was performed while maintaining at room temperature (25° C.).

Figure 34:
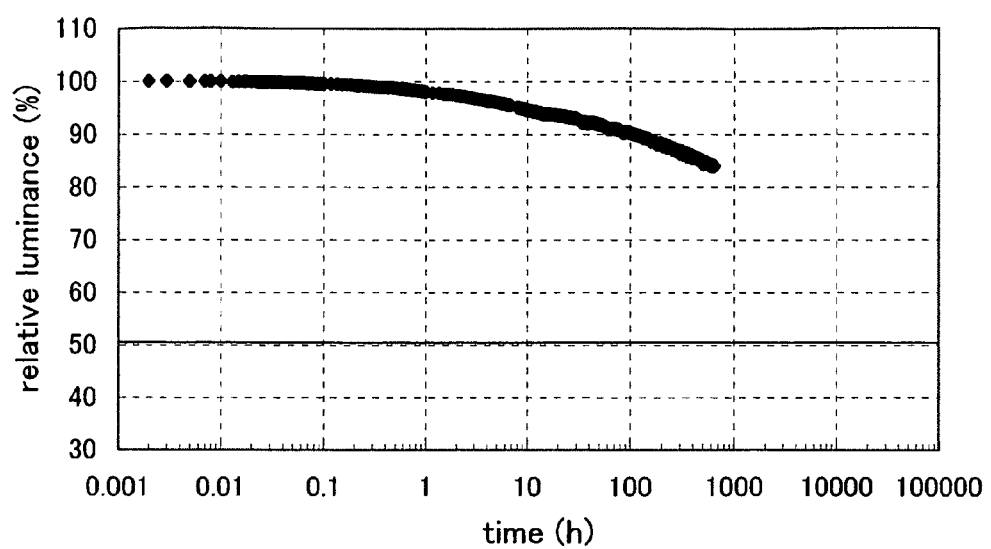
FIG. 34 is a diagram showing the result of an operational stability test for the light-emitting element manufactured in Embodiment 8.

FIG. 34 shows the result of the operational stability test. In FIG. 34, the horizontal axis indicates time (h), and the vertical axis indicates the ratio of a luminance to the luminance in the initial condition (that is, relative luminance (%)). From FIG. 34, it is determined that the relative luminance after a lapse of 640 hours was 84%, that is, the initial luminance was degraded by 16%, without reaching half the initial luminance. Namely, it is determined that the light-emitting element according to the present invention is an element that has a favorable lifetime. In addition, based on the result shown in FIG. 34, the half life of the luminance was estimated by an extrapolation method to approximate 68000 hours.

Embodiment 9

Figure 35A:
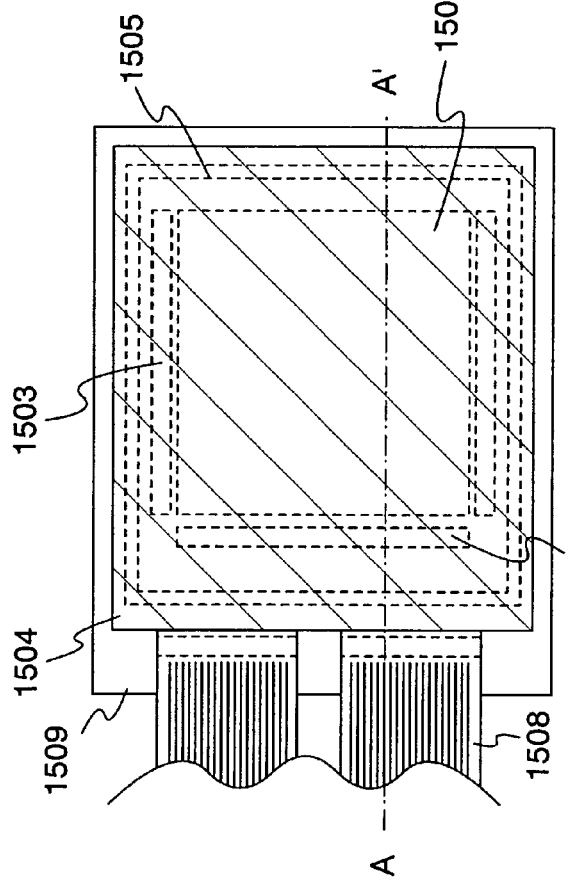
FIGS. 35A and 35B are diagrams illustrating a light-emitting device (Embodiment 9) that has a light-emitting element according to the present invention in a pixel portion.
Figure 35B:
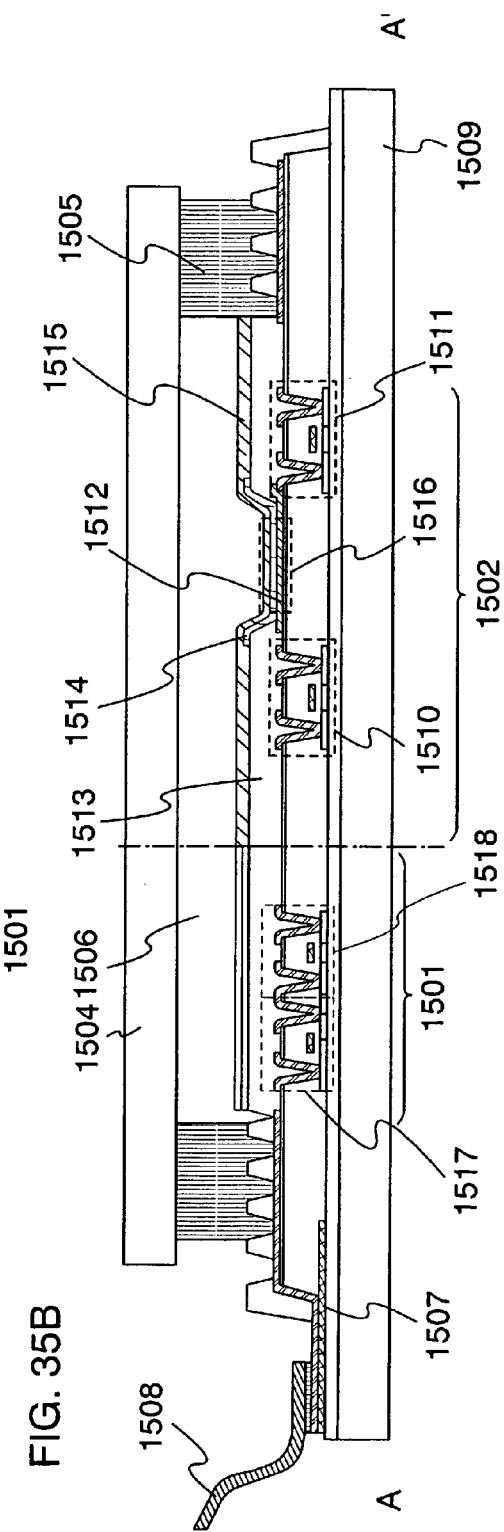

In the present embodiment, a light-emitting device that has a light-emitting element according to the present invention in a pixel portion will be described with reference to FIGS. 35A and 35B. FIG. 35A is a top view showing the light-emitting device and FIG. 35B is a cross-sectional view taken along line A-A' in FIG. 35A. Reference numeral 1501 indicated by a dotted line denotes a driver circuit portion (a source side driver circuit), reference numeral 1502 denotes a pixel portion, and reference numeral 1503 denotes a driver circuit portion (a gate side driver circuit). In addition, reference numerals 1504 and 1505 denote a sealing substrate and a sealing material, respectively. The inside 1506 surrounded by the sealing material 1505 is a space.

Further, reference numeral 1507 denotes a wiring for transmitting signals to be input to the source side driver circuit 1501 and the gate side driver circuit 1503, and receives signals such as a video signal, a clock signal, a start signal, and a reset signal from an FPC (Flexible Printed Circuit) 1508 that serves as an external input terminal. It is to be noted that although only the FPC is shown in the FIGure here, a printed wiring board (PWB) may be attached to this FPC. The light-emitting device according to the present invention includes not only a light-emitting device body but also a state in which an FPC or a PWB is attached thereto.

Next, the sectional structure will be explained with reference to FIG. 35B. Although the driver circuits and the pixel portion are formed over a substrate 1509, the source side driver circuit 1501 as the driver circuit portion and the pixel portion 1502 are shown here.

In the source side driver circuit 1501, a CMOS circuit is formed by a combination of an n-channel TFT 1517 and a p-channel TFT 1518. The TFTs forming the driver circuit may be formed by a known CMOS circuit, PMOS circuit, or NMOS circuit. Although the present embodiment shows a driver integrated type in which a driver circuit is formed over a substrate, which is not always necessary, the driver circuit can be formed not over the substrate but outside the substrate.

The pixel portion 1502 has a plurality of pixels, each including a switching TFT 1510, a current controlling TFT 1511, and a first electrode 1512 electrically connected to a drain of the controlling TFT 1511. In addition, an insulator 1513 is formed to cover an edge of the first electrode 1512. Here, a positive photosensitive acrylic resin film is used to form the insulator 1513.

Besides, in order to obtain a favorable coverage, the insulator 1513 is formed to have a top portion or a bottom potion with a curved surface that has a curvature. For example, in the case of using positive photosensitive acrylic as a material for the insulator 1513, it is preferable that only a top portion of the insulator 1513 have a curved surface with a curvature radius (0.2 to 3 μm). In addition, any of a negative photosensitive material that becomes insoluble in an etchant by light and a positive photosensitive material that becomes soluble in an etchant by light can be used for the insulator 1513. Further, it is possible to use not only organic substances but also inorganic substances as a material for the insulator 1513, for example, silicon oxide and silicon oxynitride can be used.

On the first electrode 1512, a layer 1514 including a luminescent material and a second electrode 1515 are formed. Here, as a material to be used for the first electrode 1512 that functions as an anode, it is preferable to use a material that has a large work function. For example, in addition to single layers such as a film including indium tin oxide, a film including indium tin oxide containing silicon oxide, a film including indium zinc oxide, a titanium nitride film, a chromium film, a tungsten film, a Zn film, and a Pt film, laminated structures such as a laminate of a titanium nitride film and a film including aluminum as its main component and a three-layer structure of a titanium nitride film, a film including aluminum as its main component, and a titanium nitride film can be used. When a laminated structure is used, it is possible to have a lower resistance as a wiring, take favorable ohmic contact, and function as an anode.

In addition, the layer 1514 including the luminescent material is formed by evaporation using an evaporation mask or by inkjet. The layer 1514 including the luminescent material includes an organometallic complex according to the present invention. As a material to be used in combination with the organometallic complex, low molecular weight materials, middle molecular weight materials (including an oligomer and a dendrimer) or polymer materials may be used. In addition, as a material to be used for the layer including the luminescent material, it is often the case that an organic material is used for a single layer or a laminate. However, the present invention includes a structure in which an inorganic compound is used for a part of a film including an organic compound.

Further, as a material to be used for the second electrode (cathode) 1515 formed on the layer 1514 including the luminescent material, a material that has a small work function, for example, Al, Ag, Li, or Ca, an alloy thereof such as Mg:Ag, Mg:In, Al:Li, or a metal compound such as $CaF_2$ or CaN, may be used. In the case of transmitting light generated in the layer 1514 including the luminescent material through the second electrode 1515, it is preferable to use a laminate of a metal thin film that has a thinned film thickness and a transparent conductive film (for example, an alloy of indium oxide and tin oxide (ITO), an ally of indium oxide and zinc oxide ($In_2O_3$—ZnO), or zinc oxide (ZnO)) as the second electrode (cathode) 1515.

Further, the sealing substrate 1504 and the substrate 1509 are bonded with the sealing material 1505 to have a structure where a light-emitting element 1516 is provided in the space surrounded by the substrate 1509, the sealing substrate 1504, and the sealing material 1505. The space 1506 also includes a structure of filling with the sealing material 1505 in addition to a case of filling with an inert gas (for example, nitrogen or argon).

It is to be noted that it is preferable to use an epoxy resin for the sealing material 1505. In addition, it is desirable to use a material that hardly allows permeation of moisture or oxygen. Further, as a material to be used for the sealing substrate 1504, a plastic substrate composed of FRP (Fiberglass-Reinforced Plastics), PVF (polyvinylfluoride), Mylar, polyester, acrylic, or the like can be used besides a glass substrate and a quarts substrate.

As described above, a light-emitting device that has a light-emitting element according to the present invention can be obtained. In the above-described light-emitting device according to the present invention, the light-emitting element according to the present invention is excellent in luminous efficiency, and can be driven for a long time. Therefore, the light-emitting device has a long lifetime with low power consumption.

Embodiment 10

In the present example, various electric apparatuses completed by using a light-emitting device that has a light-emitting element according to the present invention will be described. Since a light-emitting device according to the present invention has a long lifetime with low power consumption, an electronic device using the light-emitting device can be also used for a long time by reducing, for example, power for a display portion and a lighting portion.

Electric devices manufactured by using a light-emitting device formed according to the present invention include a television, a video camera, a digital camera, a goggle-type display (head mount display), a navigation system, a sound reproduction device (such as an in-car audio system or an audio set), a laptop personal computer, a game machine, a personal digital assistance (such as a mobile computer, a cellular phone, a portable game machine, or an electronic book), an image reproduction device equipped with a recording medium (specifically, a device equipped with a display device, which can reproduce a recording medium such as a digital versatile disc (DVD) and display the image), and a lighting apparatus. Some specific examples of the electric devices will be described with reference to FIGS. 36A to 36E. The electronic devices using a light-emitting device according to the present invention are not limited to these exemplified specific examples.

FIG. 36A is a display device, which includes a frame body 1600, a support 1601, a display portion 1602, a speaker portion 1603, and a video input terminal 1604. A light-emitting device formed according to the present invention is used for the display portion 1602 to manufacture the display device. The display device includes all devices for displaying information such as for a personal computer, for receiving TV broad casting, and for displaying an advertisement.

FIG. 36B is a laptop personal computer, which includes a main body 1700, a frame body 1701, a display portion 1702, a keyboard 1703, an external connection port 1704, and pointing mouse 1705. A light-emitting device that has a light-emitting element according to the present invention is used for the display portion 1702 to manufacture the laptop computer.

FIG. 36C is a video camera, which includes a main body 1800, a display portion 1801, a frame body 1802, an external connection port 1803, a remote-control receiving portion 1804, an image receiving portion 1805, a battery 1806, a voice input portion 1807, operation keys 1808, and an eye piece 1809. A light-emitting device that has a light-emitting element according to the present invention is used for the display portion 1801 to manufacture the video camera.

FIG. 36D is a desk lighting apparatus, which includes a lighting portion 1900, a shade 1901, a variable arm 1902, a support 1903, a pedestal 1904, and a power source 1905. A light-emitting device formed by using a light-emitting element according to the present invention is used for the lighting portion 1900 to manufacture the desk lighting apparatus. It is to be noted that the lighting apparatus includes a lighting apparatus to be fixed to the ceiling and a wall-hung lighting apparatus.

FIG. 36E is a cellular phone, which includes a main body 2000, a frame body 2001, a display portion 2002, a voice input portion 2003, a voice output portion 2004, an operation key 2005, an external connection port 2006, and an antenna 2007. A light-emitting device that has a light-emitting element according to the present invention is used for the display portion 2002 to manufacture the cellular phone.

As described above, an electric device that has a light-emitting device using a light-emitting element according to the present invention can be obtained. In addition, in each of the above-described electronic devices according to the present invention, the light-emitting element according to the present invention is excellent in luminous efficiency, and can be driven for a long time. Therefore, the electronic devices can be driven for a long time with low power consumption, which is economical.

Embodiment 11

In the present embodiment, a case of using a luminescent material according to the present invention and another luminescent material to form a white light-emitting element will be described.

In order to form a white light-emitting element with the use of a luminescent material according to the present invention, it is necessary to provide a plurality of light-emitting regions between a first electrode and second electrode and control the luminescent color from each light-emitting region so as to obtain white light as a whole. However, when a light-emitting region including a luminescent material according to the present invention, that is, a red or reddish phosphorescent material, is formed so as to come in contact with another light-emitting region including another luminescent material, energy transfer occurs between the luminescent material, and there is a possibility that a phenomenon occurs, where the phenomenon is that light is emitted more strongly as for only the luminescent color of either one luminescent material while light is emitted more weakly as for the luminescent color of the other luminescent material. In order to improve this imbalance of the luminescent colors, a separation layer may be provided between the light-emitting regions. The separation layer is required to have a light-transmitting property, and may be formed by using an electron transporting material or a hole electron transporting material. Specifically, the electron transporting materials and hole transporting materials mentioned in the embodiment modes may be used.

Figure 37:
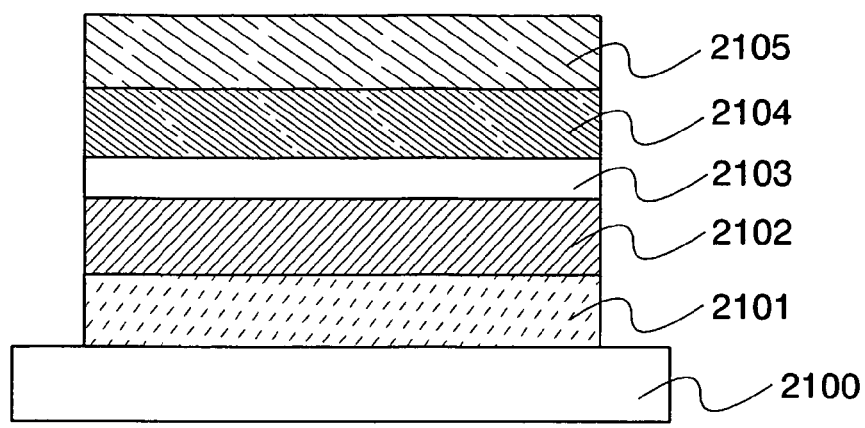
FIG. 37 is a diagram illustrating a structure example of a white light-emitting element (Embodiment 11)

Next, FIG. 37 shows one example of the structure of a white light-emitting element in the case of providing two light-emitting regions. In FIG. 37, there are a first light-emitting region 2102 and a second light-emitting region 2104 between a first electrode 2101 and a second electrode 2105, and there is a separation layer 2103 between the first light-emitting region 2102 and the second light-emitting region 2104. Reference numeral 2100 denotes a substrate. When a phosphorescent material according to the present invention is used for the first light-emitting region 2102, and a blue-green luminescent material is used for the second light-emitting region 2104, white light can be obtained as a whole.

The blue-green luminescent material for forming the second light-emitting region 2104 includes fluorescent materials such as perylene, 2,5,8,11-tetra-tert-butylperylene (abbreviation: TBP), 4,4'-bis(2-diphenylvinyl) biphenyl (DPVBi), 4,4'-bis[2-(N-ethylcarbazole-3-yl) vinyl]biphenyl (abbreviation: BCzVBi), bis(2-methyl-8-quinolinolato)-4-phenylphenolato-aluminum (abbreviation: BAlq), and bis(2-methyl-8-quinolinolato)-chlorogallium (abbreviation: $Gamq_2Cl$), and phosphorescent materials such as bis[2-(3,5-bis(trifluoromethyl)phenyl)pyridinato-N,$C^{2'}$]iridium (III) picolinate (Ir($CF_3$ ppy)$_2$(pic)), bis[2-(4',6'-difluorophenyl)pyridinato-N,$C^{2'}$]iridium (III) acetylacetonate (FIr(acac)), and bis[2-(4',6'-difluorophenyl)pyridinato-N,$C^{2'}$]iridium (III) picolinate (FIr(pic)).

The structure shown in FIG. 37 will be described specifically. On the substrate 2100, ITO to serve as the first electrode 2101 is deposited so as to be 110 nm in film thickness.

Next, the first light-emitting region 2102 is formed. Specifically, DNTPD that is a hole injecting material and α-NPD that is a hole transporting material are deposited to be 50 nm and 30 nm, respectively. After that, Ir(Fdpq)$_2$(acac) that is a red or reddish phosphorescent material according to the present invention and α-NPD are deposited by co-evaporation to be 30 nm in film thickness so that Ir(Fdpq)$_2$(acac) is included at 8 weight %.

Next, CBP is deposited to be 5 nm in film thickness as the separation layer 2103. After that, the second light-emitting region 2104 is formed. Specifically, Ir($CF_3$ ppy)$_2$(Pic) that is a blue-green phosphorescent material and CBP are deposited to be 25 nm in film thickness so that Ir($CF_3$ ppy)$_2$(Pic) is included at 8 weight %. Then, BCP that is a hole blocking material (and an electron transporting material) is deposited to be 10 nm, and further, Alq$_3$ is deposited to be 20 nm as an electron transporting layer. After that, calcium fluoride (abbreviation: CaF$_2$) is deposited to be 1 nm in film thickness as an electron injecting layer.

After that, Al is deposited so as to be 150 nm as the second electrode 2105.

In accordance with this process, a white light-emitting element using a phosphorescent material according to the present invention and a blue-green phosphorescent material is obtained. In the structure of FIG. 37, a bipolar material is used for the separation layer 2103. However, a hole transporting material, an electron transporting material, a hole blocking material, and the like may be used without limitation to the bipolar material. In addition, although an example of providing two light-emitting elements is shown in the present embodiment, more light-emitting regions may be provided in order to obtain white light as a whole.

Alternatively, in the case of using a blue-green fluorescent material to form a white light-emitting element, ITO is deposited to be 110 nm as the first electrode 2101, DNTPD that is a hole injecting material and α-NPD that is a hole transporting material are deposited respectively to be 50 nm and 30 nm, and for the first light-emitting region 2102, Ir(Fdpq)$_2$ (acac) that is a red or reddish phosphorescent material according to the present invention and α-NPD are deposited by co-evaporation to be 30 nm in film thickness so that Ir(Fdpq)$_2$(acac) is included at 8 weight %. After that, CBP is deposited to be 5 nm as the separation layer 2103, and for the second light-emitting region 2104, perylene that is a blue-green fluorescent material and BAlq are deposited to be 25 nm in film thickness so that perylene is included at 1 weight %. Then, Alq$_3$ is deposited to be 30 nm as an electron transporting layer. After that, CaF$_2$ is deposited to be 1 nm as an electron injecting layer, and finally, Al is deposited to be 150 nm as the second electrode 2105. In accordance with this process, a white light-emitting element using a red or reddish phosphorescent material and a blue-green fluorescent material can be obtained.

Embodiment 12

In the present embodiment, the structure of a white light-emitting element using a phosphorescent material according to the present invention, which is different from the structure in Embodiment 11, will be described with reference to FIG. 38.

Figure 38:
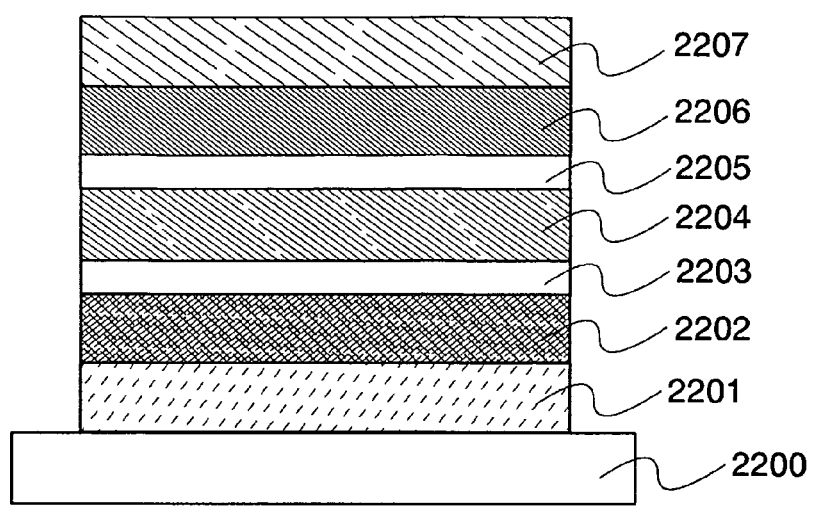
FIG. 38 is a diagram illustrating the structure of a white light-emitting element using a phosphorescent material, which is different from the structure in Embodiment 11 (Embodiment 12)

In FIG. 38, there are a first light-emitting region 2202, a second light-emitting region 2204, and a third light-emitting region 2206 between a first electrode 2201 and a second electrode 2207. Further, there is a carrier generation layer 2203 between the first light-emitting region 2202 and the second light-emitting region 2204, and there is a carrier generation layer 2205 between the second light-emitting region 2204 and the third light-emitting region 2206. When a phosphorescent material according to the present invention, a green or greenish luminescent material, and a blue or bluish luminescent material are used respectively for the first light-emitting region 2202, the second light-emitting region 2204, and the third light-emitting region 2206.

The blue or bluish luminescent material include fluorescent materials such as perylene, 2,5,8,11-tetra-tert-butylperylene (abbreviation: TBP), 1,1,4,4-tetraphenyl-1,3-butadiene (abbreviation: TPB), 9,9'-bianthryl (abbreviation: BiAnt), 9,10-diphenylanthracene (abbreviation: DPA), 9,10-di(2-naphthyl) anthracene (abbreviation: DNA), 9,10-di(2-naphthyl)-2-tert-butylanthracene (abbreviation: t-BuDNA), and phosphorescent materials such as bis[2-(4',6'-difluorophenyl)pyridinato-N,C$^{2'}$]iridium (III) tetrakis(1-pyrazolyl) borate (abbreviation: FIr$_6$).

The green or greenish luminescent material include fluorescent materials such as coumarin 6, coumarin 545T, N,N'-dimethylquinacridone (abbreviation: DMQd), 5,12-diphenyltetracene (abbreviation: DPT), and tris(8-quinolinolato) aluminum, and phosphorescent materials such as tris(2-phenylpyridinato-N,C$^{2'}$) iridium (abbreviation: Ir(ppy)$_3$), bis(2-phenylpyridinato-N,C$^{2'}$) iridium (III) acetylacetonate (abbreviation: Ir(ppy)$_2$(acac)), and bis[2-(4-methylphenyl) pyridinato-N, C$^{2'}$]iridium (III) acetylacetonate (abbreviation: Ir(tpy)$_2$(acac))

In addition, a transparent conductive film can be used for the carrier generation layer. Specifically, an indium tin oxide (abbreviation: ITO), an indium tin oxide containing silicon, and an indium oxide including zinc oxide at 2 to 20% can be given.

The structure shown in FIG. 38 will be described specifically. On a substrate 2200, an ITO to serve as the first electrode 2201 is deposited to be 110 nm in film thickness. Specifically, as a hole injecting layer, molybdenum oxide and α-NPD are deposited by co-evaporation to be 50 nm in film thickness so that the mass ratio of molybdenum oxide to α-NPD is 1:0.25 (=α-NPD:molybdenum oxide), and α-NPD that is a hole transporting material is deposited to be 10 nm. Next, the first light-emitting region 2202 is formed. Specifically, Ir(Fdpq)$_2$(acac) that is a red or reddish phosphorescent material according to the present invention and Alq$_3$ are deposited by co-evaporation to be 37.5 nm in film thickness so that Ir(Fdpq)$_2$(acac) is included at 8 weight %. Alq$_3$ is deposited to be 27.5 nm as an electron transporting layer, and as an electron injecting layer, BCP and Li are deposited by co-evaporation to be 10 nm in film thickness so that the mass ratio of Li to BCP is 1:0.005 (=BCP: Li). Then, ITO is deposited to be 20 nm in film thickness as the carrier generation layer (a transparent conductive film) 2203.

On the transparent conductive film 2203, the second light-emitting region 2204 is formed. Specifically, as a hole injecting layer, α-NPD and molybdenum oxide are deposited by co-evaporation to be 50 nm in film thickness so that the mass ratio of molybdenum oxide to α-NPD is 1:0.25 (=α-NPD: molybdenum oxide), and α-NPD is deposited to be 10 nm as a hole transporting material. Then, as a green or greenish luminescent material for the second light-emitting region 2204, coumarin 6 and Alq$_3$ are deposited by co-evaporation to be 37.5 nm in film thickness. Then, Alq$_3$ is deposited to be 27.5 nm as an electron transporting layer, and as an electron injecting layer, and BCP and Li are deposited by co-evaporation to be 10 nm in film thickness so that the mass ratio of Li to BCP is 1:0.005 (=BCP: Li). Then, ITO is deposited to be 20 nm in film thickness as the carrier generation layer (a transparent conductive film) 2205.

On the transparent conductive film 2205, the third light-emitting region 2206 is formed in a similar way. Specifically, as a hole injecting layer, α-NPD and molybdenum oxide are deposited by co-evaporation to be 50 nm in film thickness so that the mass ratio of molybdenum oxide to α-NPD is 1:0.25 (=α-NPD:molybdenum oxide), and α-NPD that is a hole transporting material is deposited to be 10 nm. Then, as a blue or bluish luminescent material for the third light-emitting region 2206, t-BuDNA is deposited to be 37.5 nm in film thickness. Then, Alq$_3$ is deposited to be 27.5 nm as an electron transporting layer, and as an electron injecting layer, BCP and Li are deposited by co-evaporation to be 10 nm in film thickness so that the mass ratio of Li to BCP is 1:0.005 (=BCP: Li). Then, as the second electrode 2207, aluminum is deposited to be 200 nm in film thickness. In this way, a white light-emitting element into which the red or reddish phosphorescent material according to the present invention is introduced can be obtained.

Although an example of providing three light-emitting regions is shown in the present embodiment, two light-emitting regions, or four or more light-emitting region may be provided in order to obtain white light as a whole.

Embodiment 13

Figure 39:
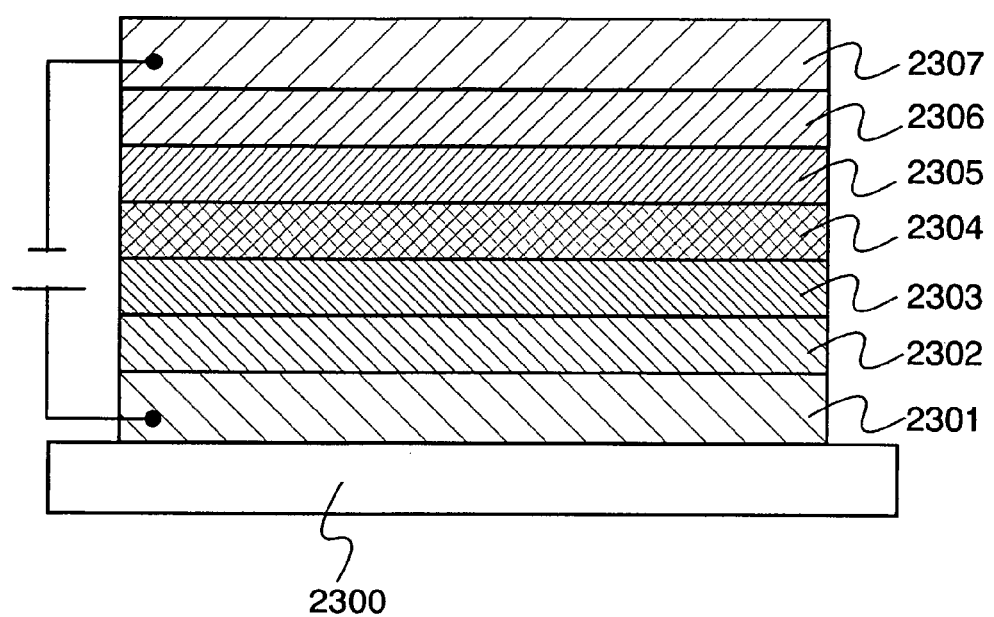
FIG. 39 is a diagram illustrating a light-emitting element using an organometallic complex as a luminescent material and a manufacturing method thereof (Embodiment 13)

In the present embodiment, the structure of a light-emitting element using an organometallic complex according to the present invention as a luminescent material and a manufacturing method thereof will be described with reference to FIG. 39.

On a substrate 2300, indium tin oxide was deposited by sputtering to form a first electrode 2301. The film thickness was made to be 110 nm.

Next, the substrate 2300 on which the first electrode 2301 was formed was fixed in a substrate holder provided in a vacuum deposition system so that the surface at which the first electrode 2301 was formed was made down.

Next, on the first electrode 2301, copper phthalocyanine was deposited by evaporation using resistance heating so as to be 20 nm in film thickness to form a hole injecting layer 2302.

Next, on the hole injecting layer 2302, α-NPD was deposited by evaporation using resistance heating so as to be 40 nm in film thickness to form a hole transporting layer 2303.

Next, on the hole transporting layer 2303, Ir(Fdpq)$_2$(acac) and TPAQn were deposited by co-evaporation so as to be 30 nm in film thickness to form a light-emitting layer 2304. Here, Ir(Fdpq)$_2$(acac) and TPAQn were deposited so that Ir(Fdpq)$_2$(acac) was included at a rate of 8 weight % in a layer composed of TPAQn. This rate makes Ir(Fdpq)$_2$(acac) dispersed in the layer composed of TPAQn. It is to be noted that co-evaporation is an evaporation method in which evaporation is performed simultaneously from a plurality of evaporation sources.

Next, on the light-emitting layer 2304, Alq$_3$ was deposited by evaporation using resistance heating so as to be 30 nm in film thickness to form an electron transporting layer 2305.

Next, on the electron transporting layer 2305, calcium fluoride was deposited by evaporation using resistance heating so as to be 2 nm in film thickness to form an electron injecting layer 2306.

Next, on the electron injecting layer 2306, aluminum was deposited by evaporation using resistance heating so as to be 150 nm in film thickness to form a second electrode 2307.

Figure 40:
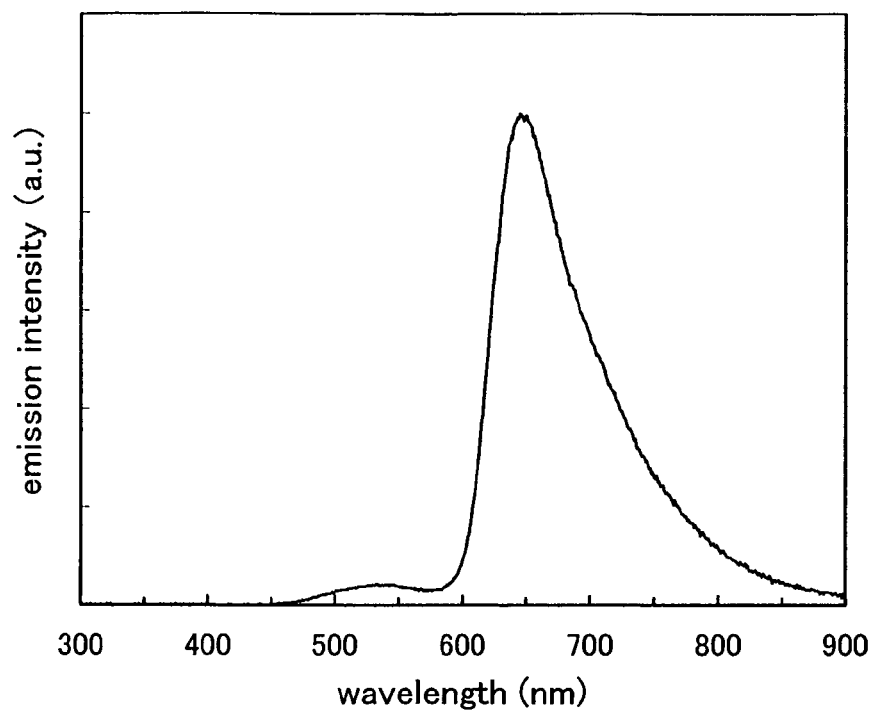
FIG. 40 is a diagram showing an emission spectrum of the light-emitting element in Embodiment 13.

A voltage was applied to the thus manufactured light-emitting element so that the potential of the first electrode 2301 was higher than the potential of the second electrode 2307. Then, light was emitted with a luminance of 466 cd/m$^2$ when a voltage of 7.6 V was applied. The current efficiency in this case was 1.56 cd/A. Further, the emission spectrum has a peak at 652 nm. FIG. 40 shows the emission spectrum. In addition, the element exhibits CIE chromaticity coordinates of (x, y)=(0.65, 0.33).

As described above, a light-emitting element that is capable of providing favorable red or reddish luminescence with favorable chromaticity can be obtained by using an organometallic complex according to the present invention. In addition, when a light-emitting layer is formed by combining an organometallic complex according to the present invention with a quinoxaline derivative as the light-emitting element in the present embodiment, the organometallic complex can be made to produce luminescence more efficiently.

It is to be noted that materials to be used for manufacturing a light-emitting element according to the present invention with the use of an organometallic complex according to the present invention are not to be considered limited to the materials mentioned above, and the materials mentioned in Embodiment mode and another known materials may be used in addition to the materials mentioned in the present embodiment. In addition, the layered structure of the light-emitting element is not limited to the structure described in the present embodiment, either, and may be changed appropriately. Further, a method for manufacturing the light-emitting element is not particularly limited, either. An electrode to serve as an anode may be manufactured first as in the present embodiment, or an electrode to serve as a cathode may be manufactured first.

Synthesis Example of TPAQn

TPAQn used in Embodiment 13 is a novel material represented by the following structure formula (74). A synthesis method of a quinoxaline derivative represented by the following formula (74) will be described here.

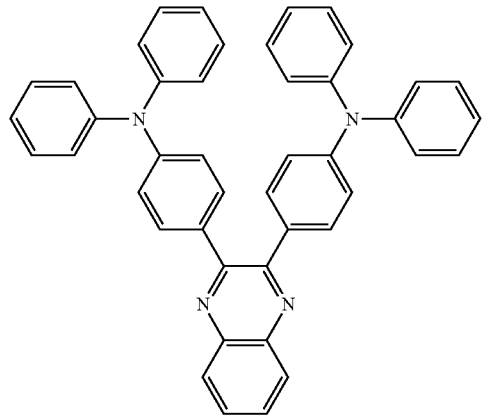

(74)

Synthesis of 2,3-bis(4-bromophenyl)quinoxaline

First, 10 g (27.4 mmol) of 4-bromobenzil and 3.5 g (33.5 mmol) o-phenylenediamine were put in a 500 mL recovery flask, and held at reflux for 8 hours in chloroform. Then, after cooling to room temperature, remaining o-phenylenediamine was removed by column chromatography to obtain 2,3-bis(4-bromophenyl) quinoxaline.

Synthesis of TPAQn

Further, 4.40 g (10.0 mmol) of the obtained 2,3-bis(4-bromophenyl) quinoxaline was put in a three neck flask, and dissolved in 75 mL of toluene in a nitrogen gas stream. Then, 0.22 g (0.2 mmol) of Pd(dba)$_2$, 2.88 g (30 mmol) of NaO-t-Bu, and 3.46 g (20.4 mmol) of diphenylamine were added, 1.8 mL of a 10 wt % hexane solution of tri(t-butylphosphine) was further added, and stirring on heating was performed at 80° C. for 8 hours.

Then, after cooling to room temperature, water was added to complete the reaction, and extraction with chloroform was performed. Further, after washing with a saturated aqueous solution of sodium chloride, drying with MgSO$_4$ was performed. After that, recrystallization from the chloroform was performed to obtain 2,3-bis(4-diphenylaminophenyl) quinoxaline (abbreviation: TPAQn) (yellow-green crystal, yield: 2.7 g (44%)).

The synthesis scheme (75) of the synthesis described above is as follows.

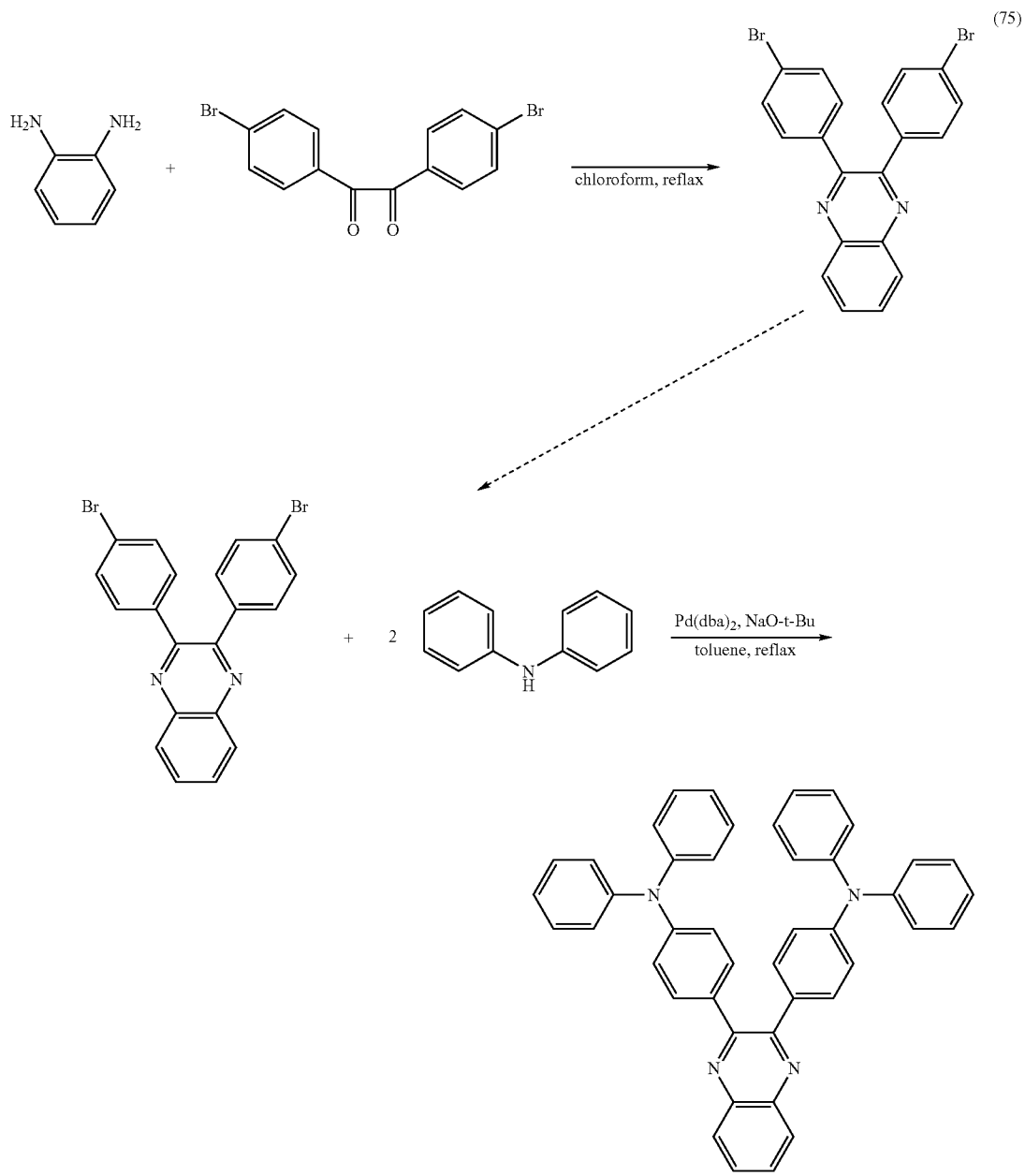

Figure 41:
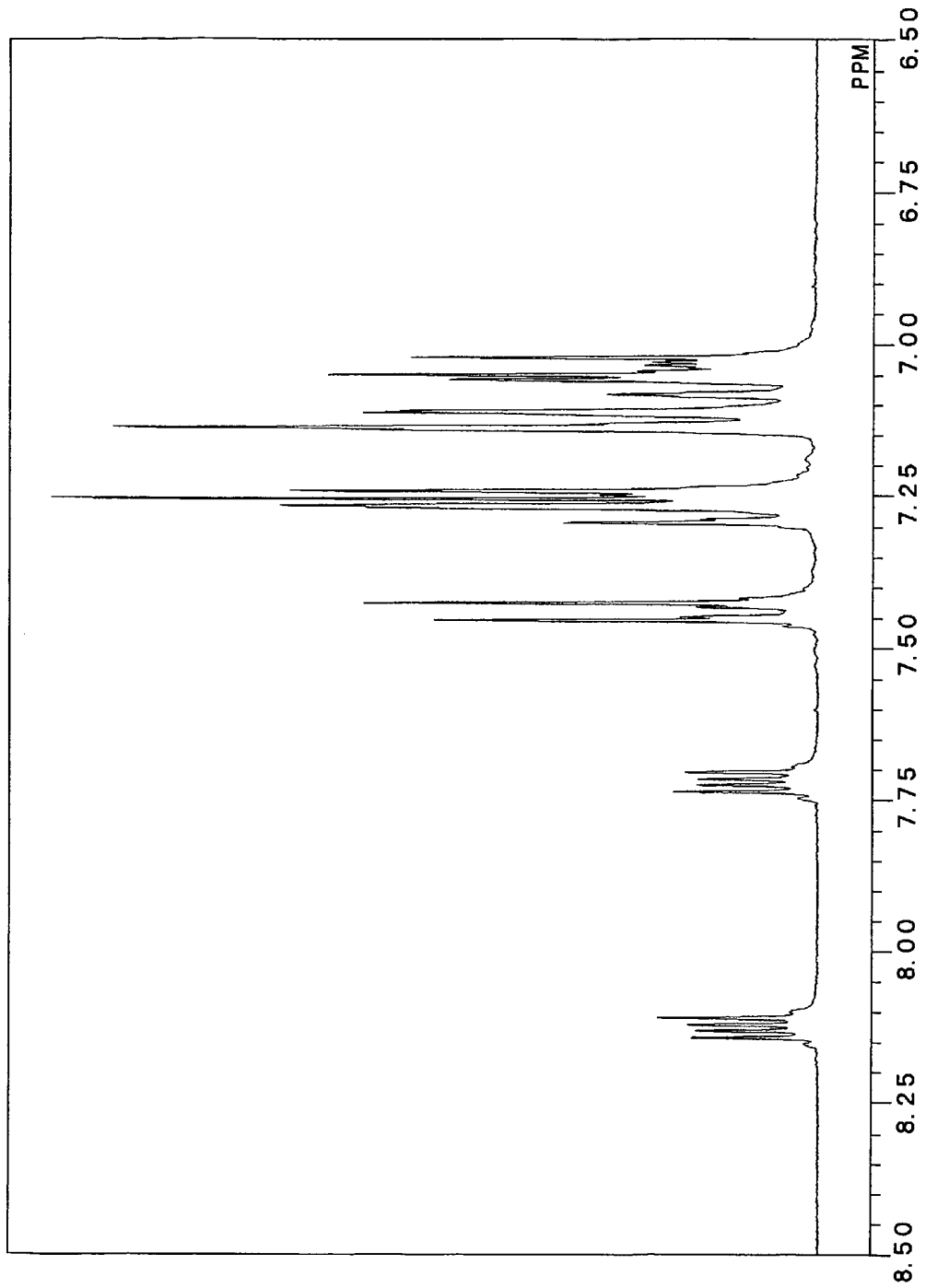
FIG. 41 is a diagram showing a $^1$H-NMR chart of TPAQn used in Embodiment 13.

FIG. 41 shows a $^1$H-NMR chart of TPAQn obtained by the synthesis described above.

Further, the thermal decomposition temperature of the obtained TPAQn was 411° C. The measurement was performed by Thermogravimetry/Differential Thermal Analysis simultaneous measurement system (from Seiko Instruments Inc., TG/DTA-320).

Embodiment 14

Figure 42:
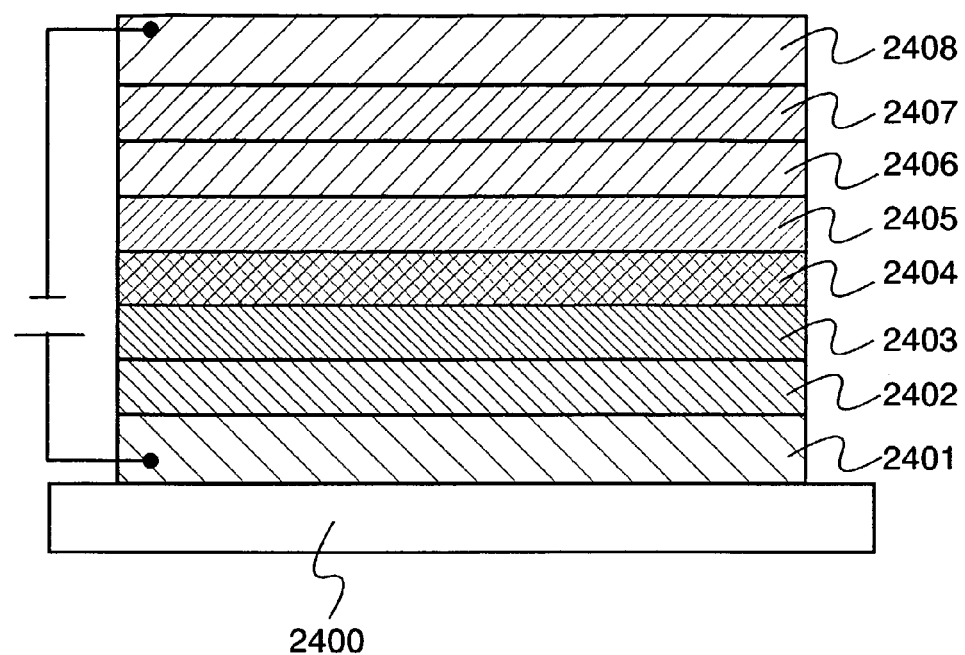
FIG. 42 is a diagram illustrating a light-emitting element using the organometallic complex synthesized in Synthesis Example 3 as a luminescent material and a manufacturing method thereof (Embodiment 14)

In the present embodiment, the structure of a light-emitting element using the organometallic complex synthesized in Synthesis Embodiment 3 as a luminescent material and a manufacturing method thereof will be described with reference to FIG. 42.

First, on a substrate 2400, indium tin oxide including silicon oxide was deposited by sputtering to form a first electrode 2401. The film thickness was made to be 110 nm.

Next, the substrate 2400 on which the first electrode 2401 was formed was fixed in a substrate holder provided in a vacuum deposition system so that the surface at which the first electrode 2401 was formed was made down.

Then, on the first electrode 2401, 4,4'-bis[N-{4-(N,N-di-m-tolylamino) phenyl}-N-phenylamino]biphenyl (abbreviation: DNTPD) was deposited by evaporation using resistance heating so as to be 50 nm in film thickness to form a hole injecting layer 2402.

Next, on the hole injecting layer 2402, α-NPD was deposited by evaporation using resistance heating so as to be 10 nm in film thickness to form a hole transporting layer 2403.

Further, on the hole transporting layer 2403, Ir(Fdpq)$_2$(Pic) and TPAQn were deposited by co-evaporation so as to be 30 nm in film thickness to form a light-emitting layer 2404. Here, the mass ratio of Ir(Fdpq)$_2$(Pic) to TPAQn was made to be 1:0.05 (=TPAQn:Ir(Fdpq)$_2$(pic)). This ratio makes Ir(Fdpq)$_2$(Pic) dispersed in a layer composed of TPAQn. It is to be noted that co-evaporation is an evaporation method in which evaporation is performed simultaneously from a plurality of evaporation sources in one processing room.

Next, on the light-emitting layer 2404, BAlq was deposited by evaporation using resistance heating so as to be 10 nm in film thickness to form a hole blocking layer 2405.

Next, on the hole blocking layer 2405, Alq$_3$ was deposited by evaporation using resistance heating so as to be 50 nm in film thickness to form an electron transporting layer 2406.

Next, on the electron transporting layer 2406, calcium fluoride was deposited by evaporation using resistance heating so as to be 1 nm in film thickness to form an electron injecting layer 2407.

Next, on the electron injecting layer 2407, aluminum was deposited by evaporation using resistance heating so as to be 200 nm in film thickness to form a second electrode 2408.

Figure 43:
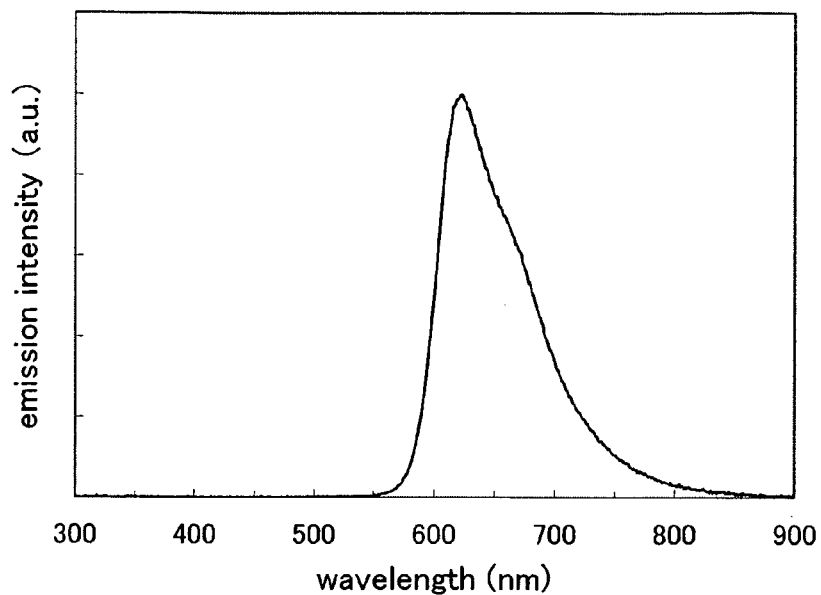
FIG. 43 is a diagram showing an emission spectrum of the light-emitting element manufactured in Embodiment 14.

When a voltage was applied to the thus manufactured light-emitting element so that the potential of the first electrode 2401 was higher than the potential of the second electrode 2408, it was determined that light was emitted with a luminance of 460 cd/m$^2$ when a voltage of 11.0 V was applied. The current efficiency in this case was 3.2 cd/A. Further, the emission spectrum has a peak at 622 nm. FIG. 43 shows the emission spectrum. In addition, the element exhibits CIE chromaticity coordinates of (x, y)=(0.68, 0.32).

As described above, a light-emitting element that is capable of providing favorable red or reddish luminescence with favorable chromaticity can be obtained by using an organometallic complex according to the present invention.

It is to be noted that the light-emitting element in the present embodiment has the hole blocking layer 2405 provided between the light-emitting layer 2404 and the electron transporting layer 2406. The hole blocking layer 2405 has a favorable electron transporting property, can prevent the excitation energy of Ir(Fdpq)$_2$(pic) excited in the light-emitting layer 2404 from transferring into the electron transporting layer 2406, and has a function of blocking transfer of holes from the light-emitting layer 2404 to the electron transporting layer 2406. Therefore, the luminous efficiency is improved by providing the hole blocking layer. The hole blocking layer can be formed by using a material that has a larger energy gap and a larger ionization potential among materials that can be used for forming an electron transporting layer, such as BAlq. As described above, in addition to an electron transporting layer or a hole transporting layer, various functional layers may be provided between a light-emitting layer and an electrode.

Embodiment 15

The present embodiment is an example of manufacturing a light-emitting element in the same way as in Embodiment 14 except changing TPAQn in the light-emitting layer 2404 in Embodiment 14 to CBP.

Figure 44:
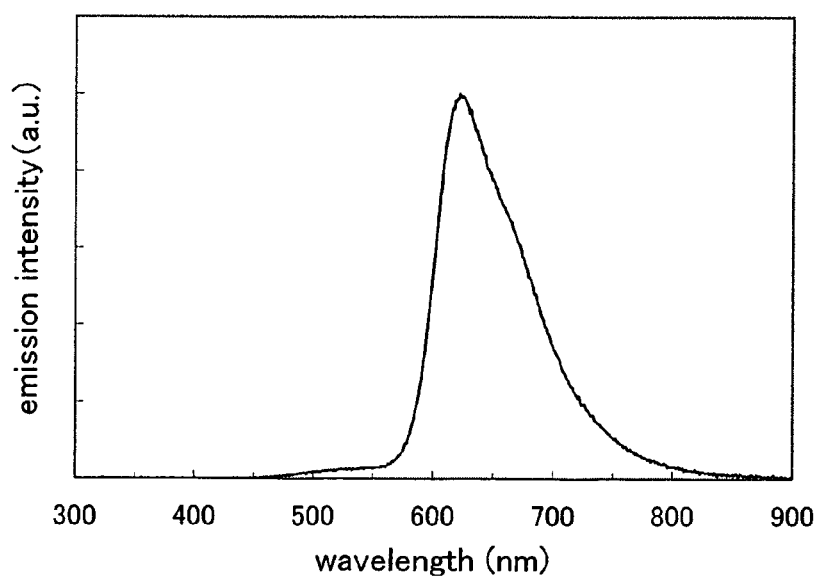
FIG. 44 is a diagram showing an emission spectrum of the light-emitting element manufactured in Embodiment 15.

When a voltage was applied to this light-emitting element so that the potential of the first electrode 2401 was higher than the potential of the second electrode 2408, it was determined that light was emitted with a luminance of 480 cd/m$^2$ when a voltage of 12.4 V was applied. The current efficiency in this case was 3.0 cd/A. Further, the emission spectrum has a peak at 622 nm. FIG. 44 shows the emission spectrum. It is to be noted that the horizontal axis and the vertical axis respectively show a wavelength (nm) and emission intensity (a. u.) in FIG. 44. In addition, the elements exhibits CIE chromaticity coordinates of (x, y)=(0.66, 0.33).

As described above, a light-emitting element that is capable of providing favorable red or reddish luminescence with favorable chromaticity can be obtained by using an organometallic complex according to the present invention.

Embodiment 16

In the present embodiment, the structure of a light-emitting element using the organometallic complex synthesized in Synthesis Embodiment 4 as a luminescent material and a manufacturing method thereof will be described with reference to FIG. 42.

First, on a substrate 2400, indium tin oxide including silicon oxide was deposited by sputtering to form a first electrode 2401. The film thickness was made to be 110 nm.

Next, the substrate 2400 on which the first electrode 2401 was formed was fixed in a substrate holder provided in a vacuum deposition system so that the surface at which the first electrode 2401 was formed was made down.

Then, on the first electrode 2401, 4,4'-bis[N-{4-(N,N-di-m-tolylamino) phenyl}-N-phenylamino]biphenyl (abbreviation: DNTPD) was deposited by evaporation using resistance heating so as to be 50 nm in film thickness to form a hole injecting layer 2402.

Next, on the hole injecting layer 2402, α-NPD was deposited by evaporation using resistance heating so as to be 10 nm in film thickness to form a hole transporting layer 2403.

Further, on the hole transporting layer 2403, Ir(3,5-Fdpq)$_2$(acac) and CBP were deposited by co-evaporation so as to be 30 nm in film thickness to form a light-emitting layer 2404. Here, the mass ratio of Ir(3,5-Fdpq)$_2$(acac) to CBP was made to be 1:0.025 (=CBP:Ir(3,5-Fdpq)$_2$(acac)). This ratio makes Ir(3,5-Fdpq)$_2$(acac) dispersed in a layer composed of CBP. It is to be noted that co-evaporation is an evaporation method in which evaporation is performed simultaneously from a plurality of evaporation sources in one processing room.

Next, on the light-emitting layer 2404, BCP was deposited by evaporation using resistance heating so as to be 10 nm in film thickness to form a hole blocking layer 2405.

Next, on the hole blocking layer 2405, Alq$_3$ was deposited by evaporation using resistance heating so as to be 20 nm in film thickness to form an electron transporting layer 2406.

Next, on the electron transporting layer 2406, calcium fluoride was deposited by evaporation using resistance heating so as to be 1 nm in film thickness to form an electron injecting layer 2407.

Next, on the electron injecting layer 2407, aluminum was deposited by evaporation using resistance heating so as to be 200 nm in film thickness to form a second electrode 2408.

Figure 45:
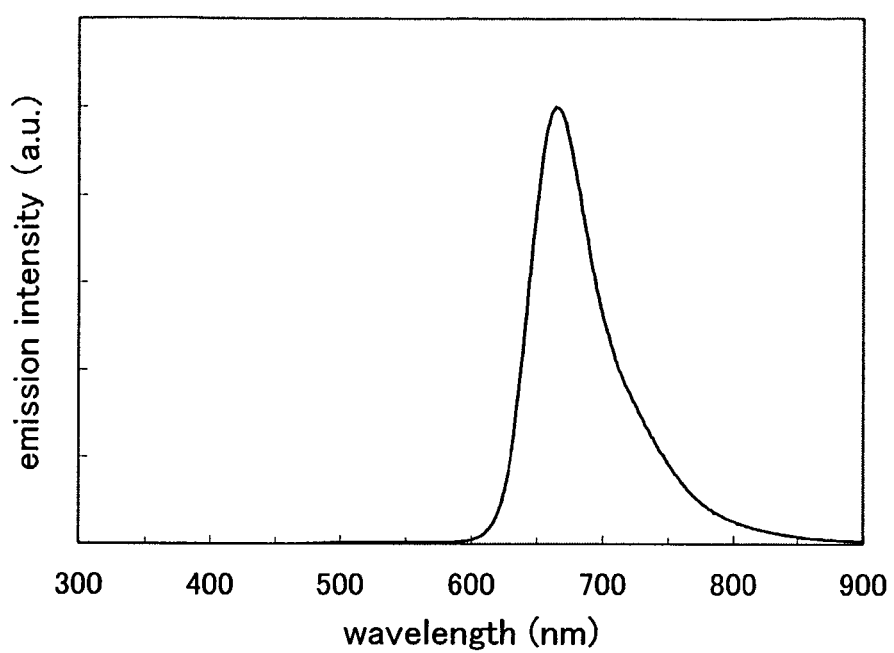
FIG. 45 is a diagram showing an emission spectrum of the light-emitting element manufactured in Embodiment 16.

When a voltage was applied to the thus manufactured light-emitting element so that the potential of the first electrode 2401 was higher than the potential of the second electrode 2408, it was determined that light was emitted with a luminance of 520 cd/m$^2$ when a voltage of 10.2 V was applied. The current efficiency in this case was 0.98 cd/A. Further, the emission spectrum has a peak at 664 nm. FIG. 45 shows the emission spectrum. In addition, the element exhibits CIE chromaticity coordinates of (x, y)=(0.71, 0.28).

As described above, a light-emitting element that is capable of providing favorable red or reddish luminescence with favorable chromaticity can be obtained by using an organometallic complex according to the present invention.

Embodiment 17

In the present embodiment, a light-emitting element was manufactured in the same way as in Embodiment 16 except changing CBP in the light-emitting layer 2404 and BCP in the hole blocking layer 2405 in Embodiment 16 respectively to Alq$_3$ and BAlq.

Figure 46:
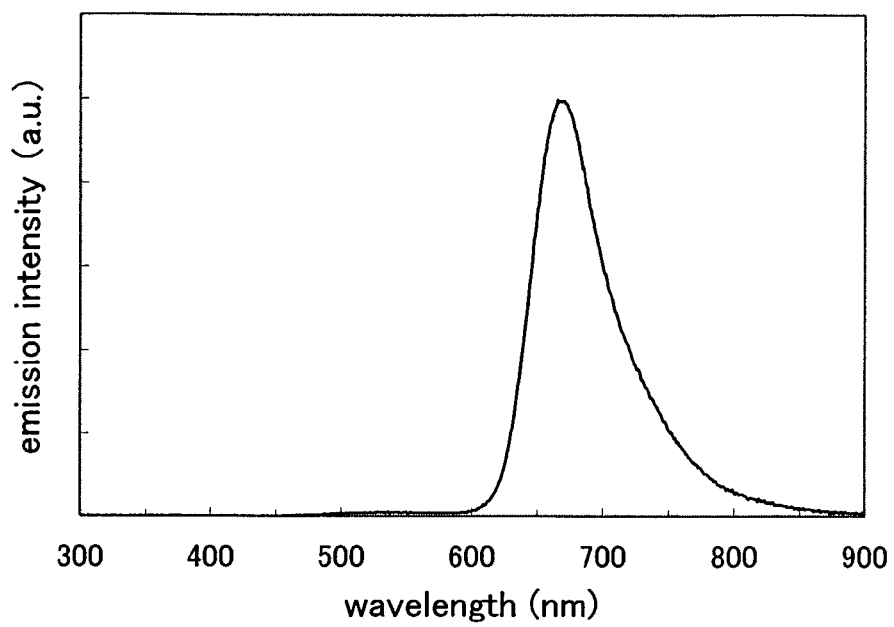
FIG. 46 is a diagram showing an emission spectrum of the light-emitting element manufactured in Embodiment 17.

When a voltage was applied to this light-emitting element so that the potential of the first electrode 2401 was higher than the potential of the second electrode 2408, it was determined that light was emitted with a luminance of 460 cd/m$^2$ when a voltage of 10.0 V was applied. The current efficiency in this case was 1.2 cd/A. Further, the emission spectrum has a peak at 665 nm. FIG. 46 shows the emission spectrum. It is to be noted that the horizontal axis and the vertical axis respectively show a wavelength (nm) and emission intensity (a. u.) in FIG. 46. In addition, the element exhibits CIE chromaticity coordinates of (x, y)=(0.69, 0.30).

As described above, a light-emitting element that is capable of providing favorable red or reddish luminescence with favorable chromaticity can be obtained by using an organometallic complex according to the present invention.

Although the present invention has been fully described by way of example with reference to the accompanying drawings, it is to be understood that various changes and modifications will be apparent to those skilled in the art. Therefore, unless such changes and modifications depart from the scope of the present invention hereinafter defined, they should be construed as being included therein.

This application is based on Japanese Patent Application serial no. 2004-151035 filed in Japan Patent Office on May 20, 2004, Japanese Patent Application serial no. 2004-226382 filed in Japan Patent Office on Aug. 3, 2004 and Japanese Patent Application serial no. 2004-231742 filed in Japan Patent Office on Aug. 6, 2004, the entire contents of which are hereby incorporated by reference.

EXPLANATION OF REFERENCE NUMBERS IN THE DRAWINGS

100: substrate, 101: first electrode, 102: layer including luminescent material, 103: second electrode, 111: hole injecting layer, 112: hole transporting layer, 113: light-emitting layer, 114: hole blocking layer, 115: electron transporting layer, 200: substrate, 201: first electrode, 202: layer including luminescent material, 203: second electrode, 211: electron transporting layer, 212: hole blocking layer, 213: light-emitting layer, 214: hole transporting layer, 215: hole injecting layer, 300: substrate, 311: TFT, 312: TFT, 313: light-emitting element, 314: first electrode, 315: layer including luminescent material, 316: second electrode, 317: wiring, 401: first electrode, 402: second electrode, 411: hole injecting layer, 412: hole transporting layer, 413: light-emitting layer, 414: electron transporting layer, 415: electron injecting layer, 501: first electrode, 502: second electrode, 511: electron injecting layer, 512: electron transporting layer, 513: first light-emitting layer, 514: partition layer, 515: second light-emitting layer, 516: hole transporting layer, 517: hole injecting layer, 601: first electrode, 602: second electrode, 611: electron injecting layer, 612: electron transporting layer, 613: first light-emitting layer, 614: hole transporting layer, 615: first layer (hole generation layer), 616: second layer (electron generation layer), 617: electron transporting layer, 618: second light-emitting layer, 619: hole transporting layer, 620: hole injecting layer, 701: first electrode, 702: second electrode, 711: hole injecting layer, 712: hole transporting layer, 713: light-emitting layer, 714: electron transporting layer, 715: electron injecting layer, 800: substrate, 801: FPC (flexible printed circuit), 802: PWB (printed wiring board), 811: pixel portion, 812: source signal line driver circuit, 813: writing gate signal line driver circuit, 814: erasing gate signal line driver circuit, 901: first transistor, 902: second transistor, 903: light-emitting element, 911: gate signal line, 912: source signal line, 913: writing gate signal line driver circuit, 914: erasing gate signal line driver circuit, 915: source signal line driver circuit, 916: power source, 917: current supply line, 918: switch, 919: switch, 920: switch, 1001: first transistor, 1002: second transistor, 1003: gate signal line, 1004: source signal line, 1005: current supply line, 1006: power source, 1101a: writing period, 1102a: writing period, 1103a: writing period, 1104a: writing period, 1101b: retention period, 1102b: retention period, 1103b: retention period, 1104b: retention period, 1101: first sub-frame, 1102: second sub-frame, 1103: third sub-frame, 1104: fourth sub-frame, 1210: substrate, 1211: transistor, 1212: light-emitting element, 1213: first electrode, 1214: second electrode, 1215: layer in which hole generation layer, electron generation layer, and layer including luminescent material are stacked, 1216 (1216a and 1216b): first interlayer insulating film, 1216c: silicon nitride film including argon (Ar), 1217: wiring, 1218: partition layer, 1219 (1219a and 1219b): second interlayer insulating film, 1300: substrate, 1301: first electrode (anode), 1302: layer including luminescent material, 1303: second electrode (cathode), 1311: hole injecting layer, 1312 hole transporting layer, 1313: light-emitting layer, 1314: electron transporting layer, 1315: electron injecting layer, 1400: substrate, 1401: first electrode (anode), 1402: layer including luminescent material, 1403: second electrode (cathode), 1411: hole injecting layer, 1412 hole transporting layer, 1413: light-emitting layer, 1414: electron transporting layer, 1415: electron injecting layer, 1501: driver circuit portion (source side driver circuit), 1502: pixel portion, 1503: driver circuit portion (gate side driver circuit), 1504: sealing substrate, 1505: sealing material, 1506: inside surrounded by sealing material 1505, 1507: wiring, 1508: FPC to serve as external input terminal, 1509: substrate, 1510: switching TFT, 1511: current controlling TFT, 1512: first electrode, 1513: insulator, 1514: layer including luminescent material, 1515: second electrode, 1516: light-emitting element, 1517: n-channel TFT, 1518: p-channel TFT, 1600: frame body, 1601: support, 1602: display portion, 1603: speaker portion, 1604: video input terminal, 1700: main body, 1701: frame body, 1702: display portion, 1703: keyboard, 1704: external connection port, 1705: pointing mouse, 1800: main body, 1801: display portion, 1802: frame body, 1803: external connection port, 1804: remote-control receiving portion, 1805: image receiving portion, 1806: buttery, 1807: sound input portion, 1808: operation key, 1809: eye piece, 1900: lighting portion, 1901: shade, 1902: variable arm, 1903: support, 1904: pedestal, 1905: power source, 2000: main body, 2001: frame body, 2002: display portion, 2003: sound input portion, 2004: sound output portion, 2005: operation key, 2006: external connection port, 2007: antenna, 2100: substrate, 2101: first electrode, 2102: first light-emitting region, 2103: separation layer, 2104: second light-emitting region, 2105: second electrode, 2200: substrate, 2201: first electrode, 2202: first light-emitting region, 2203: carrier generation layer, 2204: second light-emitting region, 2205: carrier generation layer, 2206: third light-emitting region, 2207: second electrode, 2300: substrate, 2301: first electrode, 2302: hole injecting layer, 2303: hole transporting layer, 2304: light-emitting layer, 2305: electron transporting layer, 2306: electron injecting layer, 2307: second electrode, 2400: substrate, 2401: first electrode, 2402: hole injecting layer, 2403: hole transporting layer, 2404: light-emitting layer, 2405: hole blocking layer, 2406: electron transporting layer, 2407: electron injecting layer, 2408: second electrode

The invention claimed is:

1. An organometallic complex represented by the following formula,

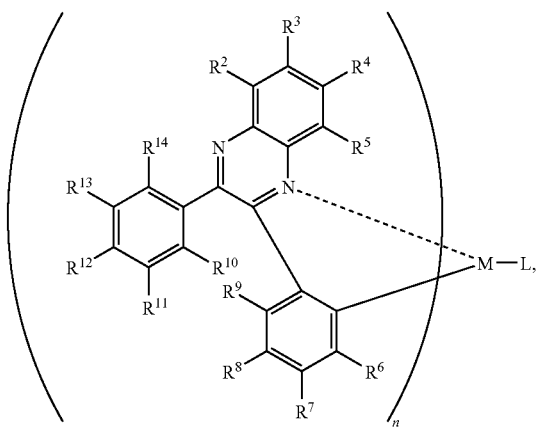

wherein each of $R^2$ to $R^5$, $R^7$, $R^9$, $R^{10}$, $R^{12}$, and $R^{14}$ is hydrogen, wherein each of $R^6$, $R^8$, $R^{11}$, and $R^{13}$ is any one selected from the group consisting of a hydrogen, a halogen element, an acyl group, an alkyl group, an alkoxyl group, an aryl group, a cyano group, a heterocyclic group, and an electron-withdrawing group, wherein at least one of $R^6$ and $R^8$ is an electron-withdrawing group, wherein M is an element of Group 9, wherein n=2, and wherein L is a monoanionic ligand.

2. The organometallic complex according to claim 1, wherein the acyl group is any one selected from the group consisting of an acetyl group, a propionyl group, an isobutyryl group, and a methacryloyl group.

3. The organometallic complex according to claim 1, wherein the alkyl group is any one selected from the group consisting of a methyl group, an ethyl group, an n-propyl group, an iso-propyl group, a tert-butyl group, and an octyl group.

4. The organometallic complex according to claim 1, wherein the alkoxyl group is any one selected from the group consisting of a methoxy group, an ethoxy group, and a propoxy group.

5. The organometallic complex according to claim 1, wherein the aryl group is any one selected from the group consisting of a phenyl group, a 4-methylphenyl group and a 4-ethylphenyl group.

6. The organometallic complex according to claim 1, wherein the heterocyclic group is any one selected from the group consisting of a pyridyl group, bipyridyl group, and a methylpyridyl group.

7. The organometallic complex according to claim 1, wherein the electron-withdrawing group is any one selected from the group consisting of a fluoro group, a trifluoro trifluoromethyl group, and a cyano group.

8. The organometallic complex according to claim 1, wherein the monoanionic ligand is any one selected from the following formulas (a) to (g),

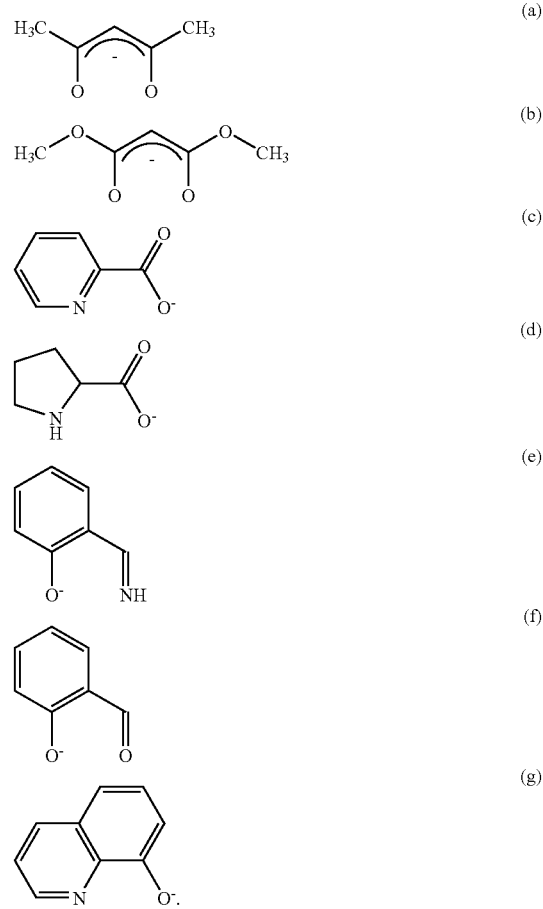

9. A light emitting device comprising:

a light emitting element including a first electrode, a second electrode, and a light emitting layer formed therebetween, wherein the light emitting layer comprises the organometallic complex according to claim 1.

10. An organometallic complex represented by the following formula,

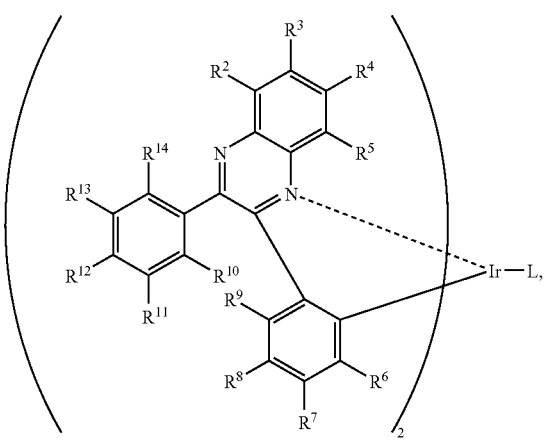

wherein each of $R^2$ to $R^5$, $R^7$, $R^9$, $R^{10}$, $R^{12}$, and $R^{14}$ is hydrogen, wherein each of $R^6$, $R^8$, $R^{11}$, and $R^{13}$ is any one selected from the group consisting of a hydrogen, a halogen element, an acyl group, an alkyl group, an alkoxyl group, an aryl group, a cyano group, a heterocyclic group, and an electron-withdrawing group, wherein at least one of $R^6$ and $R^8$ is an electron-withdrawing group, and wherein L is a monoanionic ligand.

11. The organometallic complex according to claim 10, wherein the acyl group is any one selected from the group consisting of an acetyl group, a propionyl group, an isobutyryl group, and a methacryloyl group.

12. The organometallic complex according to claim 10, wherein the alkyl group is any one selected from the group consisting of a methyl group, an ethyl group, an n-propyl group, an iso-propyl group, a tert-butyl group, and an octyl group.

13. The organometallic complex according to claim 10, wherein the alkoxyl group is any one selected from the group consisting of a methoxy group, an ethoxy group, and a propoxy group.

14. The organometallic complex according to claim 10, wherein the aryl group is any one selected from the group consisting of a phenyl group, a 4-methylphenyl group and a 4-ethylphenyl group.

15. The organometallic complex according to claim 10, wherein the heterocyclic group is any one selected from the group consisting of a pyridyl group, bipyridyl group, and a methylpyridyl group.

16. The organometallic complex according to claim 10, wherein the electron-withdrawing group is any one selected from the group consisting of a fluoro group, a trifluoromethyl group, and a cyano group.

17. The organometallic complex according to claim 10, wherein the monoanionic ligand is any one selected from the following formulas (a) to (g),

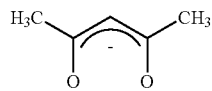
(a)

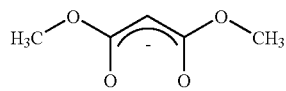
(b)

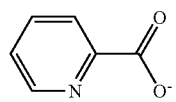
(c)

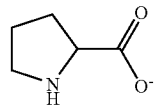
(d)

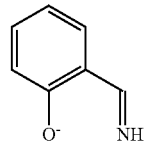
(e)

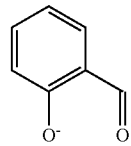
(f)

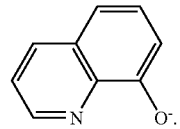
(g)

18. A light emitting device comprising:
a light emitting element including a first electrode, a second electrode, and a light emitting layer formed therebetween,
wherein the light emitting layer comprises the organometallic complex according to claim 10.

19. An organometallic complex represented by the following formula,

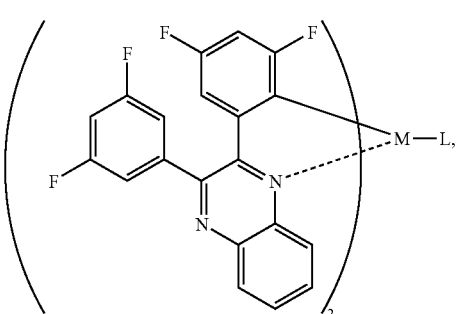

wherein M is an element of Group 9, and
wherein L is a monoanionic ligand.

20. The organometallic complex according to claim 19, wherein the monoanionic ligand is any one selected from the following formulas (a) to (g),

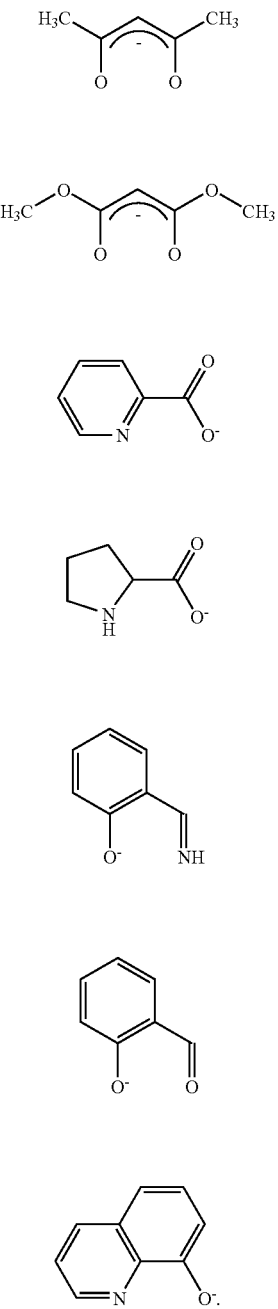

21. A light emitting device comprising:
a light emitting element including a first electrode, a second electrode, and a light emitting layer formed therebetween,
wherein the light emitting layer comprises the organometallic complex according to claim 19.

22. An organometallic complex represented by the following formula,

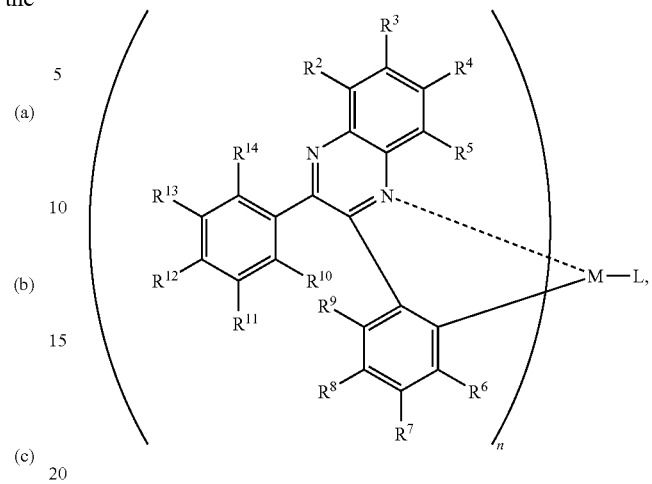

wherein each of $R^2$ to $R^5$, $R^7$, $R^9$, $R^{10}$, $R^{12}$, and $R^{14}$ is hydrogen,
wherein each of $R^6$, $R^8$, $R^{11}$, and $R^{13}$ is any one selected from the group consisting of a hydrogen, a halogen element, an acyl group, an alkyl group, an alkoxyl group, an aryl group, a cyano group, a heterocyclic group, and an electron-withdrawing group,
wherein at least one of $R^6$, $R^8$, $R^{11}$, and $R^{13}$ is a halogen element,
wherein M is an element of Group 9,
wherein n=2, and
wherein L is a monoanionic ligand.

23. An organometallic complex represented by the following formula,

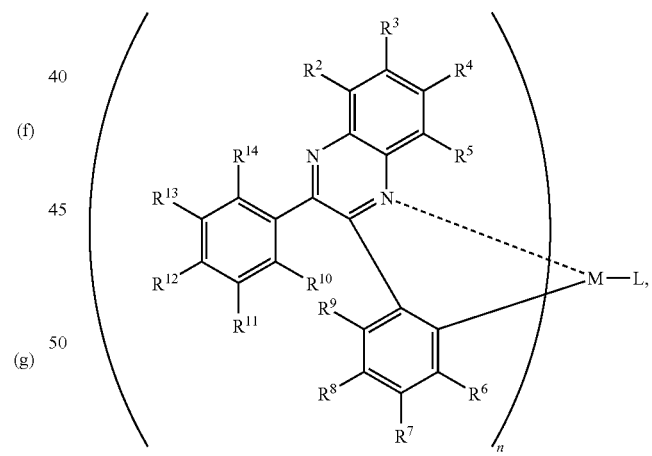

wherein each of $R^2$ to $R^5$, $R^7$, $R^9$, $R^{10}$, $R^{12}$, and $R^{14}$ is hydrogen,
wherein each of $R^6$, $R^8$, $R^{11}$, and $R^{13}$ is any one selected from the group consisting of a hydrogen, a halogen element, an acyl group, an alkyl group, an alkoxyl group, an aryl group, a cyano group, a heterocyclic group, and an electron-withdrawing group,
wherein at least one of $R^6$, $R^8$, $R^{11}$, and $R^{13}$ is a fluorine,
wherein M is an element of Group 9,
wherein n=2, and
wherein L is a monoanionic ligand.

24. An organometallic complex represented by the following formula,

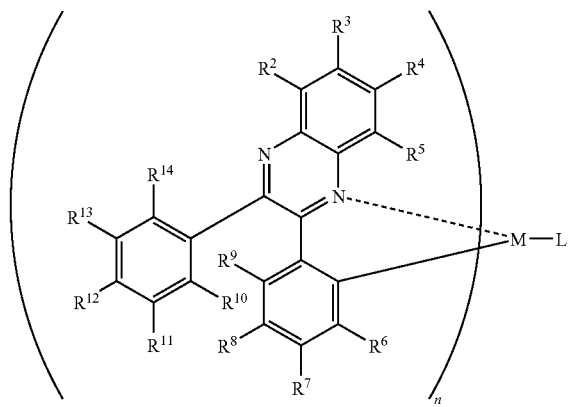

wherein each of $R^2$ to $R^5$, $R^7$, $R^9$, $R^{10}$, $R^{12}$, and $R^{14}$ is hydrogen,
wherein each of $R^6$, $R^8$, $R^{11}$, and $R^{13}$ is an electron-withdrawing group,
wherein M is an element of Group 9,
wherein n=2, and
wherein L is a monoanionic ligand.

25. An organometallic complex represented by the following formula,

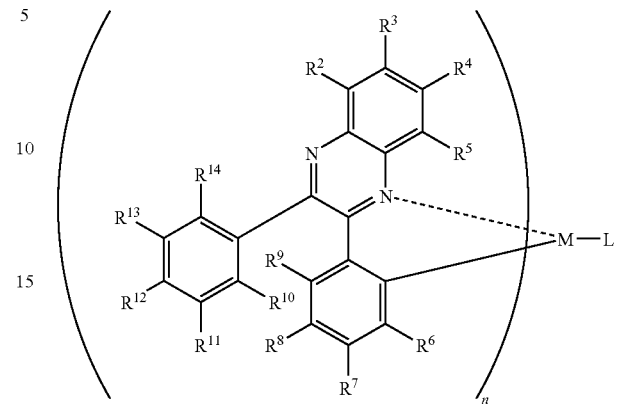

wherein each of $R^2$ to $R^5$, $R^7$, $R^9$, $R^{10}$, $R^{12}$, and $R^{14}$ is hydrogen,
wherein each of $R^6$, $R^8$, $R^{11}$, and $R^{13}$ is a halogen,
wherein M is an element of Group 9,
wherein n=2, and
wherein L is a monoanionic ligand.

* * * * *